(12) United States Patent
Yamazaki et al.

(10) Patent No.: US 10,189,048 B2
(45) Date of Patent: Jan. 29, 2019

(54) PEELING METHOD AND PEELING APPARATUS

(71) Applicant: Semiconductor Energy Laboratory Co., Ltd., Atsugi-shi, Kanagawa-ken (JP)

(72) Inventors: Shunpei Yamazaki, Setagaya (JP); Kunihiko Suzuki, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 726 days.

(21) Appl. No.: 14/560,296

(22) Filed: Dec. 4, 2014

(65) Prior Publication Data

US 2015/0165477 A1    Jun. 18, 2015

(30) Foreign Application Priority Data

Dec. 12, 2013  (JP) ................... 2013-257521

(51) Int. Cl.
| | | |
|---|---|---|
| *H01L 51/00* | (2006.01) | |
| *B05D 3/12* | (2006.01) | |
| *B05D 1/36* | (2006.01) | |
| *B05D 1/38* | (2006.01) | |
| *B05D 3/00* | (2006.01) | |
| *B05D 3/06* | (2006.01) | |

(Continued)

(52) U.S. Cl.
CPC ................. *B05D 3/12* (2013.01); *B05D 1/36* (2013.01); *B05D 1/38* (2013.01); *B05D 3/007* (2013.01); *B05D 3/068* (2013.01); *B05D 3/107* (2013.01); *H01L 51/003* (2013.01); *H01L 51/56* (2013.01);

(58) Field of Classification Search
CPC .................................................. H01L 51/003
See application file for complete search history.

(56) References Cited

U.S. PATENT DOCUMENTS

| 4,722,765 A | 2/1988 | Ambros et al. |
| 4,883,561 A | 11/1989 | Gmitter et al. |
| 5,107,175 A | 4/1992 | Hirano et al. |

(Continued)

FOREIGN PATENT DOCUMENTS

| CN | 001397984 A | 2/2003 |
| CN | 101154561 A | 4/2008 |

(Continued)

OTHER PUBLICATIONS

International Search Report (Application No. PCT/IB2014/066464) dated Apr. 7, 2015.

(Continued)

*Primary Examiner* — Cachet I Sellman
(74) *Attorney, Agent, or Firm* — Robinson Intellectual Property Law Office; Eric J. Robinson

(57) ABSTRACT

An object is to provide a novel peeling method and a novel peeling apparatus. A peeling method including a first step of forming a separation layer over a substrate, a second step of forming a layer to be separated over the separation layer, a third step of forming a peeling starting point by separating part of the layer to be separated from the separation layer, and a fourth step of peeling the layer to be separated from the substrate using the peeling starting point. In the fourth step, the substrate temperature is higher than or equal to 60 degrees Celsius and lower than or equal to 90 degrees Celsius.

12 Claims, 29 Drawing Sheets

(51) Int. Cl.
  *B05D 3/10* (2006.01)
  *H01L 51/56* (2006.01)

(56) References Cited

U.S. PATENT DOCUMENTS

| | | |
|---|---|---|
| 5,124,204 A | 6/1992 | Yamashita et al. |
| 5,156,720 A | 10/1992 | Rosenfeld et al. |
| 5,189,405 A | 2/1993 | Yamashita et al. |
| 5,206,749 A | 4/1993 | Zavracky et al. |
| 5,256,562 A | 10/1993 | Vu et al. |
| 5,258,320 A | 11/1993 | Zavracky et al. |
| 5,258,325 A | 11/1993 | Spitzer et al. |
| 5,273,475 A | 12/1993 | Oshikawa |
| 5,291,098 A | 3/1994 | Okita et al. |
| 5,300,788 A | 4/1994 | Fan et al. |
| 5,317,236 A | 5/1994 | Zavracky et al. |
| 5,317,436 A | 5/1994 | Spitzer et al. |
| 5,331,149 A | 7/1994 | Spitzer et al. |
| 5,341,015 A | 8/1994 | Kohno |
| 5,362,671 A | 11/1994 | Zavracky et al. |
| 5,376,561 A | 12/1994 | Vu et al. |
| 5,376,979 A | 12/1994 | Zavracky et al. |
| 5,377,031 A | 12/1994 | Vu et al. |
| 5,391,257 A | 2/1995 | Sullivan et al. |
| 5,396,304 A | 3/1995 | Salerno et al. |
| 5,397,713 A | 3/1995 | Hamamoto et al. |
| 5,420,055 A | 5/1995 | Vu et al. |
| 5,438,241 A | 8/1995 | Zavracky et al. |
| 5,444,557 A | 8/1995 | Spitzer et al. |
| 5,453,405 A | 9/1995 | Fan et al. |
| 5,459,335 A | 10/1995 | Matsushita et al. |
| 5,467,154 A | 11/1995 | Gale et al. |
| 5,475,514 A | 12/1995 | Salerno et al. |
| 5,499,124 A | 3/1996 | Vu et al. |
| 5,528,397 A | 6/1996 | Zavracky et al. |
| 5,539,550 A | 7/1996 | Spitzer et al. |
| 5,578,865 A | 11/1996 | Vu et al. |
| 5,581,385 A | 12/1996 | Spitzer et al. |
| 5,583,335 A | 12/1996 | Spitzer et al. |
| 5,589,406 A | 12/1996 | Kato et al. |
| 5,650,363 A | 7/1997 | Endroes et al. |
| 5,654,811 A | 8/1997 | Spitzer et al. |
| 5,661,371 A | 8/1997 | Salerno et al. |
| 5,666,175 A | 9/1997 | Spitzer et al. |
| 5,674,304 A | 10/1997 | Fukada et al. |
| 5,686,360 A | 11/1997 | Harvey et al. |
| 5,692,820 A | 12/1997 | Gale et al. |
| 5,693,956 A | 12/1997 | Shi et al. |
| 5,702,963 A | 12/1997 | Vu et al. |
| 5,705,424 A | 1/1998 | Zavracky et al. |
| 5,713,652 A | 2/1998 | Zavracky et al. |
| 5,736,768 A | 4/1998 | Zavracky et al. |
| 5,743,614 A | 4/1998 | Salerno et al. |
| 5,751,261 A | 5/1998 | Zavracky et al. |
| 5,757,126 A | 5/1998 | Harvey et al. |
| 5,757,445 A | 5/1998 | Vu et al. |
| 5,757,456 A | 5/1998 | Yamazaki et al. |
| 5,771,562 A | 6/1998 | Harvey et al. |
| 5,781,164 A | 7/1998 | Jacobsen et al. |
| 5,789,763 A | 8/1998 | Kato et al. |
| 5,807,440 A | 9/1998 | Kubota et al. |
| 5,811,177 A | 9/1998 | Shi et al. |
| 5,815,223 A | 9/1998 | Watanabe et al. |
| 5,817,548 A | 10/1998 | Noguchi et al. |
| 5,821,138 A | 10/1998 | Yamazaki et al. |
| 5,834,327 A | 11/1998 | Yamazaki et al. |
| 5,849,147 A | 12/1998 | Yasunaga et al. |
| 5,851,862 A | 12/1998 | Ohtani et al. |
| 5,861,929 A | 1/1999 | Spitzer |
| 5,879,741 A | 3/1999 | Itoh |
| 5,883,437 A | 3/1999 | Maruyama et al. |
| 5,888,712 A | 3/1999 | Lelental et al. |
| 5,895,228 A | 4/1999 | Biebuyck et al. |
| 5,929,961 A | 7/1999 | Nishi et al. |
| 5,943,593 A | 8/1999 | Noguchi et al. |
| 5,952,778 A | 9/1999 | Haskal et al. |
| 5,956,181 A | 9/1999 | Lin |
| 5,981,306 A | 11/1999 | Burrows et al. |
| 5,990,542 A | 11/1999 | Yamazaki |
| 6,013,346 A | 1/2000 | Lewis et al. |
| 6,013,982 A | 1/2000 | Thompson et al. |
| 6,020,271 A | 2/2000 | Yanagida |
| 6,027,958 A | 2/2000 | Vu et al. |
| 6,033,974 A | 3/2000 | Henley et al. |
| 6,043,800 A | 3/2000 | Spitzer et al. |
| 6,059,913 A | 5/2000 | Asmussen et al. |
| 6,072,445 A | 6/2000 | Spitzer et al. |
| 6,080,663 A | 6/2000 | Chen et al. |
| 6,096,581 A | 8/2000 | Zhang et al. |
| 6,100,166 A | 8/2000 | Sakaguchi et al. |
| 6,118,502 A | 9/2000 | Yamazaki et al. |
| 6,121,950 A | 9/2000 | Zavracky et al. |
| 6,127,199 A | 10/2000 | Inoue et al. |
| 6,133,071 A | 10/2000 | Nagai |
| 6,140,980 A | 10/2000 | Spitzer et al. |
| 6,143,582 A | 11/2000 | Vu et al. |
| 6,146,225 A | 11/2000 | Sheats et al. |
| 6,150,187 A | 11/2000 | Zyung et al. |
| 6,160,346 A | 12/2000 | Vleggaar et al. |
| 6,190,937 B1 | 2/2001 | Nakagawa et al. |
| 6,198,217 B1 | 3/2001 | Suzuki et al. |
| 6,198,220 B1 | 3/2001 | Jones et al. |
| 6,204,610 B1 | 3/2001 | Komiya |
| 6,221,738 B1 | 4/2001 | Sakaguchi et al. |
| 6,232,136 B1 | 5/2001 | Zavracky et al. |
| 6,239,470 B1 | 5/2001 | Yamazaki |
| 6,245,188 B1 * | 6/2001 | Toyoda ............... B08B 7/0028 156/247 |
| 6,245,393 B1 | 6/2001 | Thompson et al. |
| 6,246,169 B1 | 6/2001 | Pruvot |
| 6,258,666 B1 | 7/2001 | Mizutani et al. |
| 6,261,634 B1 | 7/2001 | Itoh |
| 6,268,695 B1 | 7/2001 | Affinito |
| 6,273,791 B1 * | 8/2001 | Kataoka ............... B24B 37/042 257/E21.237 |
| 6,300,612 B1 | 10/2001 | Yu |
| 6,310,362 B1 | 10/2001 | Takemura |
| 6,317,175 B1 | 11/2001 | Salerno et al. |
| 6,320,568 B1 | 11/2001 | Zavracky |
| 6,320,640 B2 | 11/2001 | Nishi et al. |
| 6,339,010 B2 | 1/2002 | Sameshima |
| 6,340,641 B1 | 1/2002 | Muraguchi et al. |
| 6,362,866 B1 | 3/2002 | Yamazaki et al. |
| 6,372,608 B1 | 4/2002 | Shimoda et al. |
| 6,376,333 B1 | 4/2002 | Yamazaki et al. |
| 6,391,220 B1 | 5/2002 | Zhang et al. |
| 6,403,985 B1 | 6/2002 | Fan et al. |
| 6,413,645 B1 | 7/2002 | Graff et al. |
| 6,414,783 B2 | 7/2002 | Zavracky et al. |
| 6,420,283 B1 | 7/2002 | Ogawa et al. |
| 6,423,614 B1 | 7/2002 | Doyle |
| 6,424,020 B1 | 7/2002 | Vu et al. |
| 6,429,095 B1 | 8/2002 | Sakaguchi et al. |
| 6,432,516 B1 | 8/2002 | Terasaki et al. |
| 6,441,468 B1 | 8/2002 | Yamazaki |
| 6,448,152 B1 | 9/2002 | Henley et al. |
| 6,455,397 B1 | 9/2002 | Belford |
| 6,486,041 B2 | 11/2002 | Henley et al. |
| 6,486,929 B1 | 11/2002 | Vu et al. |
| 6,492,026 B1 | 12/2002 | Graff et al. |
| 6,504,524 B1 | 1/2003 | Gates et al. |
| 6,506,664 B1 | 1/2003 | Beyne et al. |
| 6,511,187 B1 | 1/2003 | Salerno et al. |
| 6,512,624 B2 | 1/2003 | Tonar et al. |
| 6,515,417 B1 | 2/2003 | Duggala et al. |
| 6,521,511 B1 | 2/2003 | Inoue et al. |
| 6,521,940 B1 | 2/2003 | Vu et al. |
| 6,522,067 B1 | 2/2003 | Graff et al. |
| 6,531,997 B1 | 3/2003 | Gates et al. |
| 6,534,382 B1 | 3/2003 | Sakaguchi et al. |
| 6,544,430 B2 | 4/2003 | McCormack et al. |
| 6,558,008 B1 | 5/2003 | Salerno et al. |
| 6,566,808 B1 | 5/2003 | Duggal et al. |
| 6,572,780 B2 | 6/2003 | McCormack et al. |

(56) References Cited

U.S. PATENT DOCUMENTS

| | | |
|---|---|---|
| 6,582,996 B1 | 6/2003 | Hara et al. |
| 6,593,978 B2 | 7/2003 | Vu et al. |
| 6,608,654 B2 | 8/2003 | Zavracky et al. |
| 6,627,518 B1 | 9/2003 | Inoue et al. |
| 6,627,953 B1 | 9/2003 | Vu et al. |
| 6,632,708 B2 | 10/2003 | Sakama et al. |
| 6,636,185 B1 | 10/2003 | Spitzer et al. |
| 6,642,542 B1 | 11/2003 | Shimoda et al. |
| 6,645,830 B2 | 11/2003 | Shimoda et al. |
| 6,649,433 B2 | 11/2003 | Mikhael et al. |
| 6,661,029 B1 | 12/2003 | Duggal |
| 6,664,169 B1 | 12/2003 | Iwasaki et al. |
| 6,664,730 B2 | 12/2003 | Weaver |
| 6,680,577 B1 | 1/2004 | Inukai et al. |
| 6,682,963 B2 | 1/2004 | Ishikawa |
| 6,682,990 B1 | 1/2004 | Iwane et al. |
| 6,683,333 B2 | 1/2004 | Kazlas et al. |
| RE38,466 E | 3/2004 | Inoue et al. |
| 6,700,322 B1 | 3/2004 | Duggal et al. |
| 6,700,631 B1 | 3/2004 | Inoue et al. |
| 6,707,160 B2 | 3/2004 | Yamaji |
| 6,737,285 B2 | 5/2004 | Iketani et al. |
| 6,737,753 B2 | 5/2004 | Kumar et al. |
| 6,753,212 B2 | 6/2004 | Yamazaki et al. |
| 6,774,010 B2 | 8/2004 | Chu et al. |
| 6,777,871 B2 | 8/2004 | Duggal et al. |
| 6,781,152 B2 | 8/2004 | Yamazaki |
| 6,784,113 B2 | 8/2004 | Hembree |
| 6,790,747 B2 | 9/2004 | Henley et al. |
| 6,800,999 B1 | 10/2004 | Duggal et al. |
| 6,802,926 B2 | 10/2004 | Mizutani et al. |
| 6,814,832 B2 | 11/2004 | Utsunomiya |
| 6,815,240 B2 | 11/2004 | Hayashi |
| 6,818,530 B2 | 11/2004 | Shimoda et al. |
| 6,821,553 B2 | 11/2004 | Miyashita et al. |
| 6,830,494 B1 | 12/2004 | Yamazaki et al. |
| 6,833,156 B2 | 12/2004 | Miyashita et al. |
| 6,838,192 B2 | 1/2005 | Miyashita et al. |
| 6,841,949 B2 | 1/2005 | Duggal |
| 6,863,961 B2 | 3/2005 | Miyashita et al. |
| 6,867,539 B1 | 3/2005 | McCormick et al. |
| 6,875,671 B2 | 4/2005 | Faris |
| 6,878,607 B2 | 4/2005 | Inoue et al. |
| 6,882,102 B2 | 4/2005 | Yamazaki |
| 6,885,389 B2 | 4/2005 | Inoue et al. |
| 6,919,935 B2 | 7/2005 | Vu et al. |
| 6,940,223 B2 | 9/2005 | Yamazaki |
| 6,943,369 B2 | 9/2005 | Hayashi |
| 6,945,678 B2 | 9/2005 | Sugihara et al. |
| 6,946,361 B2 | 9/2005 | Takayama et al. |
| 6,953,735 B2 | 10/2005 | Yamazaki et al. |
| 6,965,195 B2 | 11/2005 | Yamazaki et al. |
| 6,967,114 B2 | 11/2005 | Shimoda et al. |
| 6,974,731 B2 | 12/2005 | Yamazaki et al. |
| 6,982,209 B2 | 1/2006 | Chen et al. |
| 6,998,282 B1 | 2/2006 | Yamazaki et al. |
| 7,045,438 B2 | 5/2006 | Yamazaki et al. |
| 7,045,442 B2 | 5/2006 | Maruyama et al. |
| 7,050,138 B1 | 5/2006 | Yamazaki et al. |
| 7,052,978 B2 | 5/2006 | Shaheen et al. |
| 7,060,153 B2 | 6/2006 | Yamazaki et al. |
| 7,061,186 B2 | 6/2006 | Inukai et al. |
| 7,075,501 B1 | 7/2006 | Spitzer et al. |
| 7,091,070 B2 | 8/2006 | Imai et al. |
| 7,094,665 B2 | 8/2006 | Shimoda et al. |
| 7,119,364 B2 | 10/2006 | Yamazaki |
| 7,122,445 B2 | 10/2006 | Takayama et al. |
| 7,147,740 B2 | 12/2006 | Takayama et al. |
| 7,180,091 B2 | 2/2007 | Yamazaki et al. |
| 7,189,631 B2 | 3/2007 | Yamazaki et al. |
| 7,198,533 B2 | 4/2007 | Duggal et al. |
| 7,214,555 B2 | 5/2007 | Yamazaki et al. |
| 7,271,858 B2 | 9/2007 | Yamazaki et al. |
| 7,285,476 B2 | 10/2007 | Shimoda et al. |
| 7,332,381 B2 | 2/2008 | Maruyama et al. |
| 7,335,573 B2 | 2/2008 | Takayama et al. |
| 7,351,300 B2 | 4/2008 | Takayama et al. |
| 7,361,519 B2 | 4/2008 | Yamazaki et al. |
| 7,375,782 B2 | 5/2008 | Yamazaki et al. |
| 7,425,931 B1 | 9/2008 | Yamazaki et al. |
| 7,442,957 B2 | 10/2008 | Yamazaki et al. |
| 7,446,843 B2 | 11/2008 | Yamazaki et al. |
| RE40,601 E | 12/2008 | Inoue et al. |
| 7,465,674 B2 | 12/2008 | Tamura et al. |
| 7,468,308 B2 | 12/2008 | Shimoda |
| 7,479,442 B2 | 1/2009 | Noguchi |
| 7,482,248 B2 | 1/2009 | Tamura |
| 7,483,091 B1 | 1/2009 | Yamazaki et al. |
| 7,612,753 B2 | 11/2009 | Koyama |
| 7,745,991 B2 | 6/2010 | Yamazaki et al. |
| 7,777,409 B2 | 8/2010 | Yamazaki et al. |
| 7,825,002 B2 | 11/2010 | Takayama et al. |
| 7,855,153 B2 | 12/2010 | Ichijo et al. |
| 7,973,313 B2 | 7/2011 | Arai et al. |
| 8,043,936 B2 | 10/2011 | Eguchi et al. |
| 8,048,770 B2 | 11/2011 | Eguchi et al. |
| 8,048,777 B2 | 11/2011 | Eguchi et al. |
| 8,137,417 B2 | 3/2012 | Eguchi et al. |
| 8,193,532 B2 | 6/2012 | Arai et al. |
| 8,324,699 B2 | 12/2012 | Ichijo et al. |
| 8,344,992 B2 | 1/2013 | Koyama |
| 8,367,440 B2 | 2/2013 | Takayama et al. |
| 8,415,208 B2 | 4/2013 | Takayama et al. |
| 9,054,141 B2 | 6/2015 | Eguchi et al. |
| 9,472,429 B2 | 10/2016 | Eguchi et al. |
| 2001/0001050 A1 | 5/2001 | Miyashita et al. |
| 2001/0004121 A1 | 6/2001 | Sakama et al. |
| 2001/0009691 A1 | 7/2001 | Thompson et al. |
| 2001/0012677 A1 | 8/2001 | Sameshima |
| 2001/0022362 A1 | 9/2001 | Hayashi |
| 2001/0030871 A1 | 10/2001 | Anderson, Jr. et al. |
| 2001/0033135 A1 | 10/2001 | Duggal et al. |
| 2001/0033347 A1 | 10/2001 | Kitahora et al. |
| 2001/0035863 A1 | 11/2001 | Kimura |
| 2001/0040645 A1 | 11/2001 | Yamazaki |
| 2002/0003201 A1 | 1/2002 | Yu |
| 2002/0004250 A1 | 1/2002 | Iketani et al. |
| 2002/0004292 A1 | 1/2002 | Yamazaki et al. |
| 2002/0030189 A1 | 3/2002 | Ishikawa |
| 2002/0041926 A1 | 4/2002 | Miyashita et al. |
| 2002/0048864 A1 | 4/2002 | Yamazaki et al. |
| 2002/0050958 A1 | 5/2002 | Matthies et al. |
| 2002/0106522 A1 | 8/2002 | McCormack et al. |
| 2002/0117256 A1 | 8/2002 | McCormack et al. |
| 2002/0136823 A1 | 9/2002 | Miyashita et al. |
| 2002/0146893 A1 | 10/2002 | Shimoda et al. |
| 2002/0155215 A1 | 10/2002 | Miyashita et al. |
| 2002/0190661 A1 | 12/2002 | Duggal et al. |
| 2003/0008437 A1 | 1/2003 | Inoue et al. |
| 2003/0020084 A1 | 1/2003 | Fan et al. |
| 2003/0024635 A1 | 2/2003 | Utsunomiya |
| 2003/0025118 A1 | 2/2003 | Yamazaki et al. |
| 2003/0025146 A1 | 2/2003 | Narwankar et al. |
| 2003/0032210 A1 | 2/2003 | Takayama et al. |
| 2003/0040164 A1 | 2/2003 | Inoue et al. |
| 2003/0041894 A1 | 3/2003 | Sverdrup, Jr. et al. |
| 2003/0047280 A1 | 3/2003 | Takayama et al. |
| 2003/0047732 A1 | 3/2003 | Yamazaki et al. |
| 2003/0054186 A1 | 3/2003 | Miyashita et al. |
| 2003/0057425 A1 | 3/2003 | Zavracky et al. |
| 2003/0059990 A1 | 3/2003 | Yamazaki |
| 2003/0062845 A1 | 4/2003 | Yamazaki et al. |
| 2003/0064569 A1 | 4/2003 | Takayama et al. |
| 2003/0068525 A1 | 4/2003 | Bellmann et al. |
| 2003/0071953 A1 | 4/2003 | Yamazaki et al. |
| 2003/0075733 A1 | 4/2003 | Yamazaki et al. |
| 2003/0082889 A1 | 5/2003 | Maruyama et al. |
| 2003/0100169 A1 | 5/2003 | Tanaka et al. |
| 2003/0117369 A1 | 6/2003 | Spitzer et al. |
| 2003/0197197 A1 | 10/2003 | Brown et al. |
| 2003/0203547 A1 | 10/2003 | Sakaguchi et al. |
| 2003/0224582 A1 | 12/2003 | Shimoda et al. |
| 2004/0014252 A1 | 1/2004 | Shimoda et al. |
| 2004/0056180 A1 | 3/2004 | Yu |

(56) References Cited

U.S. PATENT DOCUMENTS

| | | |
|---|---|---|
| 2004/0085292 A1 | 5/2004 | Spitzer et al. |
| 2004/0087110 A1 | 5/2004 | Takayama et al. |
| 2004/0106237 A1 | 6/2004 | Yamazaki |
| 2004/0129960 A1 | 7/2004 | Maruyama et al. |
| 2004/0219762 A1 | 11/2004 | Shimoda et al. |
| 2005/0006647 A1 | 1/2005 | Utsunomiya |
| 2005/0017255 A1 | 1/2005 | Yamazaki |
| 2005/0042477 A1 | 2/2005 | Miyashita et al. |
| 2005/0070038 A1 | 3/2005 | Yamazaki et al. |
| 2005/0090075 A1 | 4/2005 | Takayama et al. |
| 2006/0068533 A1 | 3/2006 | Utsunomiya |
| 2006/0125410 A1 | 6/2006 | Duggal et al. |
| 2006/0181205 A1 | 8/2006 | Pi et al. |
| 2007/0082430 A1 | 4/2007 | Yamazaki |
| 2007/0212853 A1 | 9/2007 | Maruyama et al. |
| 2007/0222397 A1 | 9/2007 | Shiang et al. |
| 2008/0049437 A1 | 2/2008 | Takayama et al. |
| 2008/0113486 A1* | 5/2008 | Eguchi .................. B32B 43/006 438/458 |
| 2008/0188022 A1 | 8/2008 | Yamazaki et al. |
| 2008/0309585 A1 | 12/2008 | Yamazaki et al. |
| 2009/0020751 A1 | 1/2009 | Seki et al. |
| 2009/0023251 A1 | 1/2009 | Eguchi et al. |
| 2009/0185130 A1 | 7/2009 | Yamazaki et al. |
| 2009/0203174 A1 | 8/2009 | Ichijo et al. |
| 2009/0291516 A1 | 11/2009 | Takayama et al. |
| 2009/0315457 A1 | 12/2009 | Furukawa et al. |
| 2011/0067808 A1* | 3/2011 | Nishio .................. C09J 7/0296 156/247 |
| 2012/0168066 A1 | 7/2012 | Eguchi et al. |
| 2012/0293859 A1 | 11/2012 | Ikegami et al. |
| 2013/0119408 A1 | 5/2013 | Koyama |
| 2013/0214324 A1 | 8/2013 | Takayama et al. |
| 2014/0234664 A1 | 8/2014 | Yasumoto et al. |

FOREIGN PATENT DOCUMENTS

| | | | |
|---|---|---|---|
| CN | 101154562 A | 4/2008 | |
| EP | 0967634 A | 12/1999 | |
| JP | 08-222535 A | 8/1996 | |
| JP | H08-250745 | 9/1996 | |
| JP | H08-288522 | 11/1996 | |
| JP | 10-125931 A | 5/1998 | |
| JP | 11-238710 A | 8/1999 | |
| JP | 11224869 A * | 8/1999 | ......... H01L 21/6836 |
| JP | 2003-068995 A | 3/2003 | |
| JP | 2003-174153 A | 6/2003 | |
| JP | 2008-109123 A | 5/2008 | |
| JP | 2008-109124 A | 5/2008 | |
| JP | 2009-117688 A | 5/2009 | |
| JP | 2009-212509 A | 9/2009 | |
| KR | 2003-0007208 A | 1/2003 | |
| KR | 2009-0086340 A | 8/2009 | |
| TW | 425625 | 3/2001 | |
| TW | 564471 | 12/2003 | |
| TW | 200949944 | 12/2009 | |
| WO | WO-1999/026282 | 5/1999 | |

OTHER PUBLICATIONS

Written Opinion (Application No. PCT/IB2014/066464) dated Apr. 7, 2015.

International Search Report (Application No. PCT/JP2014/053958) dated Jun. 3, 2014.

Written Opinion (Application No. PCT/JP2014/053958) dated Jun. 3, 2014.

Tilley.R., "8.6 Crystallographic shear phases,", Crystals and Crystal Structures, 2006, pp. 196-200.

Chinese Office Action (Application No. 201480067374.3) dated Apr. 28, 2018.

* cited by examiner

| | W(VI)-O, W(VI)-N |  |
|---|---|---|
| Structure | | |
| Bond energy [eV] | A | B |
| | 2.54 | 2.89 |

| | (2)' $WO_3 / WO_3$ |  |
|---|---|---|
| Structure | | |
| Bond energy [eV] | A | B |
| | 2.97 | |

FIG. 14
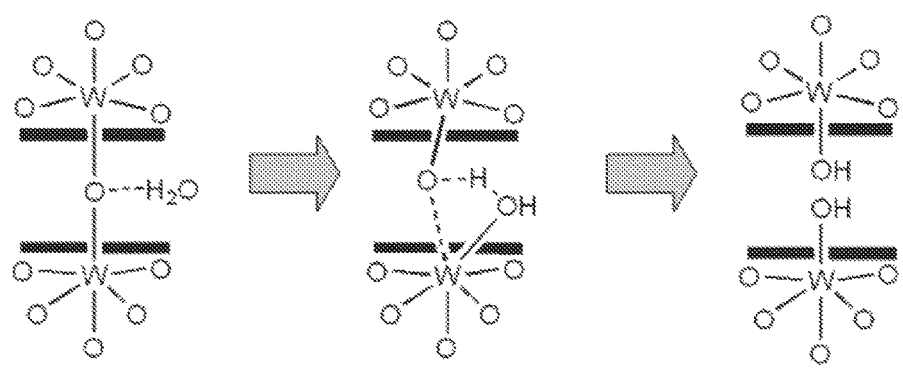
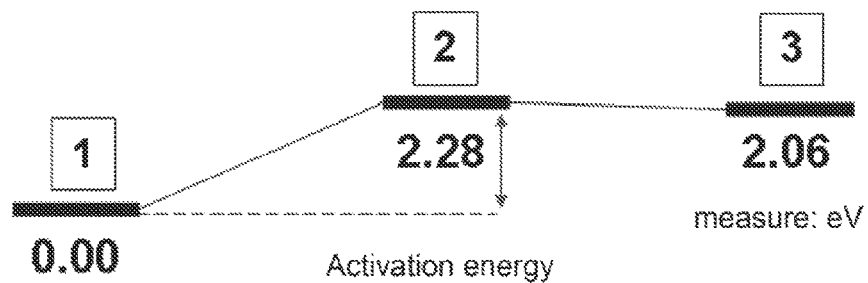
0.00    2.28    2.06
                measure: eV
   Activation energy

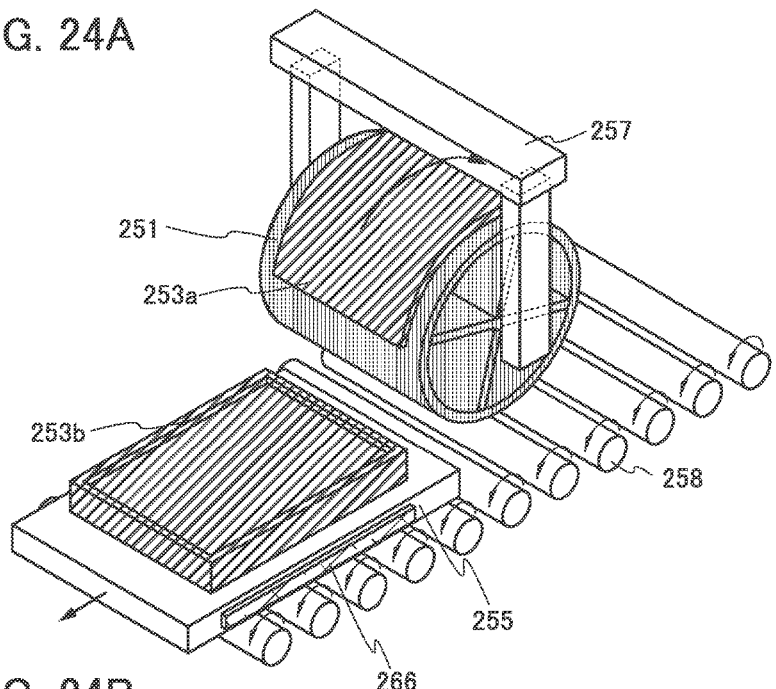
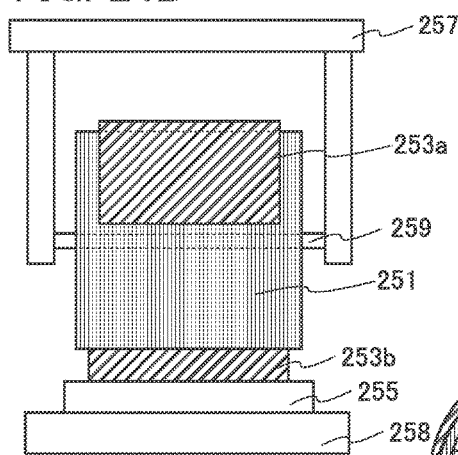
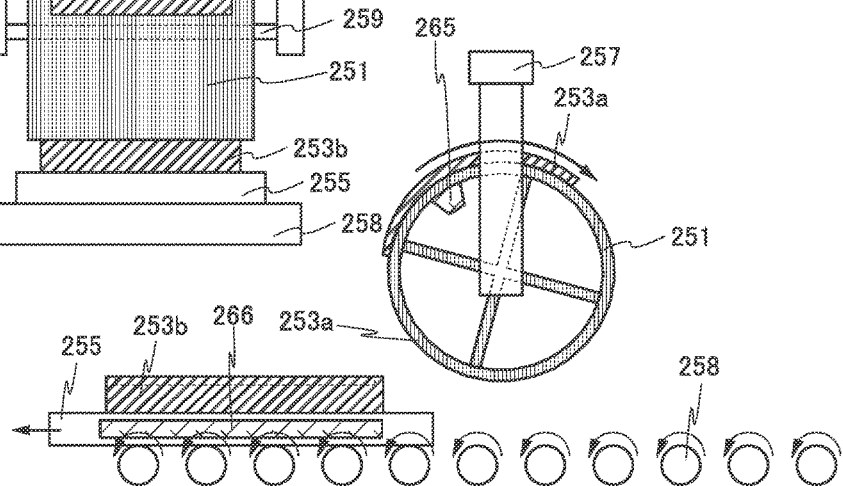

FIG. 26A1
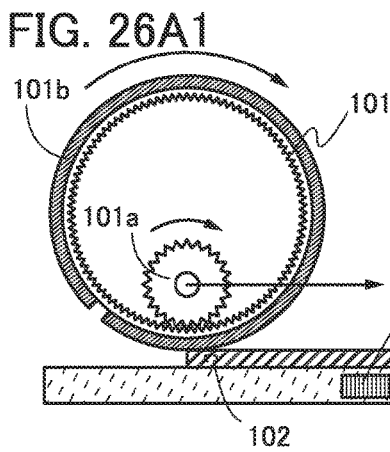
FIG. 26A2
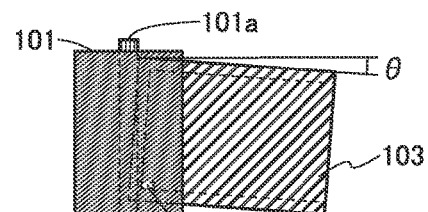
FIG. 26B1
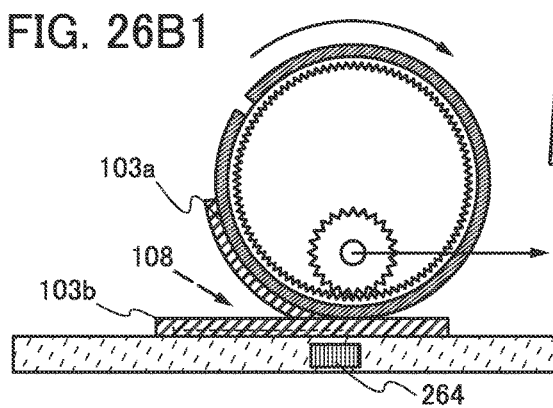
FIG. 26B2
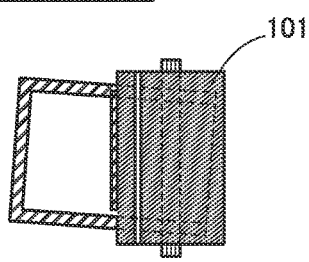
FIG. 26C2
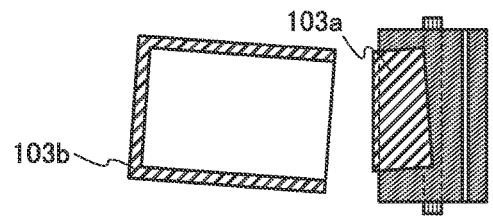
FIG. 26C1
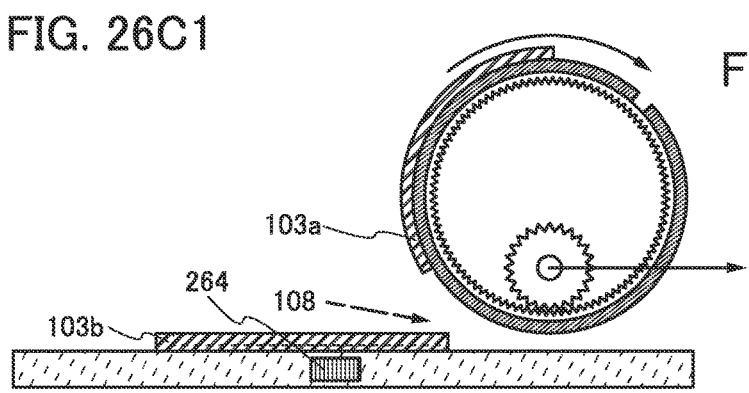

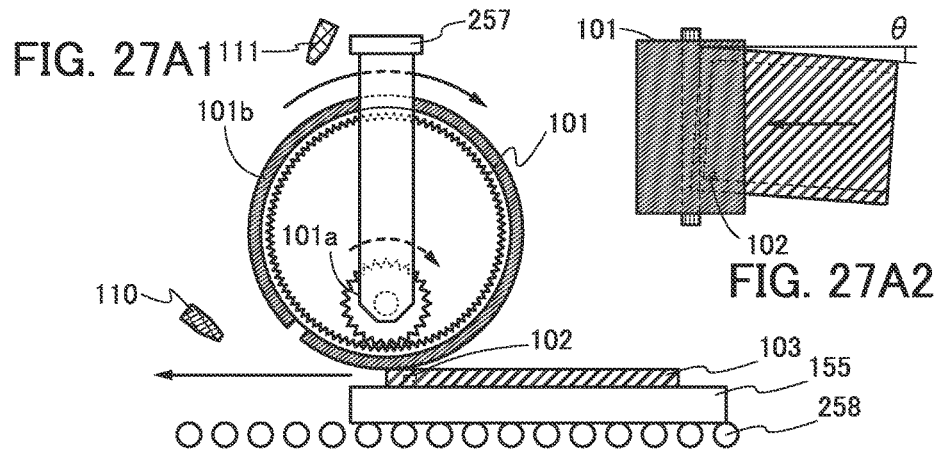
FIG. 27A1
FIG. 27A2
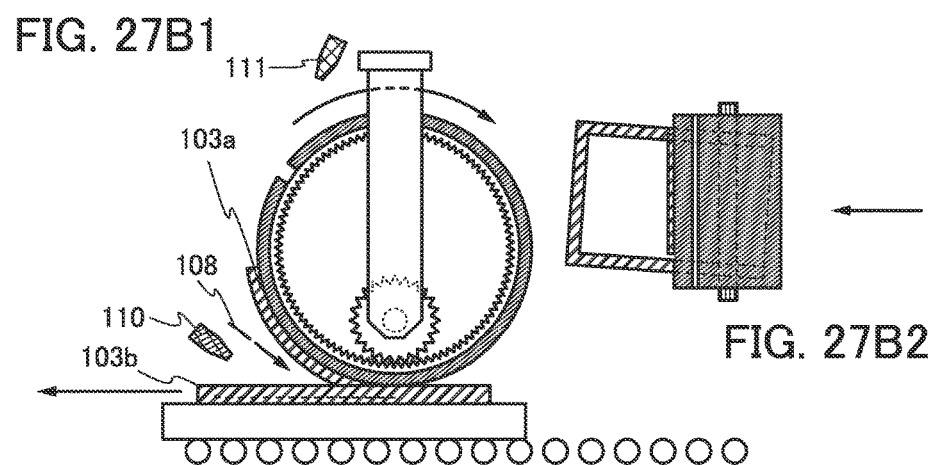
FIG. 27B1
FIG. 27B2
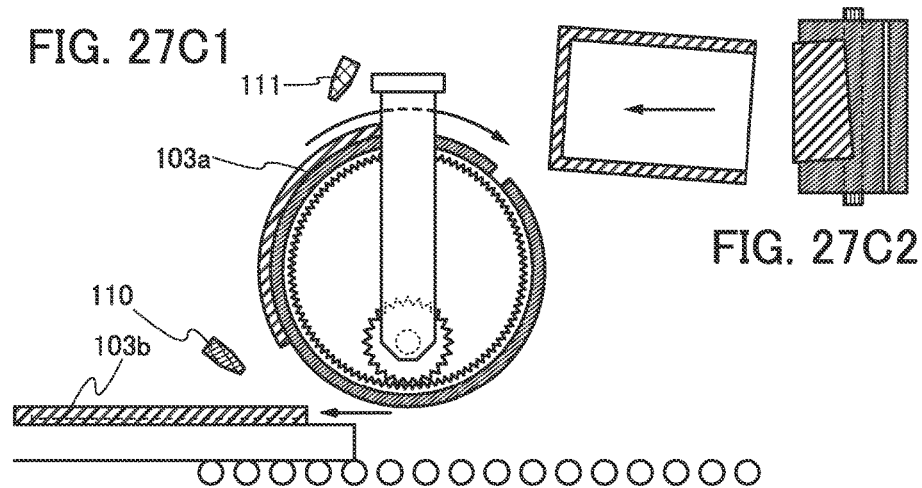
FIG. 27C1
FIG. 27C2

PEELING METHOD AND PEELING APPARATUS

TECHNICAL FIELD

One embodiment of the present invention relates to a peeling method. Another embodiment of the present invention relates to a peeling apparatus.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification can include a semiconductor device, a display device, a light-emitting device, a lighting device, an electronic device, a method for driving any of them, and a method for manufacturing any of them.

BACKGROUND ART

In recent years, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

As a method for manufacturing a device including a flexible substrate, a technique has been developed in which a functional element such as a thin film transistor or an organic electroluminescence (hereinafter also referred to as EL) element is formed over a formation substrate (e.g., a glass substrate or a quartz substrate), and then the functional element is transferred to a flexible substrate. This technique needs a step of peeling a layer to be separated including the functional element from the formation substrate.

In this specification, a step of peeling a layer to be separated from a formation substrate by physical force or a step of peeling the formation substrate from the layer to be separated by physical force is referred to as a substrate peeling process. Furthermore, a method for peeling a layer to be separated from a formation substrate by physical force or a method for peeling the formation substrate from the layer to be separated by physical force is referred to as a substrate peeling method. These are the step and the method for peeling a necessary structure with less damage, which are different from those for peeling unnecessary objects, for example, for peeling a resist or the like by photolithography or the like.

For example, Patent Document 1 discloses the following peeling technique using laser ablation: a separation layer formed of amorphous silicon or the like is formed over a substrate, a layer to be peeled which is formed of a thin film element is formed over the separation layer, and the layer to be peeled is bonded to a transfer body with a bonding layer. The separation layer is ablated by laser light irradiation, so that peeling is generated in the separation layer.

Peeling and transfer techniques described in Patent Documents 2 and 3 are proposed. Patent Document 2 discloses a peeling technique in which a silicon oxide film serving as a peeling layer is removed by wet etching. In addition, in Patent Document 3, a peeling technique by which a silicon film that is to be used as a peeling layer is removed by dry etching is disclosed.

Patent Document 4 discloses a technique in which peeling and transfer are conducted by physical force such as human hands. Patent Document 4 discloses a technique in which a metal layer (Ti, Al, Ta, W, Mo, Cu, Cr, Nd, Fe, Ni, Co, Ru, Rh, Pd, Os, or Ir) is formed over a substrate and an oxide layer is stacked thereover. In this technique, when the oxide layer is formed, a metal oxide layer of the metal layer is formed at an interface between the metal layer and the oxide layer, and peeling is carried out in a later step by utilizing this metal oxide layer.

REFERENCE

Patent Document

[Patent Document 1] Japanese Published Patent Application No. H10-125931
[Patent Document 2] Japanese Published Patent Application No. H8-288522
[Patent Document 3] Japanese Published Patent Application No. H8-250745
[Patent Document 4] Japanese Published Patent Application No. 2003-174153

DISCLOSURE OF INVENTION

When peelability at a peeling interface is low at the time of peeling of a functional element from a formation substrate, high stress is applied to the functional element, breaking the functional element in some cases. To prevent the breakage of the functional element, it is necessary to peel the substrate very slowly, which degrades throughput in some cases.

Thus, an object of one embodiment of the present invention is to provide a peeling method, a peeling apparatus, or the like with improved peelability. Another object of one embodiment of the present invention is to improve yield or throughput in a substrate peeling process. Another object of one embodiment of the present invention is to improve yield or throughput in a manufacturing process of a device such as a semiconductor device, a light-emitting device, a display device, an electronic device, or a lighting device. In particular, another object of one embodiment of the present invention is to improve yield or throughput in a manufacturing process of a semiconductor device, a light-emitting device, a display device, an electronic device, or a lighting device which is lightweight, thin, or flexible.

Another object of one embodiment of the present invention is to provide a novel peeling method, a novel peeling apparatus, or the like. Another object of one embodiment of the present invention is to provide a manufacturing method of a semiconductor device, a light-emitting device, a display device, an electronic device, a lighting device, or the like with high reliability. Furthermore, another object of one embodiment of the present invention is to provide a manufacturing method of a semiconductor device, a light-emitting device, a display device, an electronic device, a lighting device, or the like with a high degree of flexibility in shape.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a peeling method including a first step of forming a separation layer over a substrate, a second step of forming a layer to be separated over the separation layer, a third step of forming a peeling starting point by separating part of the layer to be separated from the separation layer, and a fourth step of peeling the layer to be separated from the substrate using the peeling starting point. In the fourth step, a temperature of the substrate is higher than or equal to 60° C. and lower than or equal to 90° C.

In the above method, the fourth step may include a step of peeling the layer to be separated from the substrate while at least part of the substrate is heated.

Another embodiment of the present invention is a peeling method including a first step of forming a separation layer over a substrate, a second step of forming a layer to be separated over the separation layer, a third step of forming a peeling starting point by separating part of the layer to be separated from the separation layer, and a fourth step of peeling the layer to be separated from the substrate using the peeling starting point. In the fourth step, the layer to be separated is peeled from the substrate while at least part of the layer to be separated is cooled.

In the above method, a liquid supplying step of supplying liquid between the layer to be separated and the separation layer is preferably included. The liquid supplying step is performed between the third step and the fourth step or in the fourth step. The temperature of the liquid is, for example, higher than the melting point of the liquid and lower than the boiling point of the liquid, preferably higher than 0° C. and lower than 100° C.

Another embodiment of the present invention is a peeling method including a first step of forming a separation layer over a substrate, a second step of forming a layer to be separated over the separation layer, a third step of forming a peeling starting point by separating part of the layer to be separated from the separation layer, a fourth step of peeling the layer to be separated from the substrate using the peeling starting point, and a liquid supplying step of supplying liquid between the layer to be separated and the separation layer. The liquid supplying step is performed between the third step and the fourth step or in the fourth step, and the temperature of the liquid is higher than or equal to 60° C. and lower than or equal to 90° C.

In the above method, the fourth step may include a step of heating a first portion of the substrate and a step of cooling a second portion of the layer to be separated. The first portion may include a portion that is not separated from the layer to be separated. The second portion may include a portion that is separated from the substrate.

In each of the above methods, a static electricity eliminating step of eliminating static electricity from a surface of the layer to be separated that is exposed by peeling from the substrate may be included. The static electricity eliminating step may be performed in the fourth step or after the fourth step.

In each of the above methods, a drying step of drying a surface of the layer to be separated that is exposed by peeling from the substrate may be included. The drying step may be performed after the fourth step.

Another embodiment of the present invention is a peeling method including: a first step of forming a separation layer over a substrate; a second step of forming a layer to be separated over the separation layer; a third step of forming a first surface and a second surface by peeling part of the layer to be separated from the substrate; a fourth step of expanding the areas of the first surface and the second surface by physical force to carry on the peeling of the layer to be separated: a fifth step of supplying liquid to at least part of the first surface or the second surface; a sixth step of transferring the liquid supplied in the fifth step to at least part of each of the first surface, the second surface, and a bonding portion of the first surface and the second surface by carrying on the peeling by physical force; and a seventh step of reducing peeling energy of at least part of a bond of the bonding portion of the first surface and the second surface by using a chemical bond to the liquid.

Note that in this specification, the term peeling energy refers to energy needed for carrying on peeling by cutting a bond between atoms.

Another embodiment of the present invention is a peeling method including: a first step of forming a separation layer over a substrate; a second step of forming a layer to be separated over the separation layer; a third step of forming a first surface and a second surface by peeling part of the layer to be separated from the substrate; a fourth step of supplying liquid to at least part of the first surface or the second surface; and a fifth step of expanding the areas of the first surface and the second surface by physical force to carry on the peeling of the layer to be separated and transferring the liquid supplied in the fourth step to at least part of each of the first surface, the second surface, and a bonding portion of the first surface and the second surface by carrying on the peeling by physical force. In the fifth step, peeling energy of at least part of the bond of the bonding portion of the first surface and the second surface is reduced by using a chemical bond to the liquid.

In each of the above methods, a hydrogen bond may be used as the chemical bond to the liquid.

In each of the above methods, the first step may include a step of forming a layer containing tungsten. Furthermore, in each of the methods, the first step may include a step of forming a layer containing at least one material selected from tungsten, molybdenum, titanium, tantalum, silicon, and aluminum.

In each of the above methods, the liquid may include water. The temperature of the water is preferably higher than 0° C. and lower than 100° C.

In each of the above methods, an oxidation step of oxidizing the separation layer may be included. The oxidation step may be performed between the first step and the second step. The oxidation step may include a plasma treatment step performed under an atmosphere containing nitrous oxide ($N_2O$).

In each of the above methods, the peeling is preferably performed using a roller.

In each of the methods, the second step may include a step of forming a semiconductor layer. Furthermore, in each of the methods, the second step may include a step of forming an oxide semiconductor layer. For example, a step of forming an In-M-Zn oxide (M is Al, Ti, Ga, Y, Zr, La, Ce, Nd, or Hf) layer may be included. Furthermore, a step of forming an oxide semiconductor layer including a c-axis aligned crystal may be included.

In each of the methods, the second step may include a step of forming a functional element (e.g., an organic EL element).

Another embodiment of the present invention is a peeling apparatus including a structure body, a stage, a liquid supplying mechanism, a first temperature adjustment mechanism, and a second temperature adjustment mechanism. The structure body is capable of holding a first member of a process member, the stage is capable of holding a second member of the process member, the first temperature adjustment mechanism is capable of adjusting the temperature of the structure body, the second temperature adjustment mechanism is capable of adjusting the temperature of the stage, and the liquid supplying mechanism is capable of supplying liquid to a separation surface of the first member and the second member. The first member is wound to separate the first member and the second member of the process member between the structure body and the stage from each other.

In the above structure, a drying mechanism that is capable of drying the first member may be included. Furthermore, in the above structure, a static electricity eliminating mechanism that is capable of eliminating static electricity from the first member may be included. Furthermore, in the above structure, a temperature sensor that is capable of sensing the temperature of the structure body or the stage may be included. Furthermore, in the above structure, a humidity sensor that can sense the humidity in the peeling apparatus may be included.

One embodiment of the present invention can provide a peeling method, a peeling apparatus, or the like with improved peelability. One embodiment of the present invention can improve yield or throughput in a substrate peeling process.

One embodiment of the present invention can improve yield or throughput in a manufacturing process of a device such as a semiconductor device, a light-emitting device, a display device, an electronic device, or a lighting device. In particular, one embodiment of the present invention can improve yield or throughput in a manufacturing process of a semiconductor device, a light-emitting device, a display device, an electronic device, or a lighting device which is lightweight, thin, or flexible.

One embodiment of the present invention can provide a novel peeling method, a novel peeling apparatus, or the like. One embodiment of the present invention can provide a manufacturing method of a highly reliable light-emitting device or the like. One embodiment of the present invention can provide a manufacturing method of a light-emitting device with a high degree of flexibility in shape or the like.

One embodiment of the present invention can achieve a semiconductor device or a light-emitting device that has a curved shape or is bendable by using a flexible resin film. One embodiment of the present invention can suppress generation of cracks inside a bendable device at the time of or after manufacturing the device, and can achieve a highly reliable semiconductor device or light-emitting device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:
FIG. 14 shows a calculation result of an energy diagram;
FIGS. 24A to 24C illustrate an example of a peeling apparatus;
FIGS. 26A1 to 26C2 illustrate an example of a peeling apparatus;
FIGS. 27A1 to 27C2 illustrate an example of a peeling apparatus.

BEST MODE FOR CARRYING OUT THE INVENTION

Figure 1A:
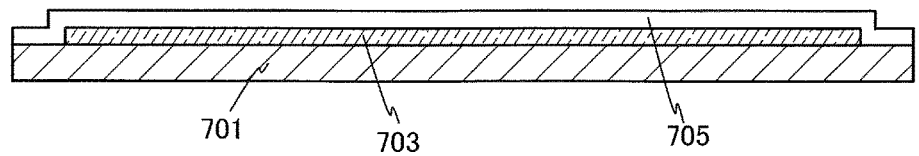
FIGS. 1A to 1D illustrate a substrate peeling method.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

In addition, the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

A layer to be separated can be formed over a formation substrate, peeled from the formation substrate, and then transferred to another substrate. With this method, for example, a layer to be separated which is formed over a formation substrate having high heat resistance can be transferred to a substrate having low heat resistance, and the manufacturing temperature of the layer to be separated is not limited by the substrate having low heat resistance. The layer to be separated is transferred to a substrate or the like which is more lightweight, thin, or flexible than the formation substrate, whereby a variety of devices such as a semiconductor device, a light-emitting device, or a display device can be made lightweight, thin, and flexible.

Furthermore, electronic devices including the variety of devices, such as television devices, monitors for computers, digital cameras, digital video cameras, digital photo frames, cellular phones, portable game machines, portable information terminals, and audio reproducing devices, can be made lightweight, thin, and flexible.

In the case of bending a device, there is a problem in that cracks are generated by force applied when the device is bent. A resin substrate or a resin film might be changed in quality (expanded and contracted, swelled, or cured) through a step of applying heat (heat treatment, deposition process, or the like) or a step using water (cleaning treatment or the like). There is also a problem in that degassing occurs when the resin substrate or the resin film is exposed to vacuum. Furthermore, the resin substrate or the resin film has, though depending on the material, a low blocking property against impurities and moisture; thus, a barrier layer needs to be provided on the surface of the resin substrate or the resin film. However, the barrier layer needs to be formed at a temperature lower than or equal to the upper temperature limit of the resin substrate or the resin film; thus, it is difficult to obtain a barrier layer with an excellent blocking property.

In the case where mass production of devices is performed by depositing films over a resin film, for example, a manufacturing apparatus, a carrying apparatus, or the like that can carry the resin film might have a complicated structure. Furthermore, if a manufacturing apparatus in which a thin film can be used as a base is newly purchased, capital investment is increased. Thus, it is preferable that a film be formed using a glass substrate and the glass substrate be carried. That is, it is preferable that a device be formed over the glass substrate, and then the glass substrate be separated and the device be placed on a resin film.

A device that can be manufactured using a peeling method of one embodiment of the present invention includes a functional element. Examples of the functional element include a semiconductor element such as a transistor; a light-emitting diode; a light-emitting element such as an inorganic EL element and an organic EL element; and a display element such as a liquid crystal element. For example, a semiconductor device including a sealed transistor and a light-emitting device including a sealed light-emitting element (here, a display device including a transistor and a light-emitting element which are sealed is also included) are examples of the device that can be manufactured according to the present invention.

In addition, a bendable device that can be used in electronic devices and the like can be manufactured using a peeling method of one embodiment of the present invention. Examples of the bendable device include a display device, a light-emitting device, and an input device. Examples of the input device include a touch sensor and a touch panel. Examples of the light-emitting device include an organic EL panel and a lighting device. Examples of the display device include a light-emitting device, an organic EL panel, and a liquid crystal display device. Note that a function of the input device such as a touch sensor may be provided in the display device or the light-emitting device. For example, a counter substrate (e.g., a substrate not provided with a transistor) of the display device or the light-emitting device may be provided with a touch sensor. Alternatively, an element substrate (e.g., a substrate provided with a transistor) of the display device or the light-emitting device may be provided with a touch sensor. Alternatively, the counter substrate of the display device or the light-emitting device and the element substrate of the display device or the light-emitting device may be provided with touch sensors.

A large display device using a resin film can be manufactured by using a peeling method of one embodiment of the present invention, and not only a passive-matrix liquid crystal display device or a passive-matrix light-emitting device but also an active-matrix liquid crystal display device or an active-matrix light-emitting device can be manufactured.

For example, in order to protect an organic EL element that is likely to deteriorate because of moisture or the like, a protective film with an excellent moisture-proof property can be formed over a glass substrate at a high temperature and transferred to a flexible organic resin substrate. Even when heat resistance and a moisture-proof property of the organic resin substrate are low, a highly reliable flexible light-emitting device can be manufactured by forming an organic EL element over the protective film transferred to the organic resin substrate.

As another example, a protective film having an excellent moisture-proof property may be formed over a glass substrate at a high temperature, and an organic EL element may be formed over the protective film. After that, the protective film and the organic EL element may be peeled from the glass substrate and transferred to a flexible organic resin substrate. Even when heat resistance and a moisture-proof property of the organic resin substrate are low, a highly reliable flexible light-emitting device can be manufactured by transferring the protective film and the organic EL element to the organic resin substrate.

Embodiment 1

In this embodiment, a peeling method of one embodiment of the present invention is described with reference to FIGS. 1A to 1C, FIGS. 2A to 2D, and FIGS. 3A to 3D.

The peeling method of one embodiment of the present invention includes a first step of forming a separation layer over a substrate, a second step of forming a layer to be separated over the separation layer, a third step of forming a peeling starting point by separating part of the layer to be separated from the separation layer, and a fourth step of peeling the layer to be separated from the substrate using the peeling starting point.

In the fourth step in the peeling method of one embodiment of the present invention, the substrate temperature is set higher than room temperature and lower than or equal to 120° C., preferably higher than 25° C. and lower than or equal to 120° C. more preferably higher than or equal to 30° C. and lower than or equal to 100° C., and further more preferably higher than or equal to 60° C. and lower than or equal to 90° C. When the substrate temperature is higher than room temperature, the peelability and the yield of the peeling can be improved.

In one embodiment of the present invention, the substrate temperature is not limited to the above range, and may be higher than 0° C. and lower than room temperature, preferably higher than 0° C. and lower than or equal to 20° C., for example. When the substrate temperature is lower than room temperature, deformation such as warping, bending, and distortion of the substrate and the layer to be separated at the time of peeling can be suppressed.

In the fourth step in the peeling method of one embodiment of the present invention, the temperature of the layer to be separated is set higher than room temperature and lower than or equal to 120° C. preferably higher than 25° C. and lower than or equal to 120° C., more preferably higher than or equal to 30° C. and lower than or equal to 120° C., and further more preferably higher than or equal to 60° C. and lower than or equal to 90° C. When the temperature of the layer to be separated is higher than room temperature, the yield of the peeling can be improved. Furthermore, when the temperature of the layer to be separated is higher than room temperature, the layer to be separated can recover from warping, bending, and distortion in some cases. Note that in one embodiment of the present invention, the steps of increasing the temperature of the substrate and the layer to be separated are different from a step of irradiating the substrate and the layer to be separated with light for forming the peeling starting point or proceeding of the peeling.

In one embodiment of the present invention, the temperature of the layer to be separated is not limited to the above range, and may be higher than 0° C. and lower than room temperature, preferably higher than 0° C. and lower than or equal to 20° C., for example. When the temperature of the layer to be separated is lower than room temperature, deformation such as warping, bending, and distortion of the substrate and the layer to be separated at the time of peeling can be suppressed.

In the case where the temperature of the substrate or the layer to be separated is not uniform depending on place, the substrate or the layer to be separated has at least a portion with a temperature within the above range. Furthermore, the substrate or the layer to be separated may have a portion with a temperature not within the above range (e.g., a portion with a temperature lower than or equal to 0° C. and a portion with a temperature higher than or equal to 120° C.).

In the peeling method of one embodiment of the present invention, the temperatures of the substrate and the layer to be separated in the substrate peeling process are controlled, whereby the yield of the peeling can be improved.

For example, the substrate peeling process may be performed after heating the substrate. Alternatively, the substrate peeling process may be performed while the substrate is heated. Alternatively, the substrate may be heated after the substrate peeling process.

For example, the substrate peeling process may be performed after heating the layer to be separated. Alternatively, the substrate peeling process may be performed while the layer to be separated is heated. Alternatively, the layer to be separated may be heated after the substrate peeling process.

For example, the substrate peeling process may be performed after cooling the substrate. Alternatively, the substrate peeling process may be performed while the substrate is cooled. Alternatively, the substrate may be cooled after the substrate peeling process.

For example, the substrate peeling process may be performed after cooling the layer to be separated. Alternatively, the substrate peeling process may be performed while the layer to be separated is cooled. Alternatively, the layer to be separated may be cooled after the substrate peeling process.

In one embodiment of the present invention, when the substrate or the layer to be separated is heated, at least part of the substrate or the layer to be separated is heated, and the whole of the substrate or the layer to be separated may be heated. Similarly, when the substrate or the layer to be separated is cooled, at least part of the substrate or the layer to be separated is cooled, and the whole of the substrate or the layer to be separated may be cooled.

In one embodiment of the present invention, the temperature of the substrate and the temperature of the layer to be separated in the substrate peeling process are set different from each other, whereby the peeling is easily performed and the yield of the peeling can be improved. For example, the difference between the temperature of the substrate and the temperature of the layer to be separated is preferably greater than or equal to 10° C. and less than or equal to 120° C., and more preferably greater than or equal to 20° C. and less than or equal to 60° C. Note that whichever of the temperatures of the substrate and the layer to be separated may be higher than the other. Furthermore, either one of the temperature of the substrate and the temperature of the layer to be separated may be room temperature. In the case where each of the temperature of the substrate and the temperature of the layer to be separated is not uniform depending on place, the temperature of a certain portion of the substrate and the temperature of a certain portion of the layer to be separated may be compared with each other. In the case where it is difficult to measure the temperatures of the substrate and the layer to be separated, the difference between the temperature of a support (a roller, a stage, or the like) of the substrate and the temperature of a support (a roller, a stage, or the like) of the layer to be separated may be set within the above range.

Furthermore, in one embodiment of the present invention, the temperatures of the layer to be separated before and after the substrate peeling process are set different from each other, whereby the peeling is easily performed and the yield of the peeling can be improved. For example, the difference between the temperatures of the layer to be separated before and after the substrate peeling process is preferably greater than or equal to 10° C. and less than or equal to 120° C., and more preferably greater than or equal to 20° C. and less than or equal to 60° C. Note that whichever of the temperatures before and after the substrate peeling process may be higher than the other. Furthermore, either one of the temperatures before and after the substrate peeling process of the layer to be separated may be room temperature. In the case where the temperature of the layer to be separated is not uniform depending on place, the temperatures before and after the substrate peeling process of a certain portion of the layer to be separated may be compared with each other. In the case where it is difficult to measure the temperature of the layer to be separated, the difference between the temperatures of a support (a roller, a stage, or the like) of the layer to be separated before and after the substrate peeling process may be set within the above range.

In addition, the peeling method of one embodiment of the present invention preferably includes a liquid supplying step of supplying liquid between the layer to be separated and the separation layer. The liquid supplying step may be performed between the third step and the fourth step, or in the fourth step.

A temperature of a peeling interface may be controlled by supplying liquid. To make the temperature of the peeling interface lower than room temperature, the temperature of the supplied liquid is set to be higher than the melting point of the liquid and lower than room temperature. For example, the temperature of the liquid may be higher than 0° C. and lower than or equal to 20° C. To make the temperature of the peeling interface higher than room temperature, the temperature of the supplied liquid is set to be higher than room temperature and lower than the boiling point of the liquid. For example, the temperature of the liquid is preferably higher than 25° C. and lower than or equal to 120° C., more preferably higher than or equal to 30° C. and lower than or equal to 120° C., and further more preferably higher than or equal to 60° C. and lower than or equal to 90° C. As the temperature of the liquid is set higher, permeation of the liquid through capillarity action is promoted and the peeling is easily performed, which is preferable.

Alternatively, the temperature of the peeling interface can be controlled by regulating the temperatures of the substrate and the layer to be separated in the substrate peeling process. When the temperatures of the substrate and the layer to be separated are high, decrease of the temperature of liquid supplied to the peeling interface can be suppressed, which is preferable because the permeation of the liquid through capillarity action is not easily suppressed in that case. In addition, when the temperatures of the substrate and the layer to be separated are high, the temperature of liquid supplied to the peeling interface can be increased, which is preferable because the permeation of the liquid through capillarity action is promoted and the peeling is easily performed in that case. Note that in the case where the temperature of the peeling interface is controlled by regulating the temperatures of the substrate and the layer to be separated, the temperature of the supplied liquid may be room temperature.

For example, the layer to be separated is peeled from a warmed substrate and cooled, whereby the yield of the peeling can be improved and warping and bending of the separated layer can be suppressed. The fourth step may include a step of heating a first portion of the substrate and a step of cooling a second portion of the layer to be separated. The first portion may include a portion that is not separated from the layer to be separated. The second portion may include a portion that is separated from the substrate.

In addition, the peeling method of one embodiment of the present invention may include a static electricity eliminating step of eliminating static electricity from the surface of the layer to be separated that is exposed by being peeled from the substrate. The static electricity eliminating step may be performed in the fourth step or after the fourth step.

Furthermore, the peeling method of one embodiment of the present invention may include a drying step of drying the surface of the layer to be separated that is exposed by being peeled from the substrate. The drying step may be performed after the fourth step.

Moreover, the peeling method of one embodiment of the present invention may include an oxidation step of oxidizing the separation layer. The oxidation step may be performed between the first step and the second step. The oxidation step may include a plasma treatment step performed under an atmosphere containing nitrous oxide ($N_2O$).

Furthermore, in the peeling method of one embodiment of the present invention, the peeling is preferably performed using a roller. The temperature of the substrate or the layer to be separated that is in contact with the roller may be controlled by regulating the temperature of the roller.

A substrate peeling method of one embodiment of the present invention will be described below.

Figure 1B:
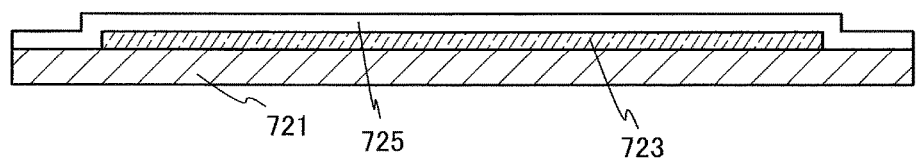

First, a separation layer 703 is formed over a formation substrate 701, and a layer 705 to be separated (hereinafter referred to as a layer 705) is formed over the separation layer 703 (FIG. 1A). Furthermore, a separation layer 723 is formed over a formation substrate 721, and a layer 725 to be separated (hereinafter referred to as a layer 725) is formed over the separation layer 723 (FIG. 1B). Although an example in which the separation layer is formed to have an island shape is described here, one embodiment of the present invention is not limited to such an example. Furthermore, the layer to be separated may be formed to have an island shape.

In this step, the material of the separation layer is selected such that peeling occurs at the interface between the formation substrate and the separation layer, the interface between the separation layer and the layer to be separated, or in the separation layer when the layer to be separated is peeled from the formation substrate. In this embodiment, an example in which peeling occurs at the interface between the layer to be separated and the separation layer is described; however, one embodiment of the present invention is not limited to such an example and depends on a material used for the separation layer or the layer to be separated.

As the formation substrate, a substrate having at least heat resistance high enough to withstand process temperature in a manufacturing process is used. For example, a glass substrate, a quartz substrate, a sapphire substrate, a semiconductor substrate, a ceramic substrate, a metal substrate, a resin substrate, or a plastic substrate can be used.

In the case where a glass substrate is used as the formation substrate, an insulating layer such as a silicon oxide film, a silicon oxynitride film, a silicon nitride film, or a silicon nitride oxide film is preferably formed as a base film between the formation substrate and the separation layer, in which case contamination from the glass substrate can be prevented.

The separation layer can be formed using an element selected from tungsten, molybdenum, titanium, vanadium, tantalum, silicon, and aluminum; an alloy material containing any of the elements; a compound material containing any of the elements; or the like. Furthermore, the separation layer may have a stacked-layer structure of a film containing any of the materials and an oxide film containing any of the materials. The separation layer is not limited to an inorganic film, and an organic film containing polyimide, polyester, polyolefin, polyamide, polycarbonate, acrylic, or the like may be used.

As the separation layer, for example, a tungsten film is used. In the case of using a tungsten film as the separation layer, a tungsten oxide film (also referred to as an oxide layer) is preferably formed between the tungsten film and the layer to be separated. The formation of the tungsten oxide film enables the layer to be separated to be separated with a smaller amount of force. By using an oxidation method such as plasma treatment in an atmosphere of a gas containing oxygen such as $N_2O$, heat treatment in an atmosphere of a gas containing oxygen, or sputtering in an atmosphere of a gas containing oxygen, a tungsten oxide film can be formed on the tungsten film. Then, the layer to be separated is formed, so that the tungsten oxide film can be formed between the tungsten film and the layer to be separated.

At the time of a peeling and transferring process performed later, it is preferable that the tungsten oxide film be mainly $WO_x$ ($x<3$). In the case where $WO_x$ is $W_nO_{(3n-1)}$ or $W_nO_{(3n-2)}$ (n is a natural number), which is a homologous series, shear is easily caused by heating because there is a crystal optical shear plane therein. Forming the tungsten oxide film by $N_2O$ plasma treatment enables peeling of the layer to be separated from the substrate with a small force.

Alternatively, the tungsten oxide film can be directly formed without forming the tungsten film. For example, only the tungsten oxide film may be formed as the separation layer by performing plasma treatment in an atmosphere of a gas containing oxygen or heat treatment in an atmosphere of a gas containing oxygen on a sufficiently thin tungsten film, or performing sputtering in an atmosphere of a gas containing oxygen.

After the substrate peeling process, the oxide layer such as the tungsten oxide film is left on the layer to be separated side in some cases. In this case, parasitic capacitance might be generated to adversely affect the characteristics of a functional element. Thus, a step of removing an oxide layer such as the tungsten oxide film left on the layer to be separated side may be performed after the step of separating the separation layer and the layer to be separated. For example, when the separation is performed at the interface between the layer to be separated and the tungsten oxide film, at the interface between the tungsten film and the tungsten oxide film, or in the tungsten oxide film, the tungsten oxide film is left on the layer to be separated side in some cases. When the tungsten oxide film is left, parasitic capacitance may be generated. Note that in the case where the oxide layer such as the tungsten oxide film does not need to be removed, the step of removing the tungsten oxide film or the like can be omitted. In this case, the device can be manufactured more easily.

The thickness of the separation layer is preferably greater than or equal to 0.1 nm and less than or equal to 200 nm. For example, a tungsten film with a thickness of 0.1 nm or more and 200 nm or less may be used.

There is no particular limitation on a layer formed as the layer to be separated. For example, an insulating layer in contact with the separation layer 703 is formed over the separation layer 703 as the layer 705. Moreover, a functional element such as an organic EL element or a transistor may be formed over the insulating layer.

The insulating layer over the separation layer 703 preferably has a single-layer structure or a stacked-layer structure including any of a silicon nitride film, a silicon oxynitride film, a silicon oxide film, a silicon nitride oxide film, and the like.

As the insulating layer, for example, a first layer from which nitrogen is released by heating and a second layer that has a function of suppressing the release of nitrogen to the upper layer (the outside) of the first layer (i.e., blocks the release of nitrogen) are provided. The first layer is preferably an insulating layer containing hydrogen, nitrogen, and silicon. As the first layer, for example, a silicon oxynitride film can be used. The second layer preferably contains nitrogen and silicon. As the second layer, for example, a silicon nitride film can be used. A large amount of nitrogen released from the layer to be separated by heat treatment can be supplied to the oxide layer (e.g., a tungsten oxide film), so that an oxide layer containing a large amount of nitrogen can be formed. Consequently, peelability can be improved.

The layer to be separated may include a semiconductor layer. The semiconductor layer may be an oxide semiconductor layer. The oxide semiconductor layer may be formed using one or a plurality of In-M-Zn oxide (M is Al, Ti, Ga, Y, Zr, La, Ce, Nd, or Hf) layers, and may include a c-axis aligned crystal. Alternatively, the semiconductor layer may be a semiconductor layer containing silicon.

Figure 1C:
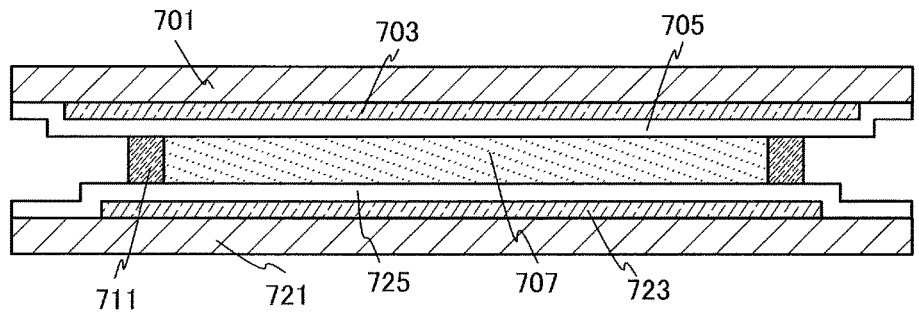

Next, the formation substrate 701 and the formation substrate 721 are attached to each other by using a bonding layer 707 and a frame-like bonding layer 711 so that the surfaces over which the layers to be separated are formed face each other, and then, the bonding layer 707 and the frame-like bonding layer 711 are cured (FIG. 1C). Here, the frame-like bonding layer 711 and the bonding layer 707 in a region surrounded by the frame-like bonding layer 711 are provided over the layer 725 and after that, the formation substrate 701 and the formation substrate 721 are attached to each other.

For the bonding layer 707 and the frame-like bonding layer 711, a resin that is curable at room temperature such as a two-component type resin, a light-curable resin, a heat-curable resin, or the like can be used. The examples include an epoxy resin, an acrylic resin, a silicone resin, a phenol resin, and the like. In particular, a material with low moisture permeability, such as an epoxy resin, is preferred.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress deterioration of the functional element due to entry of moisture in the air and can improve the reliability of the device.

Note that the formation substrate 701 and the formation substrate 721 are preferably attached to each other in a reduced-pressure atmosphere.

Figure 1D:
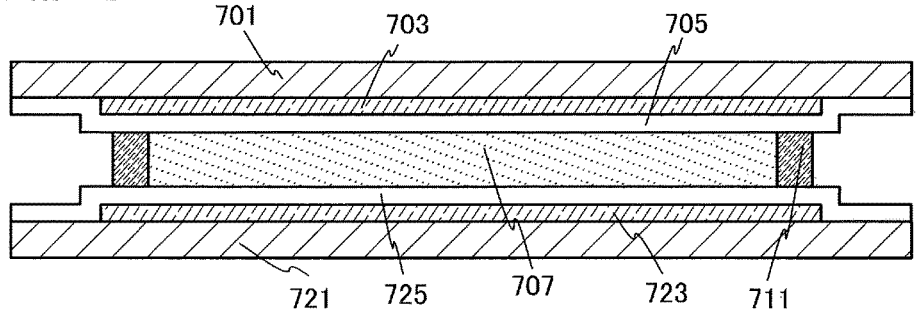

Note that although FIG. 1C illustrates the case where the separation layer 703 and the separation layer 723 are different in size, separation layers having the same size as illustrated in FIG. 1D may be used.

The bonding layer 707 is provided to overlap with the separation layer 703, the layer 705, the layer 725, and the separation layer 723. Then, edges of the bonding layer 707 are preferably positioned inside an area between at least edges of either the separation layer 703 or the separation layer 723 (the separation layer which is desirably peeled from the substrate first). Accordingly, strong adhesion between the formation substrate 701 and the formation substrate 721 can be suppressed; thus, a decrease in yield of a subsequent substrate peeling process can be suppressed.

Figure 2A:
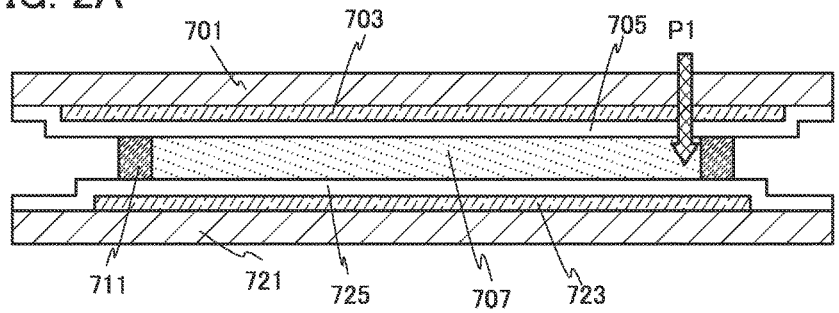
FIGS. 2A to 2D illustrate a substrate peeling method.
Figure 2B:
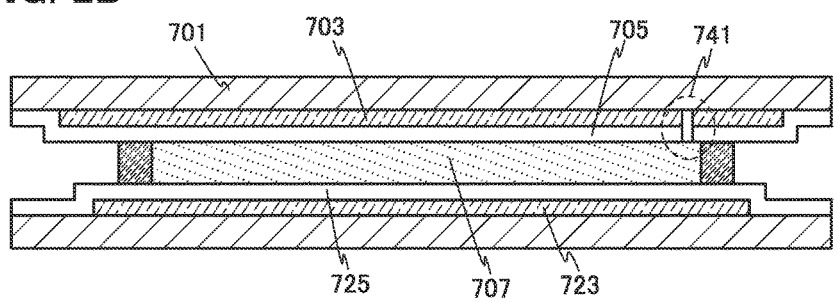

Next, a first peeling starting point 741 is formed by laser irradiation (FIGS. 2A and 2B).

As the formation method of the peeling starting point, a method of peeling part of the layer to be separated from the separation layer, a method of peeling part of the separation layer from the substrate, a method of forming a crack in the separation layer, or the like is used.

Either the formation substrate 701 or the formation substrate 721 may be peeled first. In the case where the separation layers differ in size, a substrate over which a larger separation layer is formed may be peeled first or a substrate over which a smaller separation layer is formed may be peeled first. In the case where an element such as a semiconductor element, a light-emitting element, or a display element is formed over only one of the substrates, the substrate on the side where the element is formed may be peeled first or the other substrate may be peeled first. Here, an example in which the formation substrate 701 is peeled first is described.

A region where the bonding layer 707 in a cured state, the layer 705, and the separation layer 703 overlap with one another is irradiated with laser light (see an arrow P1 in FIG. 2A). When the frame-like bonding layer 711 is in a cured state, a region where the frame-like bonding layer 711, the layer 705, and the separation layer 703 overlap with one another may be irradiated with laser light.

Part of the layer 705 is removed; thus, the first peeling starting point 741 can be formed (FIG. 2B). At this time, not only the layer 705 but also the separation layer 703 or the bonding layer 707 may be partly removed. In the case where the layer 705 has a stacked-layer structure, at least part of the layer in contact with the separation layer is removed.

It is preferred that laser light irradiation be performed from the side of the substrate provided with the separation layer that is desirably peeled. In the case where a region where the separation layer 703 and the separation layer 723 overlap with each other is irradiated with laser light, the formation substrate 701 and the separation layer 703 can be selectively peeled by cracking only the layer 705 of the layers 705 and 725 (FIG. 2C).

When a peeling starting point is formed in both the layer 705 on the separation layer 703 side and the layer 725 on the separation layer 723 side in the case where the region where the separation layer 703 and the separation layer 723 overlap with each other is irradiated with laser light, it might be difficult to selectively peel one of the formation substrates. Therefore, laser light irradiation conditions are restricted so that only one of the layers to be separated is cracked, in some cases.

The method for forming the first peeling starting point 741 is not limited to laser light irradiation, and the first peeling starting point 741 may be formed by a sharp knife such as a cutter.

Figure 2C:
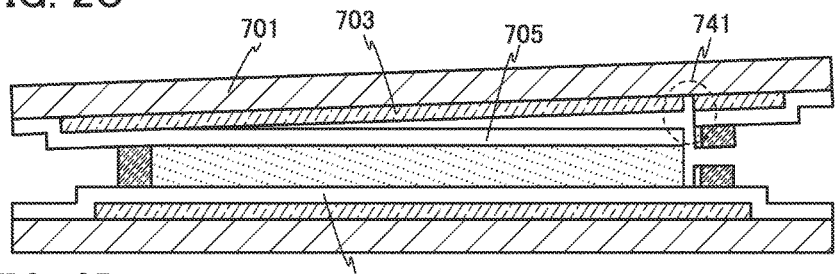
Figure 2D:
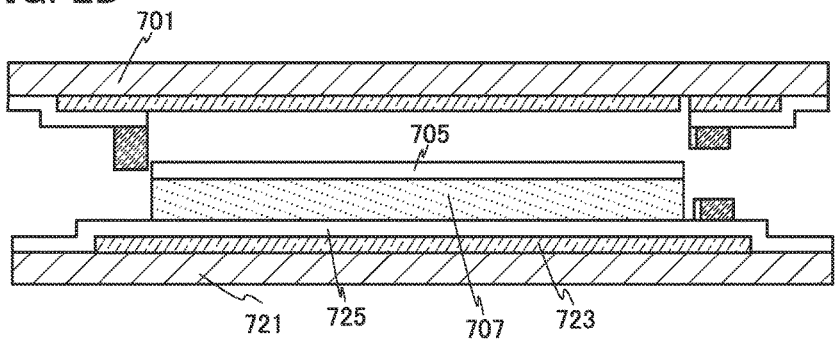

Then, the layer 705 and the formation substrate 701 are separated from each other from the first peeling starting point 741 (FIGS. 2C and 2D). Consequently, the layer 705 can be transferred from the formation substrate 701 to the formation substrate 721. Note that the bonding layer 707 that is more on the outside than the peeling starting point remains on at least one of the formation substrates 701 and 721. Although FIGS. 2C and 2D illustrate an example in which the bonding layer 707 remains on both substrates, one embodiment of the present invention is not limited to this example.

For example, the layer to be separated and the formation substrate may be separated by mechanical force (a peeling process with a human hand or a gripper, a peeling process by rotation of a roller, or the like) from the peeling starting point.

Figure 3A:
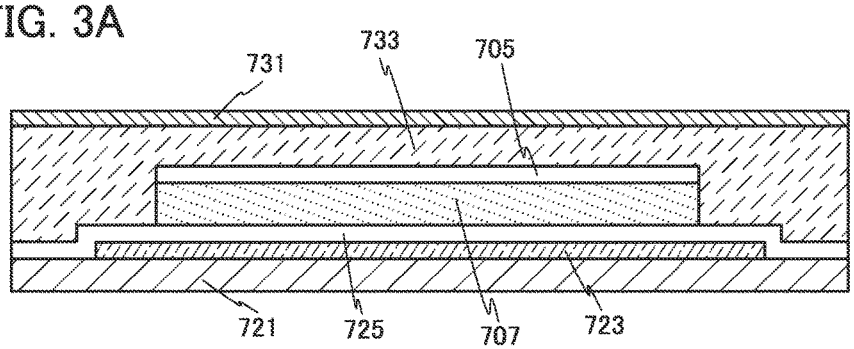
FIGS. 3A to 3D illustrate a substrate peeling method.

The layer 705 that is separated from the formation substrate 701 in the step in FIG. 2D is attached to a substrate 731 with a bonding layer 733, and the bonding layer 733 is cured (FIG. 3A).

Figure 3B:
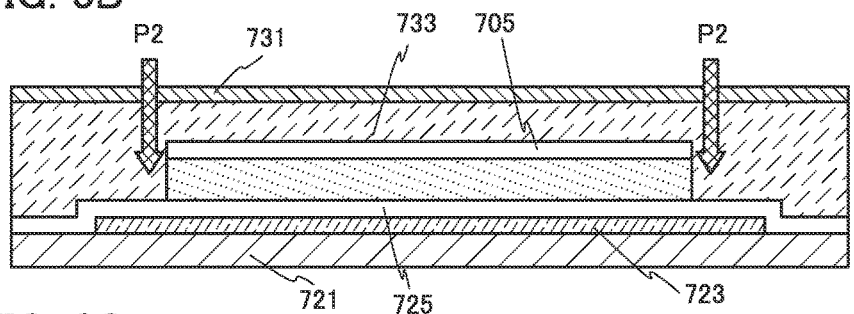
Figure 3C:
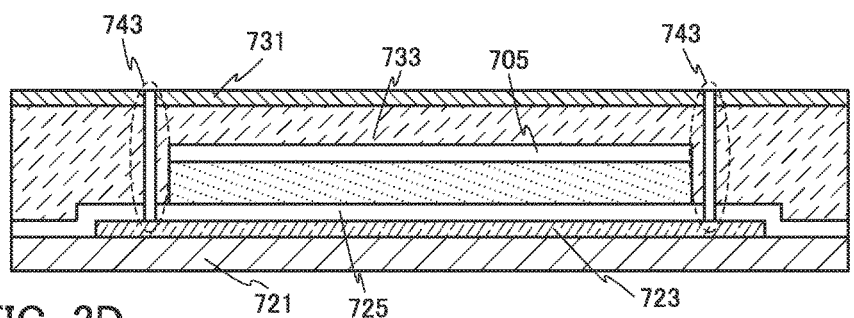
Figure 3D:
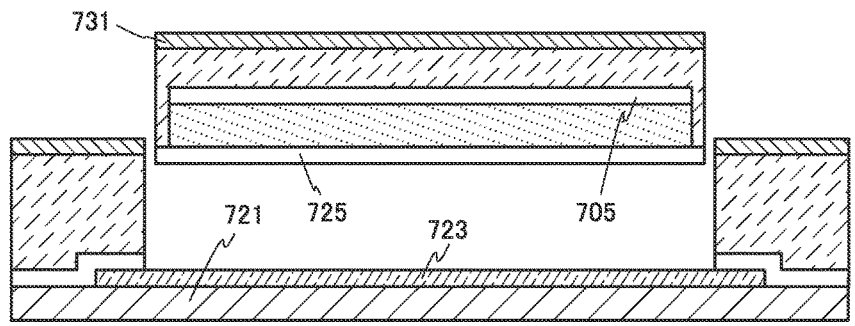

Next, a second peeling starting point 743 is formed by a sharp knife such as a cutter (FIGS. 3B and 3C). The method for forming the second peeling starting point is not limited to a sharp knife such as a cutter, and the second trigger may be formed by laser light irradiation or the like.

In the case where the substrate 731 on the side where the separation layer 723 is not provided can be cut by a knife or the like, a cut may be made in the substrate 731, the bonding layer 733, and the layer 725 (see arrows P2 in FIG. 3B). Consequently, part of the layer 725 can be removed; thus, the second peeling starting point 743 can be formed (FIG. 3C).

In the case where there is a region in which the formation substrate 721 and the substrate 731 are attached to each other using the bonding layer 733 without overlapping with the separation layer 723 as illustrated in FIGS. 3B and 3C, yield of a subsequent peeling process might be decreased depending on the degree of adhesion between the layer 725 and the formation substrate 721. Therefore, a cut is preferably made in a frame shape in a region where the bonding layer 733 in a cured state and the separation layer 723 overlap with each other to form the second peeling starting point 743 in the form of a solid line. This can improve the yield of the peeling process.

Then, the layer 725 and the formation substrate 721 are separated from each other from the second peeling starting point 743 (FIG. 3D), so that the layer 725 can be transferred from the formation substrate 721 to the substrate 731.

For example, in the case where an inorganic film such as a tungsten film is provided as the separation layer 723 and a tungsten oxide film which is tightly anchored by $N_2O$ plasma or the like is provided on the separation layer 723, the adhesion can be relatively high in deposition. After that, cleavage occurs from the second peeling starting point 743, whereby the layer 725 to be separated can be easily peeled from the formation substrate and transferred to the substrate.

The formation substrate 721 and the layer 725 may be separated from each other by filling the interface between the separation layer 723 and the layer 725 with a liquid such as water. A portion between the separation layer 723 and the layer 725 absorbs a liquid through a capillarity action. Accordingly, an adverse effect on the functional element such as an FET included in the layer 725 due to static electricity caused at the time of peeling (e.g., a phenomenon in which a semiconductor element is damaged by static electricity) can be suppressed.

In the case where an inorganic film such as a tungsten film is provided as the separation layer 723 and a tungsten oxide film is provided on the separation layer 723, the layers in the stacked-layer structure are connected to each other with an M-O—W bond (M represents a given element). When the M-O—W bond is divided at the same time as peeling of the layers by application of physical force to the stacked-layer structure, moisture is absorbed through the gap between surfaces exposed by the peeling, whereby the M-O—W bond can become bonds of M-OH HO—W by reacting with water at the same time as being divided. Thus, a distance between an M atom and a W atom becomes longer and a distance between layers also becomes longer, so that the separation of the layers can be promoted. Note that the M-O—W bond does not necessarily become the bonds of M-OH HO—W by reaction with water at the same time as being divided. The M-O—W bond may become the bonds of M-OH HO—W before or after being divided.

Note that a liquid may be sprayed in an atomized form or in a vaporized form. Examples of liquids include pure water, an organic solvent, a neutral, alkali, or acid aqueous solution, and an aqueous solution in which a salt is dissolved.

The temperatures of the liquid and the substrate at the time of peeling are preferably higher than 0° C. and lower than or equal to 120° C., more preferably higher than or equal to room temperature and lower than or equal to 120° C., further more preferably higher than or equal to 60° C. and lower than or equal to 90° C. For example, in the case where pure water is used as the liquid, the temperature of the pure water is preferably higher than 0° C. and lower than 100° C.

When the substrate is separated from the layer to be separated, a roller such as a drum roller can be used. Part of the roller surface may have stickiness. For example, an adhesive tape or the like may be put on part of the roller surface. By rotating the roller, the layer to be separated is wound and separated from the substrate having an insulating surface. By regulating the surface temperature of the roller, the temperature of the layer to be separated can be easily regulated. As compared with a holding mechanism such as a hand or a chuck, the roller can be in contact with the layer to be separated in a large area; thus, the temperature of the layer to be separated can be easily regulated, which is preferable. Embodiment 4 can be referred to for details of the peeling method and the peeling apparatus using a roller.

In the above-described substrate peeling method in one embodiment of the present invention, peeling of the formation substrate is performed in such a manner that the second peeling starting point 743 is formed by a sharp knife or the like so that the separation layer and the layer to be separated are made in a peelable state. This can improve the yield of the substrate peeling process.

In addition, bonding of a substrate with which a device is to be formed can be performed after the following procedure: a pair of formation substrates each provided with a layer to be separated are attached to each other and the formation substrates are individually peeled. Therefore, formation substrates having low flexibility can be attached to each other when the layers to be separated are attached to each other, whereby alignment accuracy at the time of attachment can be improved compared with the case where flexible substrates are attached to each other.

The resin substrate and the resin film included in the device do not go through a formation process (including a cleaning step, a deposition step, a vacuum heating step, and the like) of the functional element such as a transistor. Thus, the device structure is sandwiched between resin films without damage, so that a high reliable device can be obtained.

Note that, for example, in the case of using an organic resin for the separation layer, the layer to be separated needs to be formed at a temperature lower than or equal to 350° C. When low-temperature polysilicon is used for the layer to be separated, dehydrogenation baking for crystallization of silicon, hydrogenation for termination of defects in silicon, activation of a doped region, and the like cannot be performed at a sufficient temperature, so that the performance of the device is limited. On the other hand, in the case of using an inorganic film as the separation layer, the process for forming the layer to be separated can be performed at a temperature higher than 350° C.; thus, excellent characteristics of a device can be obtained.

In the case of using an organic resin for the separation layer, the organic resin or the functional element is damaged in some cases by laser irradiation at the time of crystallization; thus, it is preferable to use an inorganic film for the separation layer because such a problem is not caused in that case.

Furthermore, in the case of using an organic resin for the separation layer, the organic resin shrinks by laser irradiation for separating the resin and contact failure is caused in the connection portion of a terminal of an FPC or the like in some cases, which makes it difficult for a structure with many terminals to be separated and transferred with high yield in manufacturing a high-definition display, for example. In the case of using an inorganic film for the separation layer, there is no such limitation, and a structure with many terminals of a high-definition display or the like can be separated and transferred with high yield.

In the peeling method of one embodiment of the present invention, an insulating layer or a functional element such as a transistor can be formed over a formation substrate at a temperature of lower than or equal to 600° C., for example. In that case, low-temperature polysilicon can be used for a semiconductor layer. With use of a conventional manufacturing line for low-temperature polysilicon, semiconductor devices with a high operation speed, a high gas barrier property, and high reliability can be mass-produced. For example, an insulating layer and a transistor formed through a process at 300° C. or higher and 600° C. or lower can be used. Furthermore, for example, insulating layers having an excellent gas barrier property formed at temperatures of higher than or equal to 300° C. and lower than or equal to 600° C. can be provided above and below an organic EL element. Accordingly, for example, entry of impurities such as moisture into the organic EL element or the semiconductor layer can be suppressed, whereby an extraordinarily reliable light-emitting device can be obtained as compared with the case of using an organic resin or the like for the separation layer.

Alternatively, the insulating layer or the functional element such as a transistor can be formed over the formation substrate at a temperature of 500° C. or lower. In that case, an oxide semiconductor can be used for the semiconductor layer, and mass production is possible with use of an existing production line for an oxide semiconductor or a manufacturing line for low-temperature polysilicon or the like. In that case, an insulating layer and a transistor formed through a process at 500° C. or lower can be used. Furthermore, insulating layers having an excellent gas barrier property formed at a temperature of 500° C. or lower can be provided above and below the organic EL element. Accordingly, for example, the entry of impurities such as moisture into the organic EL element or the semiconductor layer can be suppressed, whereby a very highly reliable light-emitting device can be obtained as compared with the case of using an organic resin for the separation layer.

Alternatively, the insulating layer or the functional element such as a transistor can be formed over the formation substrate at a temperature of 400° C. or lower. In that case, amorphous silicon, an oxide semiconductor, or the like can be used for the semiconductor layer, and mass production is possible with use of a conventional production line for amorphous silicon. In that case, an insulating layer and a transistor formed through a process at 400° C. or lower can be used. Furthermore, insulating layers having an excellent gas barrier property formed at a temperature of 400° C. or lower can be provided above and below the organic EL element. Accordingly, for example, the entry of impurities such as moisture into the organic EL element or the semiconductor layer can be suppressed, whereby a highly reliable light-emitting device can be obtained as compared with the case of using an organic resin or the like for the separation layer.

<Planar Shapes of Separation Layer>

The planar shape of the separation layer used in one embodiment of the present invention is not particularly limited. It is preferable that at a peeling process, force of separating the layer to be separated and the separation layer be concentrated at the peeling starting point; therefore, it is preferable to form the peeling starting point in the vicinity of the corner portion compared to the center portion or the side portion of the separation layer.

In the peeling method of one embodiment of the present invention, an end portion of a region that can be peeled and transferred is more on the inside than the end portion of the separation layer. As illustrated in FIG. 25C, an end portion of the layer 705 to be separated is preferably positioned on an inner side of the end portion of the separation layer 703. In the case where there are a plurality of layers 705 to be separated, the separation layer 703 may be provided in each layer 705 as illustrated in FIG. 25D or a plurality of layers 705 may be provided over one separation layer 703 as illustrated in FIG. 25E.

This embodiment can be combined with any of the other embodiments in this specification as appropriate.

Embodiment 2

In this embodiment, a peeling mechanism relating to the substrate peeling method of one embodiment of the present invention is described.

[Consideration of Peeling Area]

In the substrate peeling method of one embodiment of the present invention, peeling occurs in an oxide layer interposed between a separation layer and a layer to be separated. At this time, it is important, in examining the peeling mechanism, to examine in which of the following three areas a bond is most likely to be cut: an interface between the separation layer and the oxide layer, an interface between the oxide layer and the layer to be separated, and the inside of the oxide layer. The bond energy in each of the three areas was estimated to examine in which of the areas peeling is likely to be generated.

In this embodiment, the separation layer and the layer to be separated are assumed to be a tungsten (W) film and a silicon oxide ($SiO_2$) film, respectively. Furthermore, the oxide layer is assumed to be oxide containing $WO_3$, which is an oxide of hexavalent W.

Figure 4A:
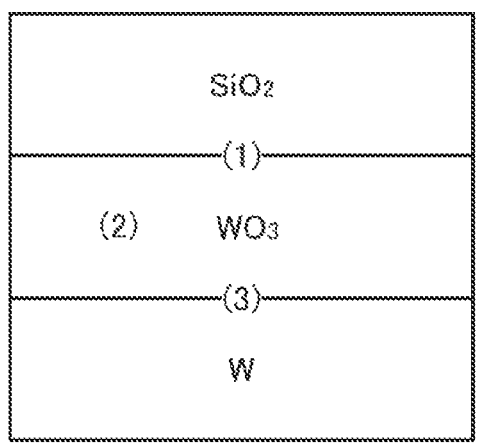
FIGS. 4A and 4B illustrate a model used for calculation.

FIG. 4A shows peeling areas used in calculation. In the structure shown in FIG. 4A, $WO_3$ is present between W and $SiO_2$.

In FIG. 4A, there can be three areas where the bond can be cut because of peeling: (1) $SiO_2/WO_3$ interface, (2) inside of $WO_3$, and (3) $WO_3/W$ interface. The bond energy of each area was calculated as described below.

Figure 4B:
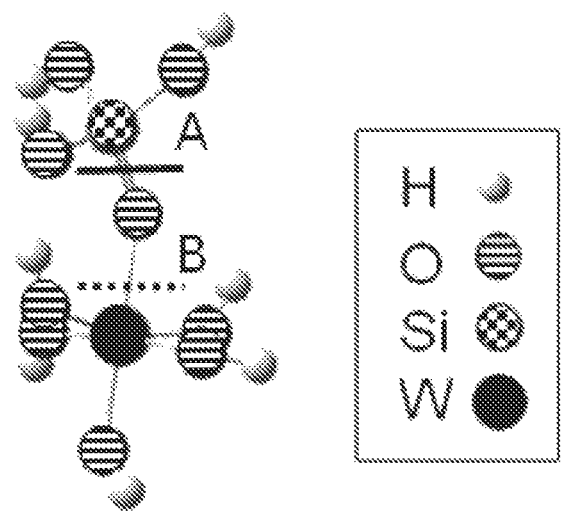

A cluster model was used as a calculation model. FIG. 4B shows an example of the cluster model. FIG. 4B shows a cluster model used for the calculation of the bond energy between $SiO_2$ and $WO_3$. In the cluster model shown in FIG. 4B, oxygen atoms bonded to Si and W are terminated with hydrogen (H) atoms. The bond energy of two areas, in the cluster model, of the Si atom side (A) and the W atom side (B), between which an oxygen (O) atom cross-linking between Si and W is interposed, is calculated.

For the calculation of the bond energy, structure optimization and vibration analysis were performed using density functional theory. As a functional, B3LYP was used. The electric charge was 0, and a singlet state, a doublet state, and a quintet state were considered for the spin multiplicities. In addition, LanL2DZ was adopted as a basis function for all atoms. Note that Gaussian 09 was used as the quantum chemistry computational program. A high performance computer (Altix 4700, manufactured by SGI Japan, Ltd.) was used for the calculations. The zero point correction was added to the calculated bond energy.

Note that in the cluster model, atoms other than the cross-linking O atom have a high degree of freedom of movement and are positioned to stabilize the energy. In fact, however, these atoms cannot move freely because of the adjacent atoms. Therefore, it needs to be noted that there might be a slight difference in energy value between the cluster model and an actual system because of their different degrees of freedom of movement.

Figure 5:
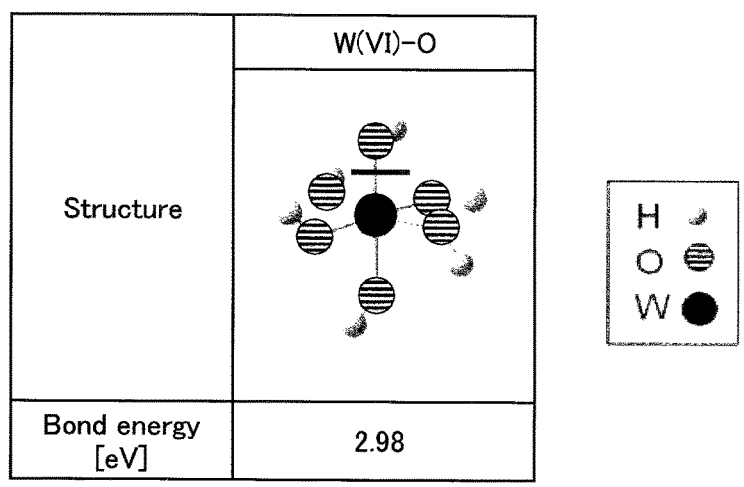
FIG. 5 shows a calculation result of bond energy.

FIG. 5 shows calculated bond energy between a W atom and an O atom in $WO_3$ having a hexavalent W atom. A cluster model in which a dangling bond of an O atom is terminated with an H atom is used in the following description unless otherwise specified.

According to FIG. 5, the bond energy of the W—O bond in the hexavalent W atom is 2.98 eV.

Figure 6:
FIG. 6 shows calculation results of bond energy.

FIG. 6 shows the bond energy calculated in consideration of the areas shown in FIG. 4A.

According to FIG. 6, the W—O bond (B) energy in (1) $SiO_2/WO_3$ interface is 3.73 eV, which is lower than the Si—O bond (A) energy. This indicates that the W—O bond is cut more easily than the Si—O bond and peeling occurs easily from the W—O bond side. When $WO_3$ is included, peeling tends to occur easily.

In the above calculation, an example of $WO_3$ is shown; however, the composition of tungsten oxide is not limited to this example. According to Non-Patent Document A (*Crystals and Crystal Structures*, Richard J. D. Tilley), very slight reduction to a composition of $WO_{2.9998}$ from $WO_3$ results in faults on {120} planes, and as the composition approaches $WO_{2.97}$, the faults tend to become ordered. It is known that tungsten oxide has a shear plane represented by $W_nO_{3n-1}$ (n is a natural number) ($WO_2$, $W_2O_5$, $W_3O_8$, $W_4O_{11}$, . . . , $W_{18}O_{53}$, . . . , $W_{30}O_{89}$, . . . ), which is a homologous series. When reduction is continued, faults lie on {130} planes, and tungsten oxide has a shear plane represented by $W_nO_{3n-2}$ ($W_{15}O_{46}$, $W_{16}O_{46}$, . . . , $W_{25}O_{73}$, . . . ), which is a homologous series. Thus, the tungsten oxide film preferably has a composition represented by $W_nO_{3n-1}$, $W_nO_{3n-2}$, or the like.

[Effect of N Atom]

As described above, the W—O bond, which is between $SiO_2$ and $WO_3$, is cut easily because of $WO_3$ at the time of peeling. In view of this, how the bond energy is affected by replacement of the O atom cross-linking between the two W atoms with an N atom is analyzed.

Here, the bond energy of a W—N bond at the time when an NH group is introduced instead of the O atom cross-linking between two W atoms was calculated.

Figure 7:
FIG. 7 shows calculation results of bond energy.

A cluster model in which one O atom is replaced with an NH group in $WO_3$ having a hexavalent W atom is shown in the upper part of FIG. 7. The W—O bond (B) energy and the W—N bond (A) energy of $WO_3$ were calculated.

According to FIG. 7, the bond energy (2.54 eV) of the W—N bond is lower than that (2.89 eV) of the W—O bond. In addition, the W—O bond energy is lower than that (2.98 eV) of the model in FIG. 5, in which an N atom is not introduced. Thus, it is indicated that not only the W—N bond but also the W—O bond is cut easily by introducing the N atom.

Next, the calculated W—N bond energy in a model (2)' in which an O atom cross-linking between the two W atoms is replaced with an NH group in a cluster model (2) assuming inside of $WO_3$ in the peeling areas shown in FIG. 4A is shown in the lower part of FIG. 7.

The bond energy (2.97 eV) in the case where the two W atoms are cross-linked by the NH group as shown in the model (2)' in FIG. 7 is lower than that (3.77 eV) in the case of the W—O bond as shown in the model (2) in FIG. 6.

The above results demonstrate that the bonds tend to be cut more easily by replacing the O atom cross-linking between the two W atoms with the N atom. This indicates that peeling occurs more easily by supplying nitrogen to the oxide layer.

Therefore, in order to improve peelability, it is important to supply a larger number of nitrogen atoms to the oxide layer.

In the substrate peeling method of one embodiment of the present invention, the first layer from which nitrogen is released by heating and the second layer over the first layer which has a function of suppressing the release of nitrogen to the outside (i.e., blocks the release of nitrogen) are provided as the layer to be separated provided over the oxide layer. In addition, a large amount of nitrogen released from the layer to be separated by heat treatment is supplied to the oxide layer, so that the oxide layer can contain a large amount of nitrogen. Consequently, peelability can be improved.

[Consideration of Improvement in Peelability at the Time of Water Injection]

As described in Embodiment 1, liquid containing water is added to a peeling interface at the time of peeling of the substrate and the liquid penetrates into the peeling interface, so that peelability is improved. The function of water in peeling is described below.

<Relationship Between Liquid Type and Peelability>

Examination was performed to check whether the force required for peeling varies depending on the type of liquid injected at the time of peeling, and examination results are described.

Figure 8:
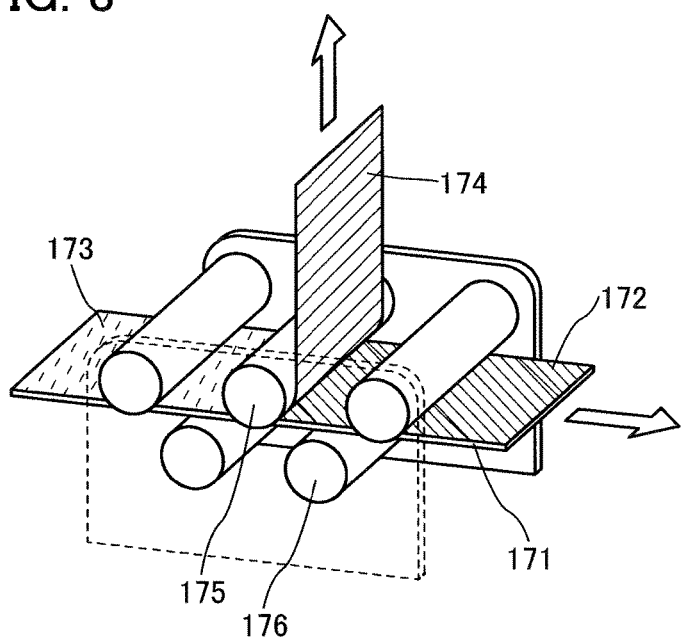
FIG. 8 illustrates a structural example of an apparatus used for a peeling test.

The force required for peeling was examined with a jig illustrated in FIG. 8. The jig illustrated in FIG. 8 includes a plurality of guide rollers 176 and a plurality of support rollers 175. A tape 173 is attached onto a layer 174 including a layer to be separated which is formed over the support substrate 171 and an end portion of the tape 173 is partly peeled from the substrate in advance. Then, the support substrate 171 is fixed to the jig so that the tape 173 is held by the support rollers 175, and the tape 173 and the layer 174 including the layer to be separated are positioned perpendicular to the support substrate 171. The force required for peeling can be measured as follows: when the tape 173 is pulled perpendicular to the support substrate 171 to peel the layer 174 including the layer to be separated from the support substrate 171, the force required for the pulling in the perpendicular direction is measured. During the peeling, the support substrate 171 moves in the plane direction along the guide rollers 176 with the separation layer 172 exposed. The support rollers 175 and the guide rollers 176 are rotatable so that the layer 174 including the layer to be separated and the support substrate 171 are not affected by friction during the move.

A sample used was manufactured as follows. First, an approximately 100-nm-thick silicon oxynitride film was formed over a glass substrate by a plasma CVD method, and then an approximately 50-nm-thick W film was formed as a separation layer by a sputtering method. After that, an approximately 600-nm-thick silicon oxynitride film was formed as a first layer and an approximately 50-nm-thick silicon nitride oxide film was formed as a second layer, and over the silicon nitride oxide film, an approximately 100-nm-thick silicon oxynitride film and an approximately 66-nm-thick silicon film were formed. After that, heat treatment was performed at 650° C. for 6 minutes. Next, the silicon film was irradiated with laser light to form polysilicon, and then a gate insulating film, a gate electrode, an interlayer insulating layer, a source and drain electrodes, and an interlayer insulating layer, an electrode, and the like are formed to manufacture a transistor. In a process after the heat treatment performed at 650° C. for 6 minutes, a step at temperatures of 650° C. or higher is not performed.

As described above, the sample in which the separation layer and the layer to be separated were provided over the glass substrate is manufactured.

Next, the support substrate was cut into a size of 20 mm×126.6 mm, and a UV film (UHP-0810MC produced by DENKI KAGAKU KOGYO KABUSHIKI KAISHA) was attached as the tape 173 to the cut support substrate by a tape mounter. After that, an approximately 20 mm of an end portion of the UV film was peeled from the substrate, and the sample was fixed to the jig.

For a peeling test, a compact table-top universal tester (EZ-TEST EZ-S-50N) manufactured by Shimadzu Corporation was used. For the peeling test, an adhesive tape/adhesive sheet testing method based on standard number JIS Z0237 of Japanese Industrial Standards (JIS) was employed. Note that a liquid was dripped into a portion that was a boundary between a portion where peeling proceeded from the substrate and a portion where peeling did not proceed after the sample was fixed to the jig.

Figure 9:
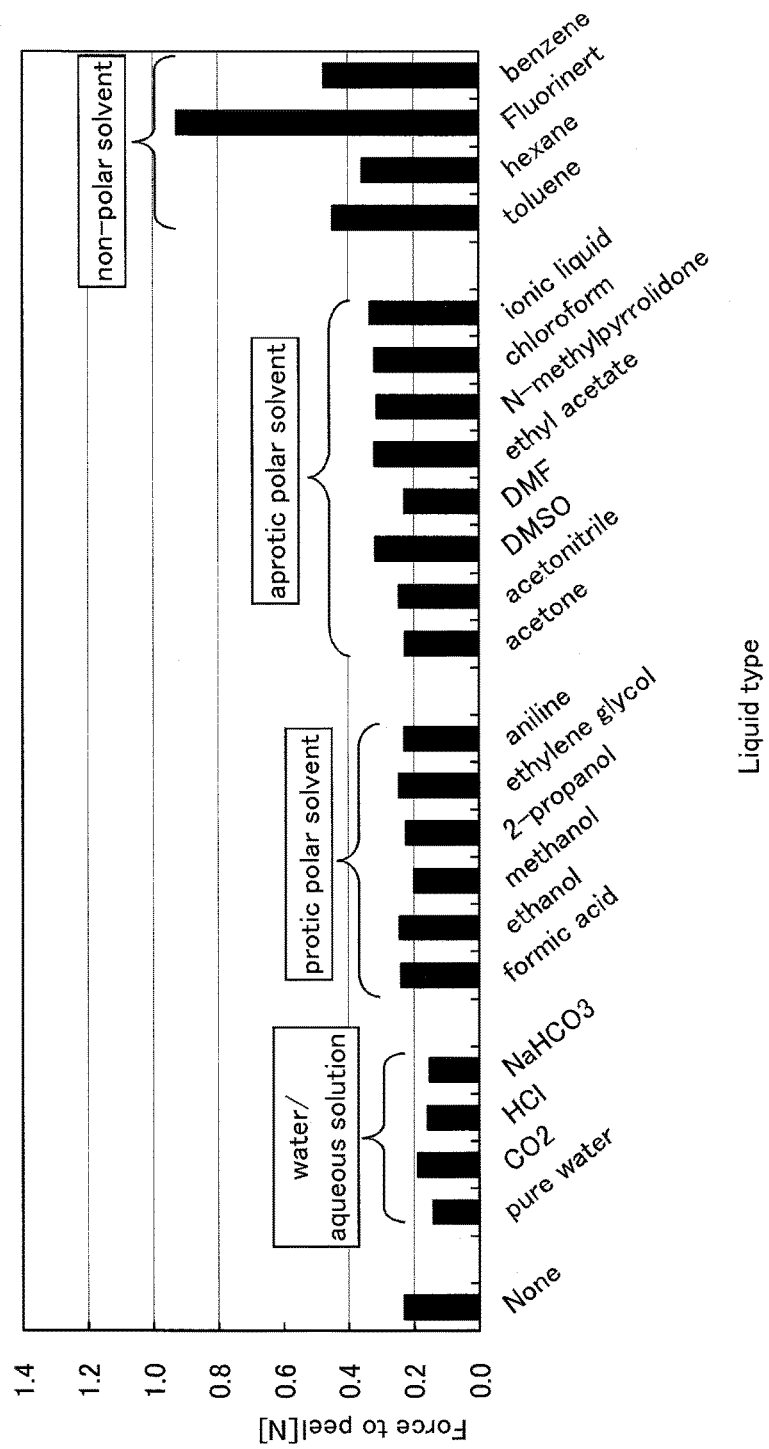
FIG. 9 shows a relationship between peelability and types of solutions used for peeling.

FIG. 9 shows the force required for peeling which was measured by changing the types of liquid supplied at the time of peeling.

The liquid used for the measurement is broadly classified into four types: water/aqueous solution, a protic polar solvent, an aprotic polar solvent, and a non-polar solvent. As the water/aqueous solution, pure water, a $CO_2$ aqueous solution, an HCl aqueous solution, and an $NaHCO_3$ aqueous solution were used. As the protic polar solvent, formic acid, ethanol, methanol, 2-propanol, ethylene glycol, and aniline were used. As the aprotic polar solvent, acetone, acetonitrile, DMSO, DMF, ethyl acetate. N-methylpyrrolidone, chloroform, and N-methyl-N-n-pentylpyrrolidinium bis(trifluoromethylsulfonyl)imide that is ionic liquid were used. As the non-polar solvent, toluene, hexane, Fluorinert™, and benzene were used. In addition, the force required for peeling without liquid injection was measured for comparison.

According to the results shown in FIG. 9, the force required for peeling in the case of using the water or the aqueous solution that is liquid containing water tends to be lower, that is, peelability tends to be higher than that in the case of not using liquid. On the other hand, the force required for peeling tends to increase in the order of the protic polar solvent, the aprotic polar solvent, and the non-polar solvent. In particular, the use of the non-polar solvent has an adverse effect on the peelability.

These results indicate that the presence of hydrogen ions is involved when peelability is improved by the injection of liquid to a peeling surface. The existence of hydrogen ions might work more effectively particularly when water or an aqueous system liquid is selected.

<Effect of Water Molecule>

Analysis results of the effect of a water molecule on peelability, which were obtained by examining a peeling process in the case where a water molecule was introduced, is described below.

As described above, the W—O bond energy might be higher than the W—N bond energy and peeling might be less likely to occur in the case where an N atom is not introduced as compared with the case where an N atom is introduced. Thus, calculation was performed focusing on the W—O bond energy in $WO_3$ which is higher than the W—N bond energy.

Figure 10A:
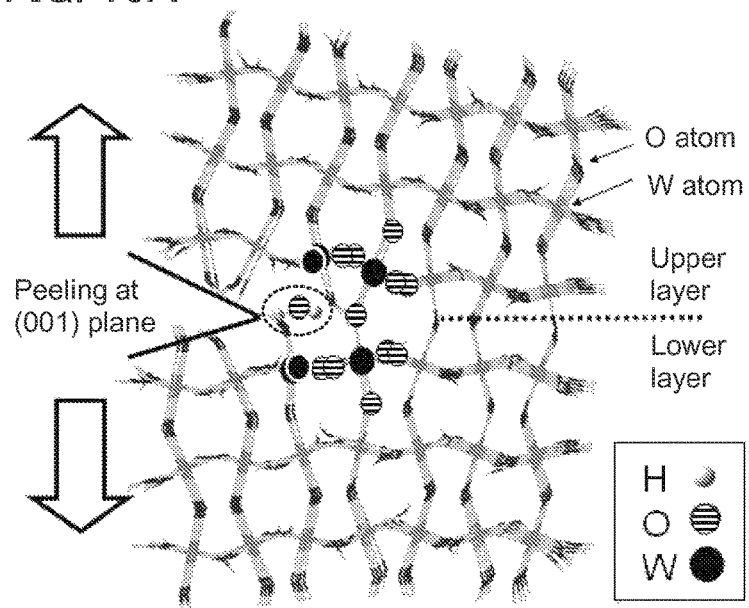
FIGS. 10A to 10C illustrate a model used for calculation.

FIG. 10A shows a model used for the calculation. Peeling occurs at a (001) plane in a $WO_3$ crystal structure. Here, a case is considered where peeling occurs at an O atom to which attention is paid and which cross-links between two W atoms and proceeds from the left side of FIG. 10A. On the left side of the O atom in FIG. 10A, there are separated upper and lower layers, while on the right side including the O atom in FIG. 10A, the upper and lower layers are connected. There are surfaces exposed by peeling on the upper left side and the lower left side in FIG. 10A. Here, a water molecule surrounded by a dashed line is positioned close to the O atom to which attention is paid.

Figure 10B:
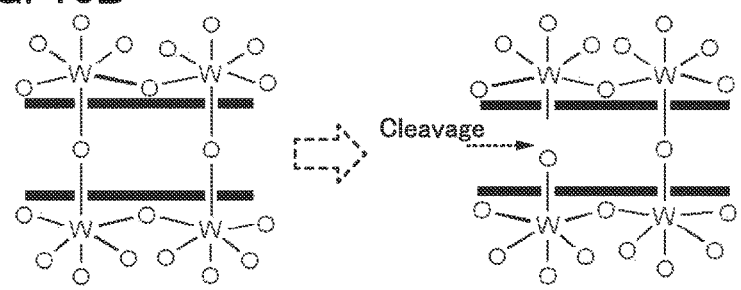
Figure 10C:
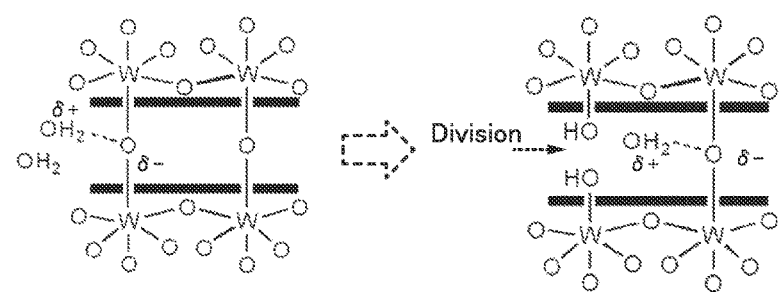

FIG. 10B shows a process of peeling the upper layer and the lower layer by physical force when water is not present in a position close to the O atom which cross-links between two W atoms. FIG. 10C shows a process of peeling the upper layer and the lower layer by physical force when water is present in a position close to the O atom which cross-links between two W atoms.

As shown in FIG. 10B, in the case where a water molecule is not present, the W—O bond in which an O atom cross-links between two W atoms is cleaved at the time of peeling. Although the W atoms and the O atom have dangling bonds after the cleavage, atoms terminating the dangling bonds do not exist.

In contrast, in the case where a water molecule is present as shown in FIG. 10C, the water molecule probably forms a hydrogen bond with an O atom cross-linking between two W atoms before peeling. By the formation of the hydrogen bond, the O atom cross-linking the two W atoms is more negatively charged than that at the time when a hydrogen bond is not formed, and one of the H atoms which is involved in the hydrogen bond is more positively charged than the other H atom. As a result, the O atom and the H atom electrostatically work on each other to cause a moderating effect, which might lead to a weak W—O bond. In addition, the W—O bond is cleaved with peeling and the W atom and the O atom have dangling bonds; however, the dangling bonds are probably terminated with an H group and an OH group derived from the water molecule. A steric effect of two OH groups occurs because of the termination, which might lead to a weak W—O bond which is to be cleaved.

As described above, as effects of the water molecule on peeling, the moderating effect due to the electrostatic interaction before peeling, the steric effect of the OH groups after peeling, and the like can be given. In the following description, the hypothesis that peeling occurs easily because of these effects is verified.

An ONIOM method that is one of the quantum mechanics/molecular mechanics methods was used for the calculation. For a QM region represented as circles in the calculation model in FIG. 10A, the density functional theory was used. B3LYP was used as a functional, and LanL2DZ was used as a basis function. For an MM region represented as poles, a universal force field was used as a force field. The electric charge was 0, and a singlet state was considered for spin multiplicities.

Figure 11A:
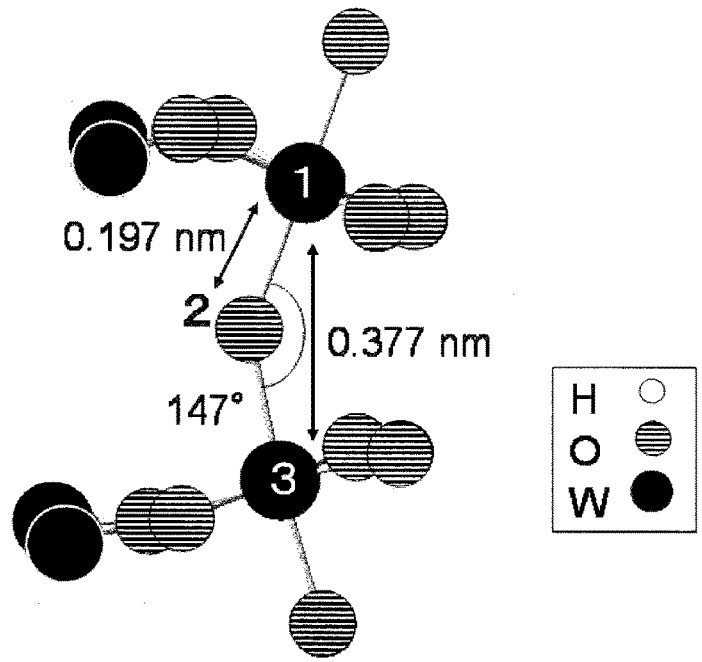
FIGS. 11A and 11B show calculation results of a structure in which an O atom cross-links between two W atoms.
Figure 11B:
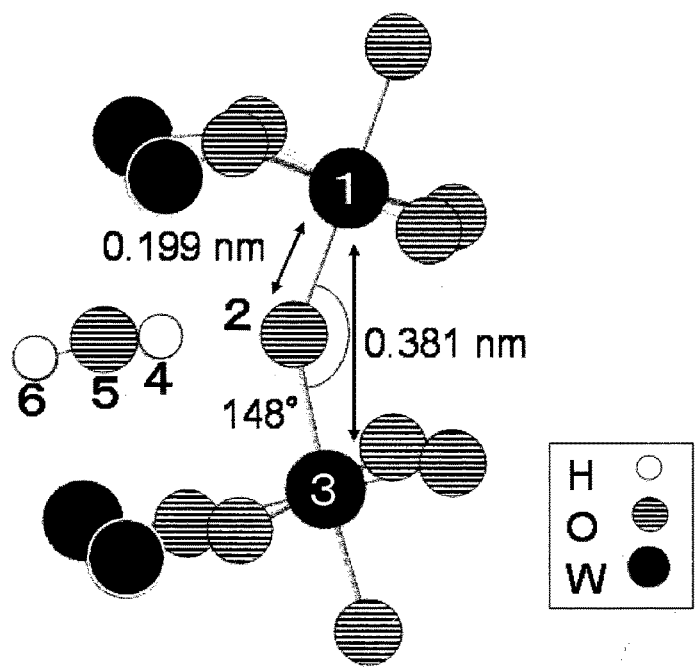

First, electric charge distributions and changes in structure at the time when a water molecule is present and when a water molecule is not present were analyzed. FIGS. 11A and 11B show structures in which an O atom cross-links between two W atoms at the time when a water molecule is not present and when a water molecule is present, respectively. Table 1 shows the electric charge (Mulliken charge) distribution in numbered atoms in FIGS. 11A and 11B.

TABLE 1

Electric Charge (Mulliken Charge) Distribution

| Atom | Without water molecule | With water molecule |
|---|---|---|
| 1W | 2.12 | 2.10 |
| 2O | −0.81 | −0.90 |
| 3W | 2.09 | 2.08 |
| 4H | — | 0.48 |
| 5O | — | −0.69 |
| 6H | — | 0.34 |

According to Table 1, in the structure in which an O atom cross-links between two W atoms before peeling, the charge of an O atom represented by 2 (hereinafter, 2O), which cross-links between the two W atoms, shifts in the negative direction because of the water molecule. This indicates that a hydrogen bond is formed between the water molecule and the O atom cross-linking between the two W atoms and an electron is attracted to the 2O atom. In addition, as for the bond length between a W atom represented by 1 (hereinafter, 1W) and 2O in the cross-linked structure, the bond length at the time when the water molecule is present is longer than that at the time when a water molecule is not present as shown in FIGS. 11A and 11B.

From the above results, it is presumed that an increase in the electron density of the hydrogen bond between a 4H atom in the water molecule and the 2O atom cross-linking between the two W atoms causes a decrease in the electron density of the 1W-2O bond, so that the 1W-2O bond is cut easily. The results indicate that the electrostatic interaction of the water molecule causes structure relaxation, so that peeling occurs easily.

In this embodiment, calculation was performed with an example in which peeling occurs easily because the water molecule forms a hydrogen bond with an O atom cross-linking between two W atoms; however, the peeling energy may be reduced by forming a hydrogen bond with a molecule other than the water molecule. Furthermore, the peeling energy may be reduced by interaction of the water molecule other than the hydrogen bond. Furthermore, the peeling energy may be reduced using a chemical bond other than the hydrogen bond.

Figure 12A:
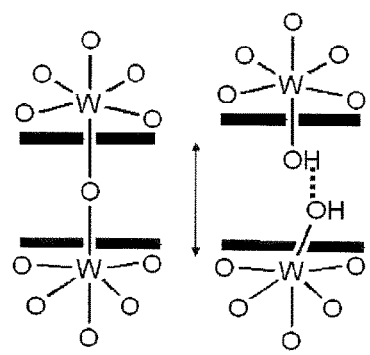
FIGS. 12A and 12B show a calculation result of a structure in which an O atom cross-links between two W atoms.

Next, the steric effect of OH groups was examined. Assuming that dangling bonds are terminated with an H group and an OH group from a water molecule, as shown in FIG. 12A, the distance between an upper and lower layers is estimated to be long because of the steric repulsion (i.e., steric effect) of the two OH groups of the case where the dangling bonds of the two W atoms are terminated with the two OH groups (the right drawing) as compared to the case where two W atoms are cross-linked with an O atom (the left drawing).

Figure 12B:
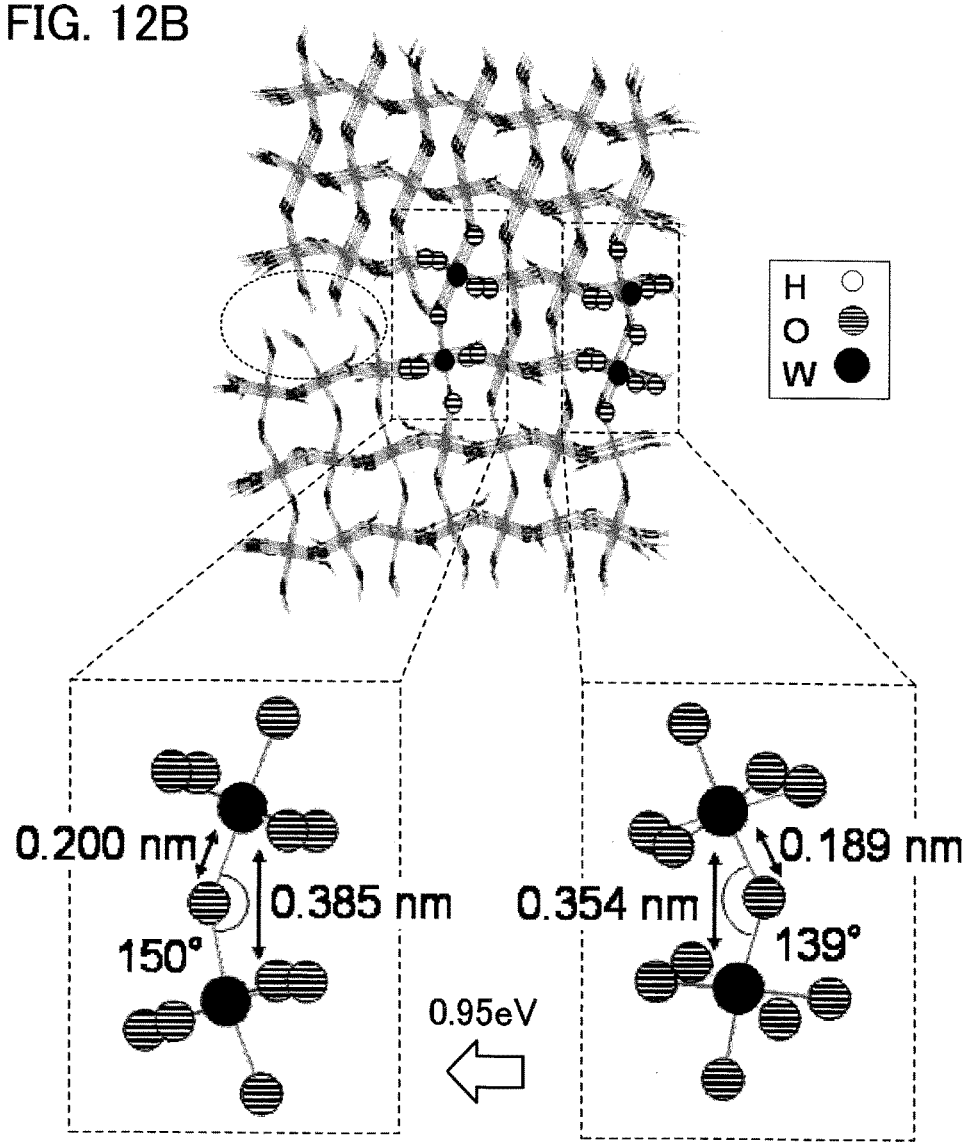

FIG. 12B shows an analyzed structure and an energy change. A region surrounded by an ellipse in FIG. 12B has steric effects of two OH groups. In the bottom part of FIG. 12B, enlarged structures in which two W atoms are cross-linked with an O atom in an area adjacent to the region with the steric effects and an area sufficiently away from the region are shown.

A comparison between the cross-linked structures of the two areas reveals that the steric effect of the two OH groups increases both the W—W bond length by approximately 0.031 nm and the W—O bond length by approximately 0.011 nm. This means that the W—O bond is weak and is cut easily. In addition, in the cross-linked structure in the area adjacent to the region with the steric effects, an upper and lower layers are extended in the opposite directions because of the steric effects, so that the energy is activated by approximately 0.95 eV; thus, the W—O bond is cleaved easily.

The above results indicate that peeling occurs easily because of the steric effects of the OH groups which are caused when the dangling bonds are terminated with the OH groups.

Next, the energy diagrams in the case where the dangling bonds are not terminated with the OH groups and in the case where the dangling bonds are terminated with the OH groups were examined. Here, a peeling process of tungsten oxide by physical force in the absence of a water molecule was considered. A reaction path and an energy diagram which were analyzed are shown in FIG. 13.

Figure 13:
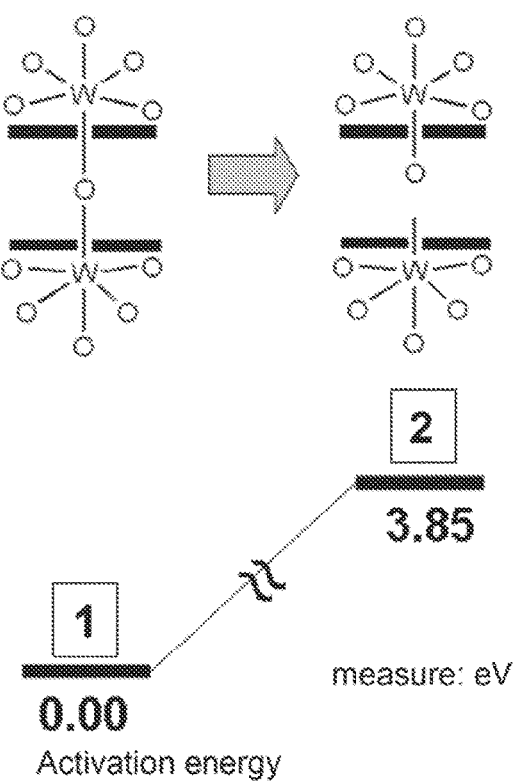
FIG. 13 shows a calculation result of an energy diagram.

As the reaction path, a process in FIG. 13 in which a reaction proceeds from State 1 to State 2 was considered. In State 1, an O atom cross-links between two W atoms. In State 2, the W—O bond has been cleaved and one W atom and one O atom each include one dangling bond.

Next, the hypothesis that the dangling bonds are terminated with the OH groups was examined. Here, in the presence of the water molecule, how hydrolysis of a water molecule occurs in a peeling process of tungsten oxide by physical force was considered. A reaction path and an energy diagram which were analyzed are shown in FIG. 14.

As the reaction path, a process in FIG. 14 in which a reaction proceeds from State 1 to State 3 through State 2 was considered. In State 1, an O atom cross-linking between two W atoms and a water molecule have a weak interaction. State 2 is a transition state in which the O atom in the water molecule forms a bond with the W atom and an H atom derived from the water molecule moves close to the O atom cross-linking between two W atoms. In State 3, the W—O bond has been cleaved and two dangling bonds are terminated with two OH groups.

In the energy diagram shown in the bottom part of FIG. 14, State 1 is used as a reference. In State 2, which is the transition state in which the peeling and termination with the two OH groups occur at the same time, the activation energy is 2.28 eV. This activation energy is lower than the activation energy (3.61 eV) in the case where a water molecule is not present as shown in FIG. 13; this indicates that peeling occurs easily because of the water molecule.

In State 3 after the transition, the relative energy from State 1 is 2.06 eV, which means that State 3 is not as stable as State 1. This is probably because of a steric effect of the two OH groups.

The above results reveal that performing peeling and termination of dangling bonds with two OH groups at the same time is advantageous in terms of energy. Peelability is improved in a peeling process probably because of the above-described function of the water molecule.

This embodiment can be implemented in an appropriate combination with any of the other embodiments described in this specification.

Embodiment 3

In this embodiment, examples of flexible light-emitting devices which can be manufactured using the peeling apparatus of one embodiment of the present invention or the peeling method of one embodiment of the present invention will be described.

Specific Example 1

Figure 15A:
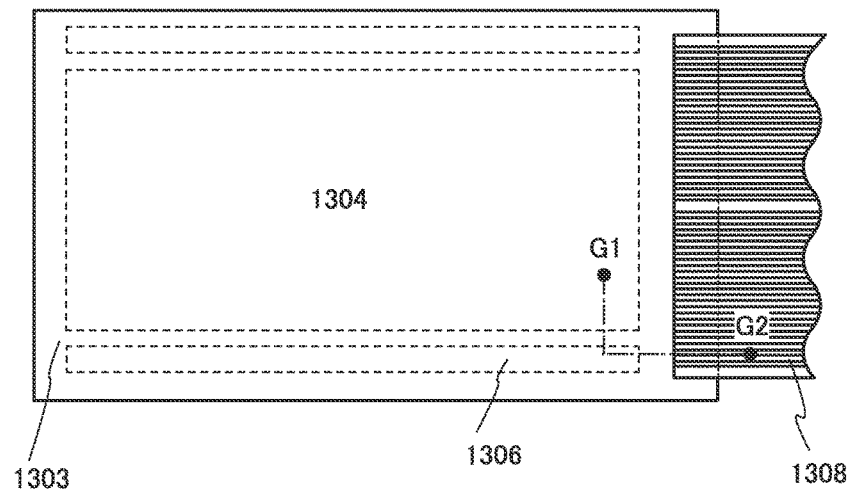
FIGS. 15A and 15B illustrate an example of a light-emitting device.
Figure 15B:
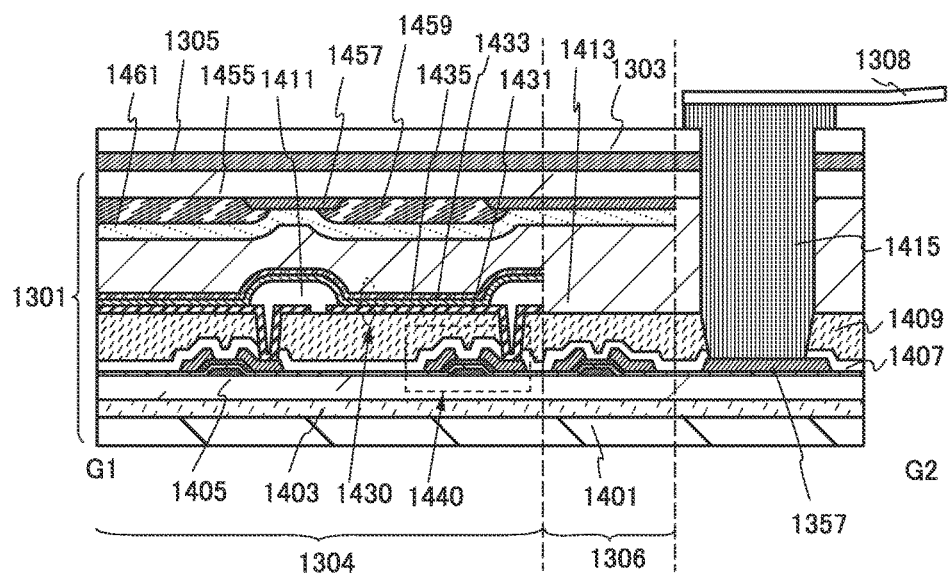
Figure 16A:
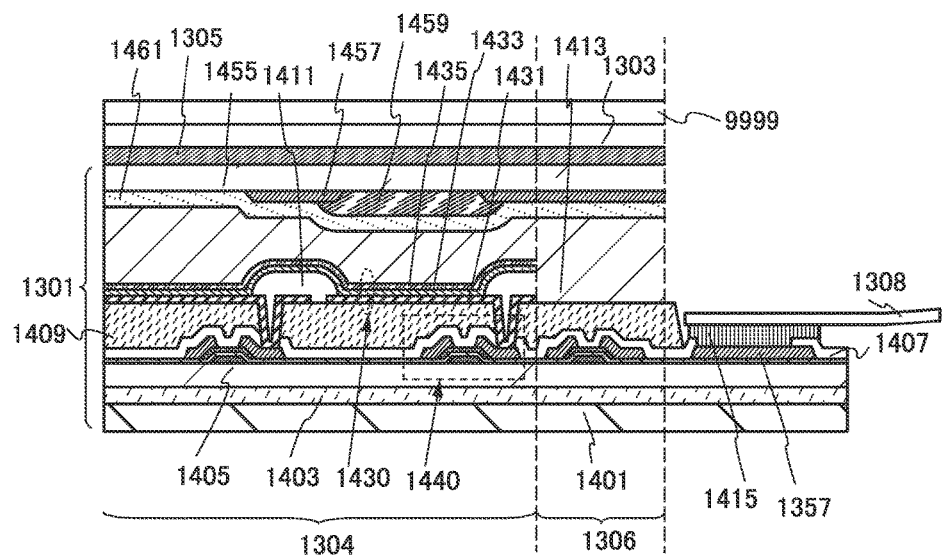
FIGS. 16A and 16B each illustrate an example of a light-emitting device.
Figure 16B:
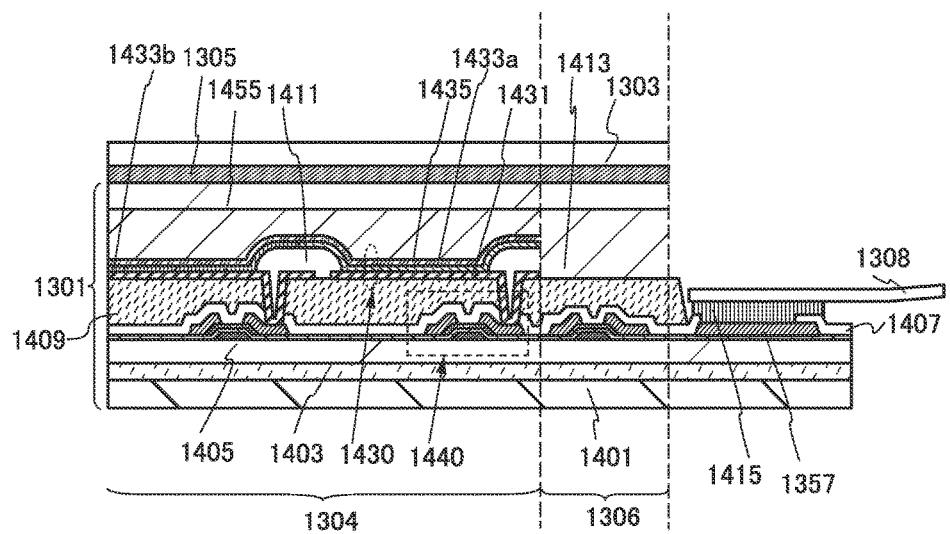

FIG. 15A is a plan view of a flexible light-emitting device, and FIG. 15B is an example of a cross-sectional view taken along dashed-dotted line G1-G2 in FIG. 15A. FIGS. 16A and 16B are each a cross-sectional view illustrating a flexible light-emitting device, which is a modification example.

The light-emitting device illustrated in FIG. 15B. FIG. 16A, or FIG. 16B includes an element layer 1301, an adhesive layer 1305, and a substrate 1303. The element layer 1301 includes a substrate 1401, an adhesive layer 1403, an insulating layer 1405, a plurality of transistors, a conductive layer 1357, an insulating layer 1407, an insulating layer 1409, a plurality of light-emitting elements, an insulating layer 1411, a sealing layer 1413, and an insulating layer 1455.

In FIG. 15B, coloring layers 1459 are provided so as to overlap with their respective light-emitting elements. The coloring layer 1459 is provided to overlap with a light-emitting element 1430, and a light-blocking layer 1457 is provided to overlap with the insulating layer 1411. The coloring layer 1459 and the light-blocking layer 1457 are covered with an insulating layer 1461. The space between the light-emitting element 1430 and the insulating layer 1461 is filled with the sealing layer 1413.

In FIG. 16A, the coloring layers 1459 are provided so as to overlap with some light-emitting elements. In FIG. 16B, the coloring layers 1459 are not provided. The light-emitting element 1430 which does not overlap with the coloring layer 1459 may be provided as illustrated in FIGS. 16A and 16B. For example, in the case where one pixel includes four sub-pixels which are red, blue, green, and white sub-pixels, the coloring layer 1459 does not need to be provided in the white sub-pixel. Accordingly, the amount of light absorbed by the coloring layer can be reduced, and thus, the power consumption of the light-emitting device can be reduced. As illustrated in FIG. 16B, with the use of different materials for an EL layer 1433a and an EL layer 1433b, light-emitting elements exhibiting different colors may be manufactured in pixels.

The conductive layer 1357 is electrically connected to an FPC 1308 through a connector 1415. In the case where the conductive layer 1357 is provided between the substrates 1401 and 1303 as illustrated in FIG. 15B, the connector 1415 may be provided in an opening formed in the substrate 1303, the adhesive layer 1305, and the like. In the case where the substrate 1303 and the conductive layer 1357 do not overlap with each other as illustrated in FIGS. 16A and 16B, the connector 1415 may be provided in an opening formed in the insulating layers 1407 and 1409 over the substrate 1401.

The light-emitting element 1430 includes a lower electrode 1431, an EL layer 1433, and an upper electrode 1435. The lower electrode 1431 is electrically connected to a source electrode or a drain electrode of a transistor 1440. An end portion of the lower electrode 1431 is covered with the insulating layer 1411. The light-emitting element 1430 has a top emission structure. The upper electrode 1435 has a light-transmitting property and transmits light emitted from the EL layer 1433.

The light-emitting device includes a plurality of transistors in a light extraction portion 1304 and a driver circuit portion 1306. The transistor 1440 is provided over the insulating layer 1405. The insulating layer 1405 and the substrate 1401 are bonded to each other with the bonding layer 1403. The insulating layer 1455 and the substrate 1303 are bonded to each other with the bonding layer 1305. It is preferable to use insulating films having a high gas barrier property for the insulating layer 1405 and the insulating layer 1455, in which case an impurity such as moisture or oxygen can be prevented from entering the light-emitting element 1430 or the transistor 1440, leading to improved reliability of the light-emitting device.

The light-emitting device in Specific Example 1 can be manufactured in the following manner: the insulating layer 1405, the transistor 1440, and the light-emitting element 1430 are formed over a formation substrate with high heat resistance; the formation substrate is separated; and the insulating layer 1405, the transistor 1440, and the light-emitting element 1430 are transferred to the substrate 1401 and bonded thereto with the bonding layer 1403. The light-emitting device in Specific Example 1 can be manufactured in the following manner: the insulating layer 1455, the coloring layer 1459, and the light-blocking layer 1457 are formed over a formation substrate with high heat resistance; the formation substrate is separated; and the insulating layer 1455, the coloring layer 1459, and the light-blocking layer 1457 are transferred to the substrate 1303 and bonded thereto with the bonding layer 1305.

In the case where a material with high moisture permeability and low heat resistance (e.g., resin) is used for a substrate, it is not allowed to expose the substrate to high temperatures in the manufacturing process. Thus, there is a limitation on conditions for forming a transistor and an insulating film over the substrate. In a manufacturing method employing the device of one embodiment of the present invention, a transistor and the like can be formed over a formation substrate having high heat resistance; thus, a highly reliable transistor and an insulating film having a sufficiently high gas barrier property can be formed. Then, the transistor and the insulating film are transferred to the substrate 1303 or the substrate 1401, whereby a highly reliable light-emitting device can be manufactured. Thus, with one embodiment of the present invention, a thin and/or lightweight light-emitting device with high reliability can be provided. Details of the manufacturing method will be described later.

The substrate 1303 and the substrate 1401 are each preferably formed using a material with high toughness. In that case, a display device with high impact resistance that is less likely to be broken can be provided. For example, when the substrate 1303 is an organic resin substrate and the substrate 1401 is a substrate of a thin metal material or a thin alloy material, the light-emitting device can be lightweight and unlikely to be broken as compared with the case where a glass substrate is used.

A metal material and an alloy material, which have high thermal conductivity, are preferred because they can easily conduct heat to the whole substrate and accordingly can prevent a local temperature rise in the light-emitting device. The thickness of a substrate using a metal material or an alloy material is preferably greater than or equal to 10 μm and less than or equal to 200 μm, further preferably greater than or equal to 20 μm and less than or equal to 50 μm.

Furthermore, when a material with high thermal emissivity is used for the substrate 1401, the surface temperature of the light-emitting device can be prevented from rising, leading to prevention of breakage or a decrease in reliability of the light-emitting device. For example, the substrate 1401 may have a stacked structure of a metal substrate and a layer with high thermal emissivity (the layer can be formed using a metal oxide or a ceramic material, for example).

Note that the light-emitting device of this embodiment may be provided with a touch sensor or a touch panel. For example, FIG. 16A illustrates the case where a touch panel 9999 is provided. A touch sensor may be directly formed on the substrate 1303; alternatively, the touch panel 9999 formed on another substrate may be placed over the substrate 1303.

Specific Example 2

Figure 17A:
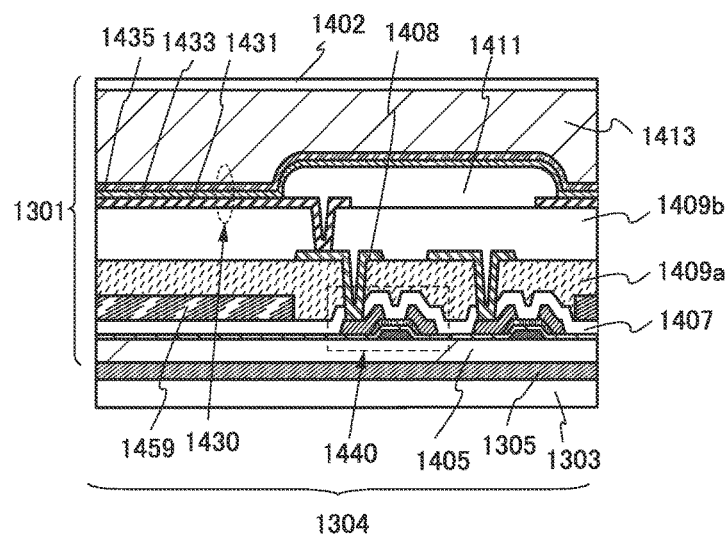
FIGS. 17A and 17B each illustrate an example of a light-emitting device.

FIG. 17A illustrates another example of the light extraction portion 1304 in the light-emitting device.

The light extraction portion 1304 illustrated in FIG. 17A includes the substrate 1303, the adhesive layer 1305, a substrate 1402, the insulating layer 1405, a plurality of transistors, the insulating layer 1407, a conductive layer 1408, an insulating layer 1409a, an insulating layer 1409b, a plurality of light-emitting elements, the insulating layer 1411, the sealing layer 1413, and the coloring layer 1459.

The light-emitting element 1430 includes the lower electrode 1431, the EL layer 1433, and the upper electrode 1435. The lower electrode 1431 is electrically connected to the source electrode or the drain electrode of the transistor 1440 through the conductive layer 1408. An end portion of the lower electrode 1431 is covered with the insulating layer 1411. The light-emitting element 1430 has a bottom emission structure. The lower electrode 1431 has a light-transmitting property and transmits light emitted from the EL layer 1433.

The coloring layer 1459 is provided to overlap with the light-emitting element 1430, and light emitted from the light-emitting element 1430 is extracted from the substrate 1303 side through the coloring layer 1459. The space between the light-emitting element 1430 and the substrate 1402 is filled with the sealing layer 1413. The substrate 1402 can be formed using a material similar to that of the substrate 1401.

Specific Example 3

Figure 17B:
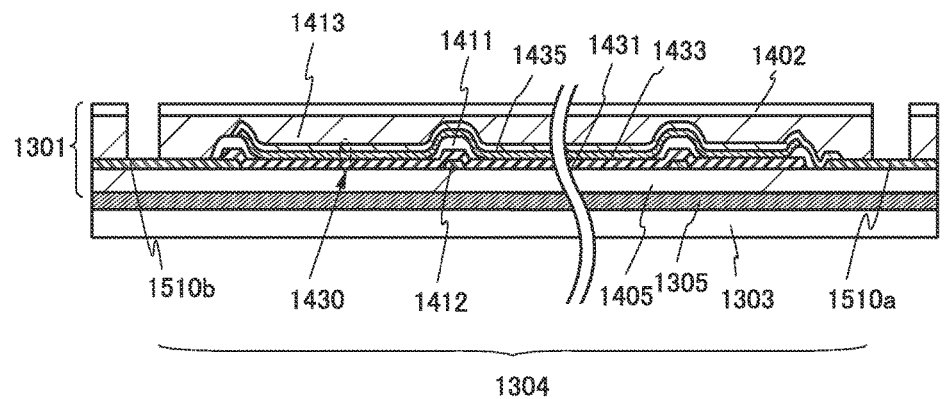

FIG. 17B illustrates another example of a light-emitting device.

The light-emitting device illustrated in FIG. 17B includes the element layer 1301, the adhesive bonding layer 1305, and the substrate 1303. The element layer 1301 includes the substrate 1402, the insulating layer 1405, a conductive layer 1510a, a conductive layer 1510b, a plurality of light-emitting elements, the insulating layer 1411, a conductive layer 1412, and the sealing layer 1413.

The conductive layer 1510a and the conductive layer 1510b, which are external connection electrodes of the light-emitting device, can each be electrically connected to an FPC or the like.

The light-emitting element 1430 includes the lower electrode 1431, the EL layer 1433, and the upper electrode 1435. An end portion of the lower electrode 1431 is covered with the insulating layer 1411. The light-emitting element 1430 has a bottom emission structure. The lower electrode 1431 has a light-transmitting property and transmits light emitted from the EL layer 1433. The conductive layer 1412 is electrically connected to the lower electrode 1431.

The substrate 1303 may have, as a light extraction structure, a hemispherical lens, a micro lens array, a film provided with an uneven surface structure, a light diffusing film, or the like. For example, the light extraction structure can be formed by bonding the above lens or film to a resin substrate with an adhesive or the like having substantially the same refractive index as the substrate or the lens or film.

The conductive layer 1412 is preferably, though not necessarily, provided because voltage drop due to the resistance of the lower electrode 1431 can be prevented. In addition, for a similar purpose, a conductive layer electrically connected to the upper electrode 1435 may be provided over the insulating layer 1411.

The conductive layer 1412 can be a single layer or a stacked layer formed using a material selected from copper, titanium, tantalum, tungsten, molybdenum, chromium, neodymium, scandium, nickel, or aluminum or an alloy material containing any of these materials as its main component. The thickness of the conductive layer 1412 can be greater than or equal to 0.1 μm and less than or equal to 3 μm, preferably greater than or equal to 0.1 μm and less than or equal to 0.5 μm.

When a paste (e.g., silver paste) is used as a material for the conductive layer (also referred to as an auxiliary wiring or an auxiliary electrode) electrically connected to the upper electrode 1435, metal particles forming the conductive layer aggregate; therefore, the surface of the conductive layer is rough and has many gaps. Thus, it is difficult for the EL layer 1433 to completely cover the conductive layer; accordingly, the upper electrode and the auxiliary wiring are electrically connected to each other easily, which is preferable.

Examples of Materials

Next, materials and the like that can be used for a light-emitting device are described. Note that description on the components already described in this embodiment is omitted.

The element layer 1301 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1301 may further include a transistor for driving the light-emitting element, a touch sensor, or the like.

There is no particular limitation on the structure of the transistors in the light-emitting device. For example, a forward staggered transistor or an inverted staggered transistor may be used. A top-gate transistor or a bottom-gate transistor may be used. A semiconductor material used for the transistors is not particularly limited, and for example, silicon, germanium, or an oxide semiconductor can be used. Furthermore, the transistor is not limited to a transistor having a single-gate structure; a multi-gate transistor having a plurality of channel formation regions, such as a double-gate transistor may be used.

There is no particular limitation on the state of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is particularly preferable that a semiconductor having crystallinity be used, in which case deterioration of the transistor characteristics can be suppressed.

Here, a polycrystalline semiconductor is preferably used for the transistor. For example, polycrystalline silicon or the like is preferably used. Polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

Alternatively, an oxide semiconductor is preferably used for the transistor. For example, an oxide semiconductor having a wider band gap than silicon is preferably used. A semiconductor material having a wider band gap and a lower carrier density than silicon is preferably used because off-state current of the transistor can be reduced.

The oxide semiconductor preferably contains at least indium (In) or zinc (Zn), for example. More preferably, the oxide semiconductor contains an oxide represented by an In-M-Zn-based oxide (M is a metal such as Al, Ti, Ga, Ge, Y, Zr, Sn, La, Ce, or Hf).

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like. The CAAC-OS film is one of oxide semiconductor films having a plurality of c-axis aligned crystal parts. Note that a CAAC-OS can be referred to as an oxide semiconductor including c-axis aligned nanocrystals (CANC).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary. There is no grain boundary in such an oxide semiconductor, therefore, generation of a crack in an oxide semiconductor film which is caused by stress when a flexible device formed using one embodiment of the present invention is bent is prevented. Therefore, such an oxide semiconductor can be preferably used for a flexible device (e.g., a display device) which is used in a bent state, or the like.

The use of such materials for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, a driver circuit can be stopped while the luminance of an image displayed on each display region is maintained. As a result, an electronic device with extremely low power consumption can be obtained.

The light-emitting element included in the light-emitting device includes a pair of electrodes (the lower electrode 1431 and the upper electrode 1435), and the EL layer 1433 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Further, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 1431 and the upper electrode 1435, holes are injected to the EL layer 1433 from the anode side and electrons are injected to the EL layer 1433 from the cathode side. The injected electrons and holes are recombined in the EL layer 1433 and a light-emitting substance contained in the EL layer 1433 emits light.

The EL layer 1433 includes at least a light-emitting layer. In addition to the light-emitting layer, the EL layer 1433 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 1433, either a low molecular compound or a high molecular compound can be used, and an inorganic compound may also be used. Each of the layers included in the EL layer 1433 can be formed by any of the following methods: an evaporation method (including a vacuum evaporation method), a transfer method, a printing method, an inkjet method, a coating method, and the like.

In the element layer 1301, the light-emitting element is preferably provided between a pair of insulating films having high gas barrier properties. In that case, an impurity such as water can be prevented from entering the light-emitting element, leading to prevention of a decrease in the reliability of the light-emitting device.

As an insulating film having a high gas barrier property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film having a high gas barrier property is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-6}$ [g/m$^2$·day].

The substrate 1303 has a light-transmitting property and transmits at least light emitted from the light-emitting element included in the element layer 1301. The substrate 1303 has flexibility. The refractive index of the substrate 1303 is higher than that of the air.

An organic resin, which is lighter than glass, is preferably used for the substrate 1303, in which case the light-emitting device can be lightweight as compared with the case where glass is used.

Examples of materials that are flexible and transmits visible light include glass that is thin enough to have flexibility and a resin film. Examples of the resin film include polyester resins such as polyethylene terephthalate (PET) and polyethylene naphthalate (PEN), a polyacrylonitrile resin, a polyimide (PI) resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, nylon, polyetheretherketone (PEEK), polysulfone (PSF), polyetherimide (PEI), polyarylate (PAR), polybutylene terephthalate (PBT), and a silicone resin. In particular, a material whose thermal expansion coefficient is low is preferred, and for example, an aramid resin, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. The resin film includes a fiber or the like (e.g., a prepreg). Furthermore, a base is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

The substrate 1303 may have a stacked structure of a layer of any of the above-mentioned materials and a hard coat layer (e.g., a silicon nitride layer) which protects a surface of the light-emitting device from damage or the like, a layer (e.g., an aramid resin layer) which can disperse pressure, or the like. Furthermore, to suppress a decrease in the lifetime of the light-emitting element due to moisture and the like, the insulating film having a high gas barrier property may be provided.

The bonding layer 1305 has a light-transmitting property and transmits at least light emitted from the light-emitting element included in the element layer 1301. The refractive index of the bonding layer 1305 is higher than that of the air.

For the bonding layer 1305, a curable resin that is curable at room temperature (e.g., a two-component-mixture-type resin), a light curable resin, a heat curable resin, or the like can be used. Examples include an epoxy resin, an acrylic resin, a silicone resin, a phenol resin, and the like. In particular, a material with low moisture permeability, such as an epoxy resin, is preferred.

Furthermore, the resin may contain a drying agent. A material for the drying agent is similar to the material that can be used for the bonding layer 707 and the frame-like bonding layer 711.

In addition, it is preferable to mix a filler with a high refractive index (e.g., titanium oxide) into the resin, in which case the efficiency of light extraction from the light-emitting element can be improved.

The bonding layer 1305 may also include a scattering member for scattering light. For example, the bonding layer 1305 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, a silicone resin, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

A material similar to that of the bonding layer 1305 can be used for the bonding layer 1403. In the case where the bonding layer 1403 is provided on the side where light emitted from the light-emitting element is not extracted, there is no limitation on the light-transmitting property or the refractive index of the bonding layer 1403.

The insulating layer 1405 and the insulating layer 1455 can each be formed using an inorganic insulating material. It is particularly preferable to use the insulating film having a high gas barrier property, in which case a highly reliable light-emitting device can be provided.

The insulating layer 1407 has an effect of preventing diffusion of impurities into a semiconductor included in the transistor. As the insulating layer 1407, an inorganic insulating film such as a silicon oxide film, a silicon oxynitride film, or an aluminum oxide film can be used.

As each of the insulating layers 1409, 1409a, and 1409b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that a plurality of any of insulating films formed of these materials and inorganic insulating films may be stacked.

The insulating layer 1411 is provided to cover an end portion of the lower electrode 1431. In order that the insulating layer 1411 be favorably covered with the EL layer 1433 and the upper electrode 1435 formed thereover, a side wall of the insulating layer 1411 preferably has a tilted surface with continuous curvature.

As a material for the insulating layer 1411, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 1411.

There is no particular limitation on the method for forming the insulating layer 1411; a photolithography method, a sputtering method, an evaporation method, a droplet discharging method (e.g., an inkjet method), a printing method (e.g., a screen printing method or an off-set printing method), or the like may be used.

For the sealing layer 1413, a curable resin that is curable at room temperature (e.g., a two-component-mixture-type resin), a light curable resin, a heat curable resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. The sealing layer 1413 may include a drying agent. In the case where light emitted from the light-emitting element 1430 is extracted outside through the sealing layer 1413, the sealing layer 1413 preferably includes a filler with a high refractive index or a scattering member. Materials for the drying agent, the filler with a high refractive index, and the scattering member are similar to those that can be used for the bonding layer 1305.

The conductive layer 1357 can be formed using the same material and the same step as a conductive layer included in the transistor or the light-emitting element. For example, the conductive layer can be formed to have a single-layer structure or a stacked-layer structure using any of metal materials such as molybdenum, titanium, chromium, tantalum, tungsten, aluminum, copper, neodymium, and scandium, and an alloy material containing any of these elements. The conductive layer may be formed using a conductive metal oxide. As the conductive metal oxide, indium oxide (e.g., $In_2O_3$), tin oxide (e.g., $SnO_2$), zinc oxide (ZnO), indium tin oxide (ITO), indium zinc oxide (e.g., $In_2O_3$—ZnO), or any of these metal oxide materials in which silicon oxide is contained can be used.

Each of the conductive layers 1408, 1412, 1510a, and 1510b can also be formed using any of the above metal materials, alloy materials, and conductive metal oxides.

For the connector 1415, it is possible to use a paste-like or sheet-like material which is obtained by mixture of metal particles and a heat-curable resin and for which anisotropic electric conductivity is provided by thermocompression bonding. As the metal particles, particles in which two or more kinds of metals are layered, for example, nickel particles coated with gold, are preferably used.

The coloring layer 1459 is a coloring layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 1457 is provided between the adjacent coloring layers 1459. The light-blocking layer 1457 blocks light emitted from the adjacent light-emitting element, thereby preventing color mixture between adjacent pixels. Here, the coloring layer 1459 is provided such that its end portion overlaps with the light-blocking layer 1457, whereby light leakage can be prevented. The light-blocking layer 1457 can be formed using a material that blocks light emitted from the light-emitting element, for example, a metal material, a resin material including a pigment or a dye, or the like. Note that as illustrated in FIG. 15B, the light-blocking layer 1457 is preferably provided also in a region other than the light extraction portion 1304, such as the driver circuit portion 1306, in which case undesired leakage of guided light or the like can be prevented.

The insulating layer 1461 covering the coloring layer 1459 and the light-blocking layer 1457 is preferably provided because it can prevent an impurity such as a pigment included in the coloring layer 1459 or the light-blocking layer 1457 from diffusing into the light-emitting element or the like. For the insulating layer 1461, a light-transmitting material is used, and an inorganic insulating material or an organic insulating material can be used. The insulating film having a high gas barrier property may be used for the insulating layer 1461.

This embodiment can be combined with any of the other embodiments in this specification as appropriate.

Embodiment 4

In this embodiment, a peeling apparatus of one embodiment of the present invention will be described.

One embodiment of the present invention is a peeling apparatus including a structure body which can hold a first member of a process member and a stage which can hold a second member of the process member. The first member is wound to separate the first member and the second member of the process member between the structure body and the stage from each other. Here, as examples of the first member, the layer to be separated described in Embodiment 1, a layer including the layer to be separated, and a stacked-layer structure including the layer to be separated are given. Furthermore, as examples of the second member, the formation substrate described in Embodiment 1, the separation layer described in Embodiment 1, a layer including the formation substrate, a layer including the separation layer, a stacked-layer structure including the formation substrate, and a stacked-layer structure including the separation layer are given.

With the use of the peeling apparatus of one embodiment of the present invention, the first member and the second member of the process member can be separated from each other with a high yield. The peeling apparatus of one embodiment of the present invention does not require a complicated structure and can be used for the peeling of process members with a variety of sizes.

Another embodiment of the present invention is a peeling apparatus including a structure body, a stage, a liquid supplying mechanism, a first temperature adjustment mechanism, and a second temperature adjustment mechanism. The structure body has a function of holding a first member of a process member, the stage has a function of holding a second member of the process member, the first temperature adjustment mechanism has a function of adjusting the temperature of the structure body, the second temperature adjustment mechanism has a function of adjusting the temperature of the stage, and the liquid supplying mechanism has a function of supplying liquid to a separation surface of the first member and the second member. The first member is wound to separate the first member and the second member of the process member between the structure body and the stage from each other.

In one embodiment of the present invention, by using the first temperature adjustment mechanism, the temperature of the structure body can be raised or lowered. The first temperature adjustment mechanism may heat the structure body, for example. Alternatively, the first temperature adjustment mechanism may cool the structure body, for example. Alternatively, the first temperature adjustment mechanism may keep the temperature of the structure body. By heating the structure body with the first temperature adjustment mechanism, the first member can be heated. Furthermore, by cooling the structure body with the first temperature adjustment mechanism, the first member can be cooled.

In one embodiment of the present invention, by using the second temperature adjustment mechanism, the temperature of the stage can be raised or lowered. The second temperature adjustment mechanism may heat the stage, for example. Alternatively, the second temperature adjustment mechanism may cool the stage. Alternatively, the second temperature adjustment mechanism may keep the temperature of the stage. By heating the stage with the second temperature adjustment mechanism, the second member can be heated. Furthermore, by cooling the stage with the second temperature adjustment mechanism, the second member can be cooled.

In the peeling apparatus of one embodiment of the present invention, the structure body and the stage can hold the process member. As compared with a holding mechanism such as a hand or a chuck, the structure body and the stage each can be in contact with the process member in a larger area; thus, the temperature of the process member can be easily adjusted by adjusting the temperatures of the structure body and the stage, which is preferable.

Examples of the structures and operations of peeling apparatuses and peeling methods using any of the peeling apparatuses will be described below.

Structural Example 1

FIGS. 18A to 18D, FIGS. 19A to 19C, and FIGS. 20A to 20C illustrate an example where a first member 203a is peeled from a process member 203 so that the first member 203a and a second member 203b are separated from each other.

Figure 18A:
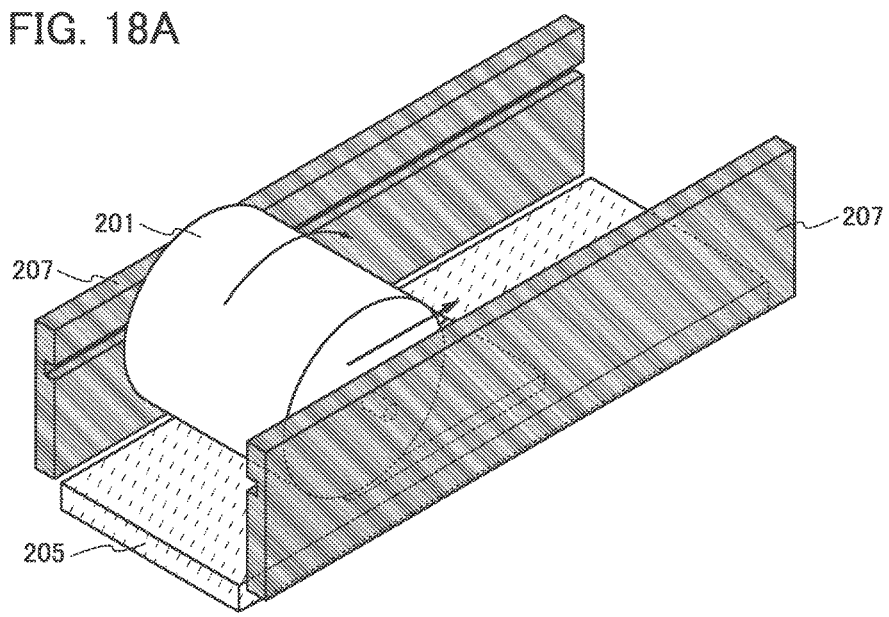
FIGS. 18A to 18D illustrate an example of a peeling apparatus.
Figure 18B:
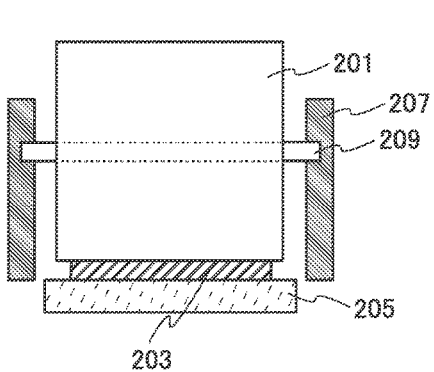
Figure 18C:
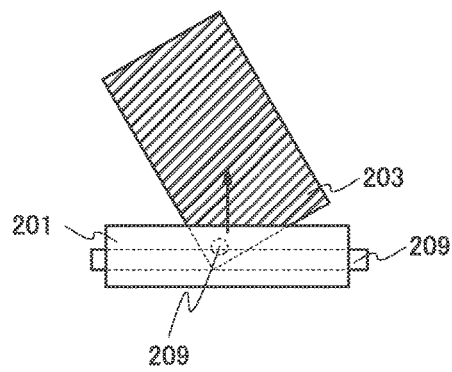
Figure 18D:
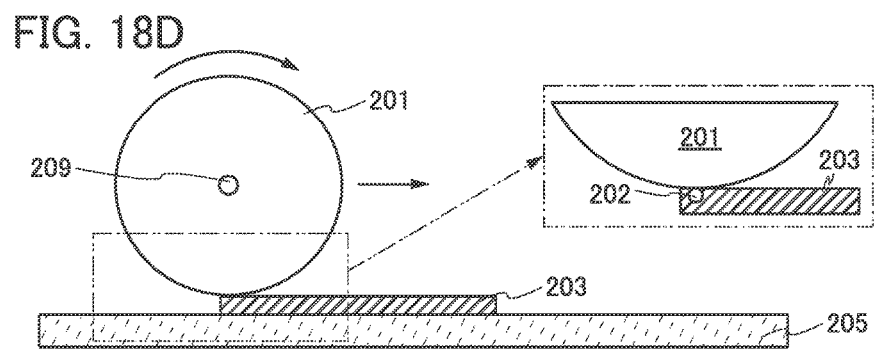

FIG. 18A, FIG. 18B, and FIG. 18D are a perspective view, a front view, and a side view, respectively, of a peeling apparatus just before peeling.

The peeling apparatus illustrated in FIGS. 18A to 18D includes a structure body 201 and a stage 205. The structure body 201 has a convex surface. The stage 205 has a supporting surface facing the convex surface.

In FIGS. 18A to 18D, the process member 203 is positioned between the convex surface and the supporting surface in the peeling apparatus. The temperature of the process member 203 can be adjusted depending on the temperature of the structure body 201 or the temperature of the stage 205.

FIG. 18C is a top view showing the case where the process member 203 is positioned differently from that illustrated in FIGS. 18A, 18B, and 18D. FIG. 18A illustrates the case where peeling is performed from a side portion of the process member 203, whereas FIG. 18C illustrates the case where peeling is performed from a corner portion of the process member 203. In the case where peeling is performed from the side portion of the process member 203, the peeling is preferably performed from a short side in a long side direction, in which case conditions such as the rotation speed of the structure body can be easily controlled and the yield of the peeling can be improved.

The process member 203 has a sheet-like shape and includes the first member 203a and the second member 203b each having a sheet-like shape. Each of the first member 203a and the second member 203b may have a single-layer structure or a stacked-layer structure. A peeling starting point is preferably formed in the process member 203, in which case peeling can be easily performed at the interface between the first member 203a and the second member 203b.

In the case where the peeling apparatus includes a transfer mechanism, the process member 203 may be positioned over the stage 205 by the transfer mechanism.

As illustrated in an enlarged view of a portion surrounded by dashed-two dotted line in FIG. 18D, the convex surface of the structure body 201 is positioned so as to overlap with a peeling starting point 202, which is formed to have a point-like shape or a linear shape (including a solid line shape, a dashed line shape, and a frame-like shape) in the process member 203. After that, when the structure body 201 rotates, the force of peeling the first member 203a is applied to the process member 203; thus, the first member 203a is peeled from the vicinity of the peeling starting point 202. As a result, the process member 203 is divided into the first member 203a and the second member 203b.

The structure body 201 can have any shape as long as it has a convex surface (also referred to as a convex curved surface) and can have, for example, a cylindrical shape (including a columnar shape, a right cylindrical shape, an elliptic cylindrical shape, and a parabolic cylindrical shape) or a sphere shape. The structure body 201 can be a roller such as a drum roller, for example. Examples of the shape of the structure body 201 include a column with a bottom surface whose boundary includes a curved line (a cylinder with a perfect circle-shaped bottom surface, an elliptic cylinder with an ellipse-shaped bottom surface, or the like), and a column with a bottom surface whose boundary includes a curved line and a straight line (e.g., a column with a semi cylindrical-shaped bottom surface or a semi elliptical cylindrical-shaped bottom surface). If the shape of the structure body 201 is any of such columns, the convex surface corresponds to a curved surface of the column.

As a material of the structure body, a metal, an alloy, an organic resin, rubber, or the like can be used. The structure body may have a space or a hollow inside. Examples of the rubber include natural rubber, urethane rubber, nitrile rubber, and neoprene rubber.

Figure 21A:
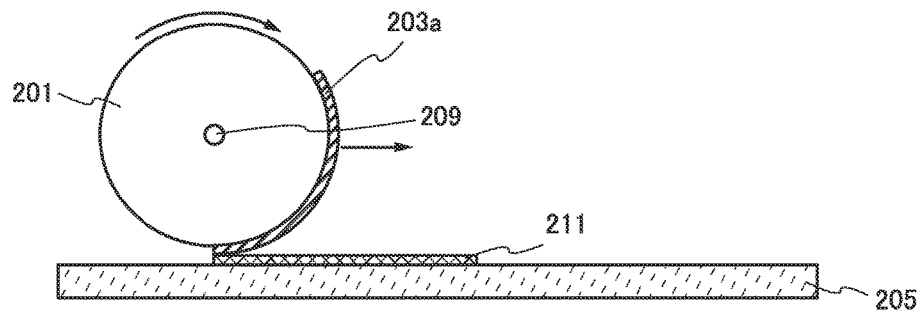
FIGS. 21A to 21D illustrate an example of a peeling apparatus.
Figure 21B:
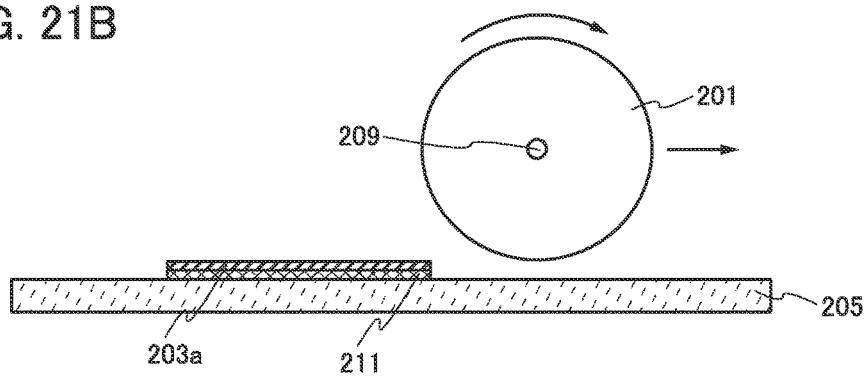
Figure 21C:
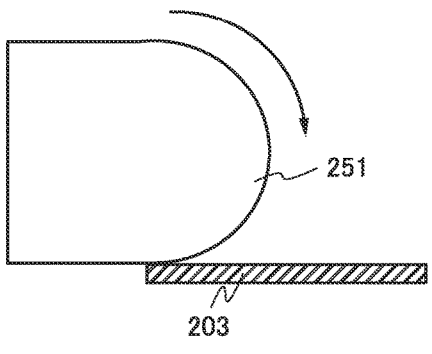
Figure 21D:
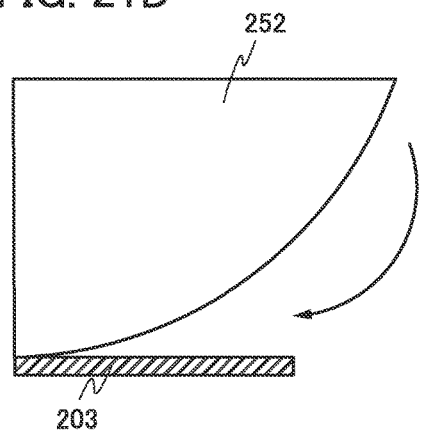

FIG. 21C and FIG. 21D illustrate a structure body 251 and a structure body 252, respectively. The structure bodies 251 and 252 are each an example of a column with a bottom surface whose boundary includes a curved line and a straight line.

The radius of curvature of the convex surface of the structure body is less than the radius of curvature of the supporting surface of the stage 205. The radius of curvature of the convex surface can be, for example, greater than or equal to 0.5 mm and less than or equal to 1000 mm. In the case where a film is peeled, for example, the radius of curvature of the convex surface can be greater than or equal to 0.5 mm and less than or equal to 500 mm, and specifically can be 150 mm, 225 mm, or 300 mm. As an example of the structure body having such a convex surface, a roller with a diameter of 300 mm, 450 mm, or 600 mm can be given. Note that a preferred radius of curvature of the convex surface depends on the thickness or the size of a process member. For this reason, in one embodiment of the present invention, the radius of curvature of the convex surface of the structure body is not limited to the above range as long as the radius of curvature of the convex surface is less than that of the supporting surface of the stage 205.

In the case where the process member 203 includes a stacked-layer structure with low adhesion, peeling might occur at an interface with low adhesion, which causes a reduction in the yield of peeling. In the case where the process member 203 includes an organic EL element, for example, peeling might occur at the interface between two layers in the EL layer or the interface between the EL layer and an electrode, in which case peeling does not occur at the interface between the first member 203a and the second member 203b. Thus, the radius of curvature of the convex surface or the rotation speed of the structure body 201 is set so that peeling can occur at the interface between the first member 203a and the second member 203b.

When the radius of curvature of the convex surface is too small, an element included in the first member 203a which is wound along the convex surface might be broken. For this reason, the radius of curvature of the convex surface is preferably greater than or equal to 0.5 mm.

Meanwhile, when the radius of curvature of the convex surface is large, a substrate of glass, sapphire, quartz, silicon, or the like, which has low flexibility and high stiffness, can be wound along the convex surface. For this reason, the radius of curvature of the convex surface is preferably greater than or equal to 300 mm, for example.

However, when the radius of curvature of the convex surface is too large, the size of the peeling apparatus might be increased, which might limit the installation location. For this reason, the radius of curvature of the convex surface is preferably less than or equal to 1000 mm, further preferably less than or equal to 500 mm, for example.

At least part of the convex surface may have stickness. For example, an adhesive tape may be put on part or the whole of the convex surface. In addition, at least part of the convex surface may have adhesion to the first member 203a. Furthermore, the structure body 201 may include a suction mechanism so that the convex surface can be attached to the first member 203a.

The structure body 201 or the stage 205 may be movable in at least one of the following directions: forward and backward: right and left; and up and down. The distance between the convex surface of the structure body 201 and the supporting surface of the stage 205 is preferably changeable because peeling of process members with a variety of thicknesses can be performed. In Structural Example 1, the structure body 201 is movable in the longitudinal direction of the stage 205.

Examples of holding mechanisms for holding a member or the like (e.g., the process member 203 or the second member 203b) placed over the stage 205 include chucks such as a suction chuck, an electrostatic chuck, and a mechanical chuck. For example, a porous chuck may be used. Alternatively, a member may be fixed to a suction table, a heater table, a spinner table, or the like.

As described above, the peeling apparatus may include the temperature adjustment mechanism. There is no particular limitation on the structure of the temperature adjustment mechanism as long as the temperature of the structure body 201 or the stage 205 can be raised or lowered. The temperature adjustment mechanism may be any of, for example, a heating mechanism, a cooling mechanism, or a mechanism that can perform both heating and cooling. The heating may be performed by heat conduction or heat radiation from a heater such as a resistance heater, or radiation of light (an electromagnetic wave) emitted from a lamp. As the heating mechanism, a heat source such as a heater table or a small tube heater formed using a heating wire may be used. As the cooling mechanism, a small tube to which a refrigerant is introduced, a coolant gas, a Peltier element, or the like may be used.

Note that the heating mechanism included in the peeling apparatus of one embodiment of the present invention is different from a light source such as a laser or a lamp for irradiating a layer to be separated and a separation layer with light to form a peeling starting point or to carry on the peeling. Furthermore, the heating step is different from a step of emitting light for forming a peeling starting point or proceeding of the peeling.

In addition, the peeling apparatus of one embodiment of the present invention may include a temperature sensor that has a function of sensing the temperature of the structure body or the stage. Furthermore, the peeling apparatus of one embodiment of the present invention may include a humidity sensor that has a function of sensing the humidity in the peeling apparatus.

In addition, the peeling apparatus of one embodiment of the present invention may include a temperature measuring device that can measure the temperature of the structure body or the stage. As an example of the temperature measuring device, a thermography device and an infrared radiometer are given.

Figure 19A:
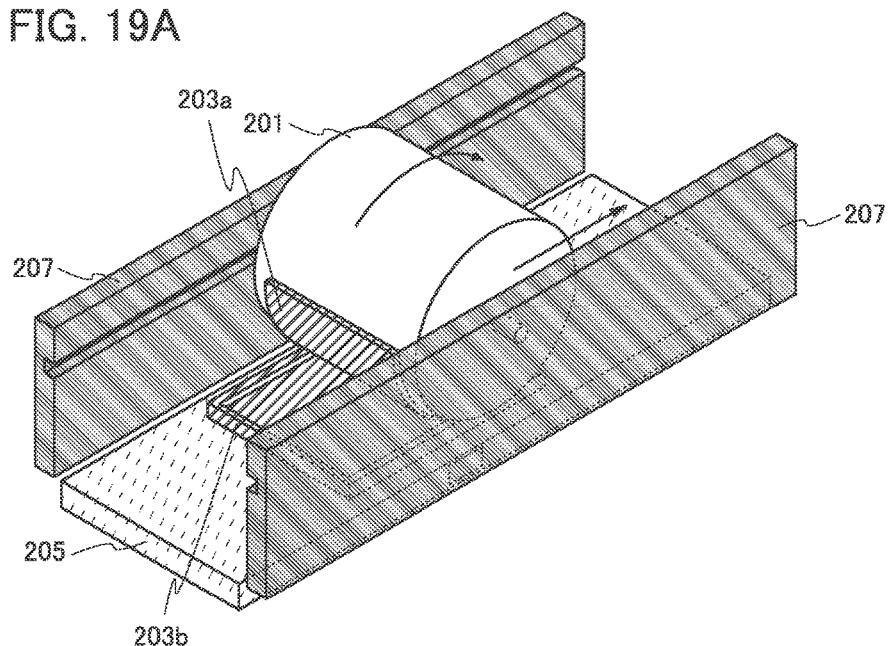
FIGS. 19A to 19C illustrate an example of a peeling apparatus.
Figure 19B:
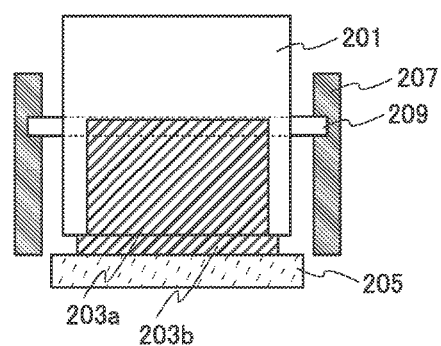
Figure 19C:
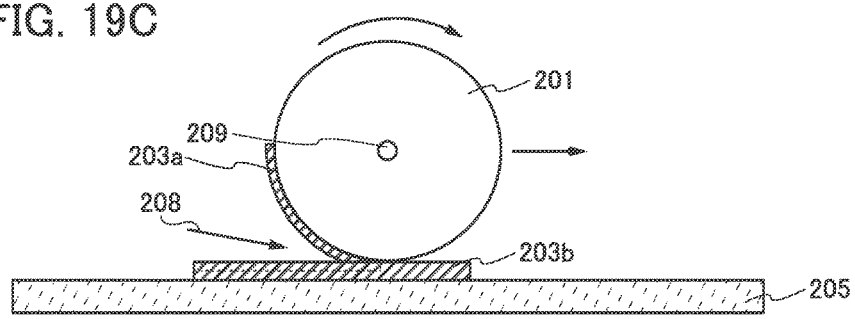
Figure 20A:
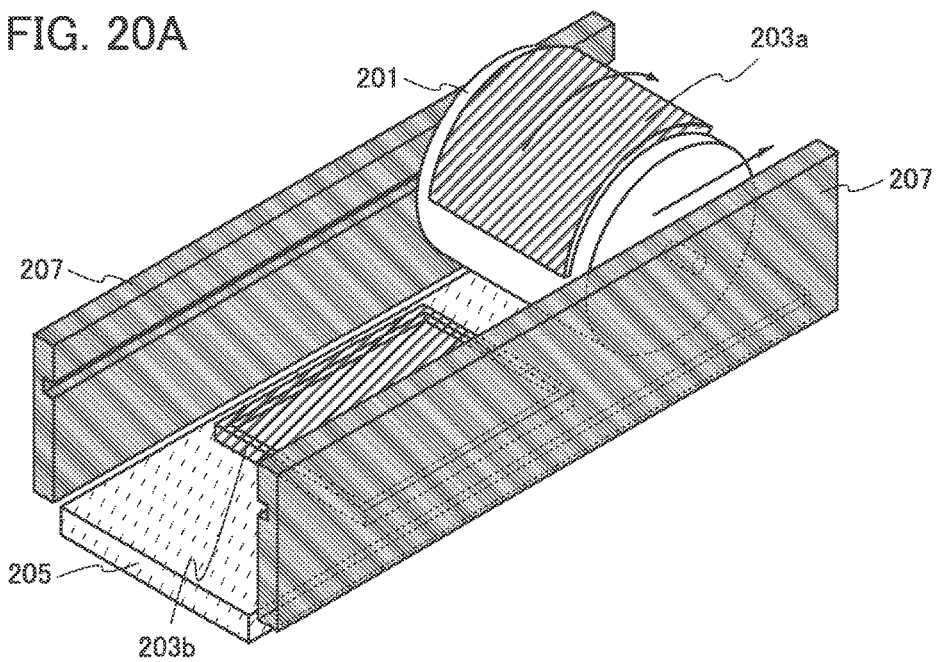
FIGS. 20A to 20C illustrate an example of a peeling apparatus.
Figure 20B:
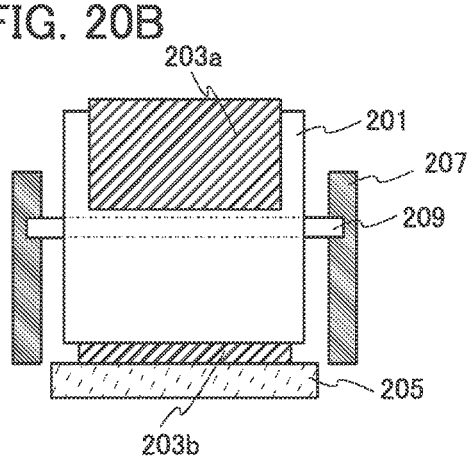
Figure 20C:
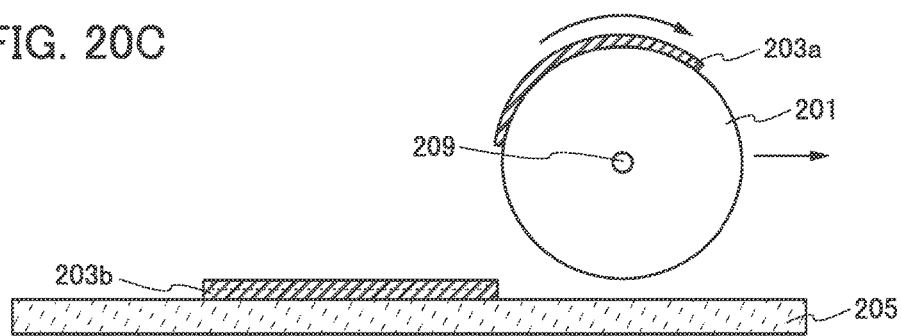

FIG. 19A, FIG. 19B, and FIG. 19C are a perspective view, a front view, and a side view, respectively, of the peeling apparatus during the peeling. FIG. 20A, FIG. 20B, and FIG. 20C are a perspective view, a front view, and a side view, respectively, of the peeling apparatus after the peeling.

The structure body 201 includes a rotation axis 209 at the center. FIG. 19A, FIG. 19C, and the like show the rotation direction of the structure body 201; however, the structure body 201 may rotate in the reverse direction. The rotation axis 209 moves along a groove of a guide 207, whereby the structure body 201 can move in the longitudinal direction of the stage 205 (the horizontal direction in FIG. 19C and FIG. 20C).

When the structure body 201 rotates, the first member 203a overlapping with the convex surface of the structure body 201 is peeled from the process member 203 from the vicinity of the peeling starting point and wound along the convex surface to be separated from the second member 203b. The first member 203a is held by the convex surface of the structure body 201 and the second member 203b is held over the stage 205.

In the peeling apparatus of one embodiment of the present invention, at least one of the stage 205 and the structure body 201 moves so that the position of the rotation center of the structure body 201 with respect to the stage 205 changes. In Structural Example 1, the rotation center of the structure body 201 moves. Specifically, with the stationary (or fixed) stage 205, the structure body 201 can move (roll) from one end portion side of the process member 203 to the opposite end portion while the first member 203a is wound by the structure body 201.

The linear velocity of the convex surface of the structure body 201 is greater than or equal to the speed of the rotation center of the structure body 201 passing the stage 205.

The first member 203a and the second member 203b may be separated from each other while tension is applied to the first member 203a or the second member 203b.

As indicated by an arrow 208 in FIG. 19C, a liquid feeding mechanism for feeding liquid to the separation surface between the first member 203a and the second member 203b may be provided.

In that case, an adverse effect of static electricity caused at the time of peeling (e.g., damage to a semiconductor element from static electricity) on an element or the like included in the first member 203a can be suppressed. Note that mist or vapor of liquid may be sprayed. As liquid, pure water, an organic solvent, a neutral solution, an alkaline solution, an acid solution, a solution into which salt is melted, or the like can be used.

In the case where the peeling apparatus includes a transfer mechanism, the second member 203b over the stage 205 and the first member 203a wound by the structure body 201 may be individually transferred by the transfer mechanism after the peeling.

Alternatively, as illustrated in FIGS. 21A and 21B, the structure body 201 may further rotate so that the first member 203a is bonded to a sheet-like member 211 positioned over the stage 205.

The member 211 may have a single-layer structure or a stacked-layer structure. At least part of a surface, which is in contact with the first member 203a, of the member 211 preferably has adhesion to the first member 203a. For example, an adhesive layer may be provided.

The whole first member 203a may be wound along the convex surface before the structure body 201 finishes rotating one turn. This is preferred because the first member 203a can be prevented from touching by the stage 205 and from pressure application by the structure body 201.

It is also preferable that the first member 203a wound along the convex surface be bonded to the member 211 without touching the stage 205.

For example, it is possible that the structure body 201 rotates ¼ turn so that the whole first member 203a is wound along the convex surface, the structure body 201 further rotates ¾ turn to move to the vicinity of an end portion of the member 211, and the structure body 201 further rotates ¼ turn so that the first member 203a is bonded on the member 211.

The distance between the structure body 201 and the stage 205 may be adjusted after the peeling so that the first member 203a wound by the structure body 201 does not touch the stage 205.

Structural Example 2

In Structural Example 2, an example in which a position of the rotation center of a structure body with respect to a stage is changed by moving the stage is shown. Specifically, shown is an example in which the position of the rotation center of the structure body is not moved but the stage is moved from one end portion of a process member toward the opposite end portion.

FIGS. 22A to 22C, FIGS. 23A to 23C, and FIGS. 24A to 24C illustrate an example where a first member 253a is peeled from a process member 253 so that the first member 253a and a second member 253b are separated from each other.

Figure 22A:
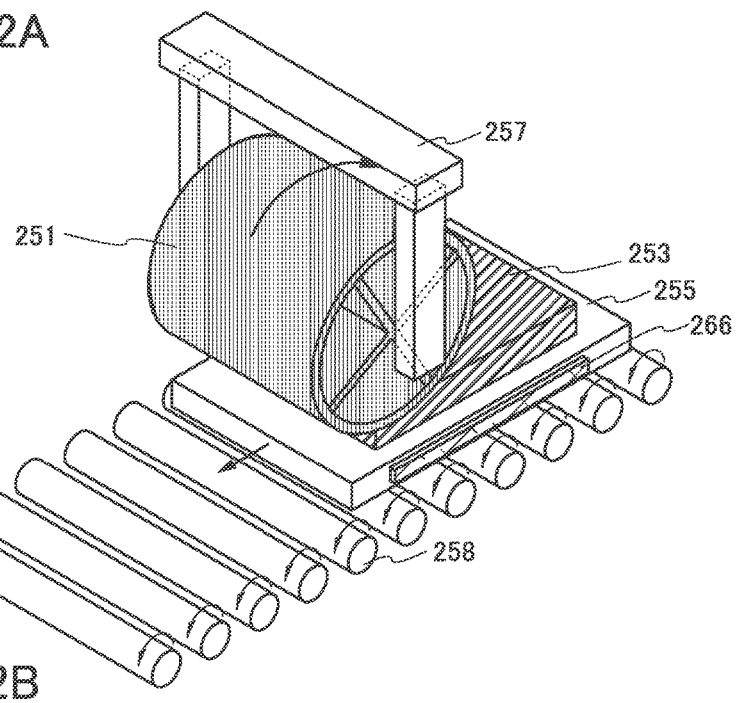
FIGS. 22A to 22C illustrate an example of a peeling apparatus.
Figure 22B:
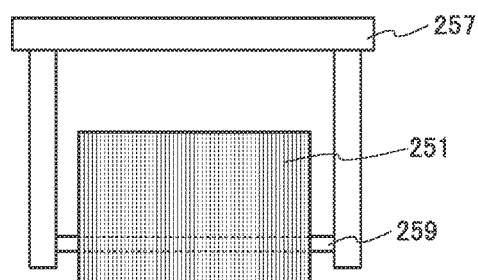
Figure 22C:
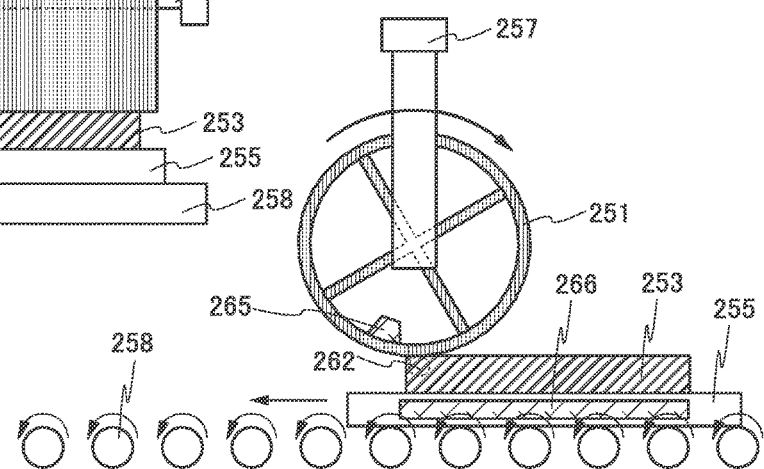

FIG. 22A, FIG. 22B, and FIG. 22C are a perspective view, a front view, and a side view, respectively, of a peeling apparatus just before peeling.

The peeling apparatus illustrated in FIGS. 22A to 22C includes a structure body 251, a stage 255, a support body 257, and transfer rollers 258. The structure body 251 has a convex surface. The stage 255 has a supporting surface facing the convex surface. The support body 257 supports the structure body 251.

In FIGS. 22A to 22C, the process member 253 is positioned between the convex surface and the supporting surface in the peeling apparatus.

Although FIG. 22A illustrates the case where peeling is performed from a side portion of the process member 253, peeling can be performed from a corner portion of the process member 253 as described in Structural Example 1.

The structure body 251, the process member 253, and the stage 255 can have structures similar to those of the structure body 201, the process member 203, and the stage 205 in Structural Example 1, respectively; thus, the descriptions are omitted. In the process member 253, a peeling starting point 262 is formed.

The support body 257 supports a rotation axis 259 of the structure body 251. The support body 257 has a function of adjusting the vertical position of the structure body 251. Thus, the distance between the convex surface of the structure body 251 and the supporting surface of the stage 255 can be changed.

The transfer rollers 258 can transfer the stage 255. There is no particular limitation on a transfer means of the stage 255, and a conveyor belt or a transfer robot can be used.

In the case where the peeling apparatus includes a transfer mechanism, the process member 253 may be positioned over the stage 255 by the transfer mechanism.

Figure 23A:
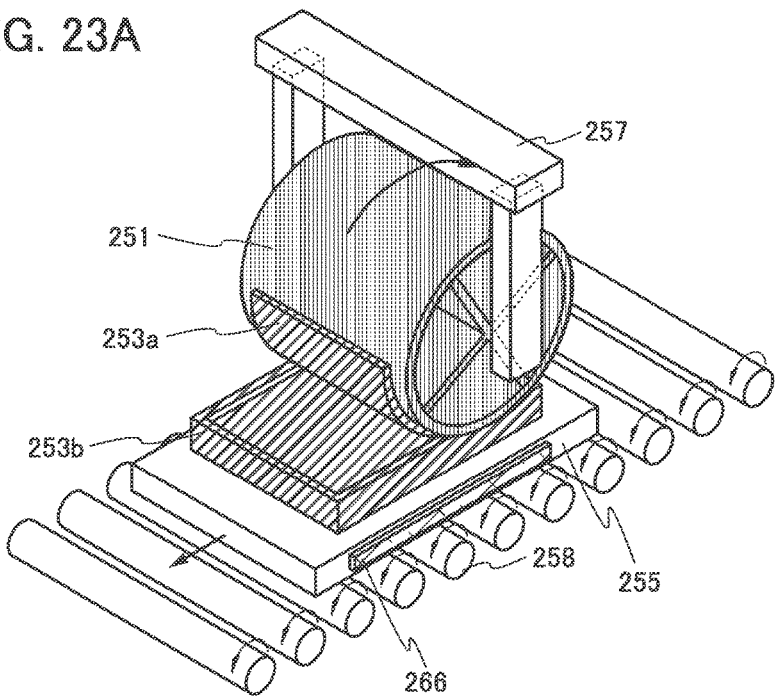
FIGS. 23A to 23C illustrate an example of a peeling apparatus.
Figure 23B:
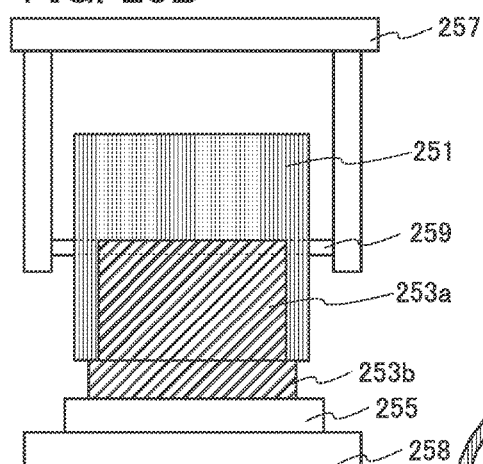
Figure 23C:
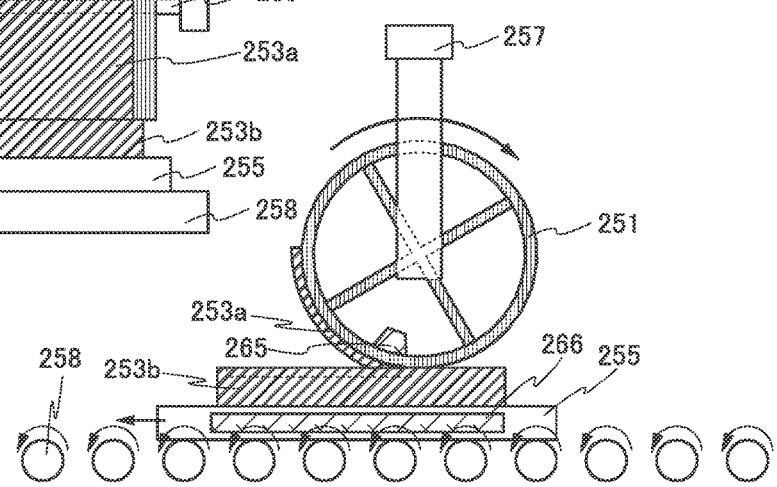

FIG. 23A, FIG. 23B, and FIG. 23C a perspective view, a front view, and a side view, respectively, of the peeling apparatus during the peeling. FIG. 24A, FIG. 24B, and FIG. 24C a perspective view, a front view, and a side view, respectively, of the peeling apparatus after the peeling.

The structure body 251 includes the rotation axis 259 at the center. FIG. 23A, FIG. 23C, and the like show the rotation directions of the structure body 251 and the transfer rollers 258; however, the structure body 251 and the transfer rollers 258 may each rotate in the reverse direction. The transfer rollers 258 rotate, whereby a positional relation between the rotation center of the structure body 251 and the stage 255 and the process member 253 over the stage 255 can change (specifically, the stage 255 and the process member 253 move in the horizontal direction in FIG. 23C or FIG. 24C).

The first member 253a held by the structure body 251 is peeled from the process member 253 and wound along the convex surface to be separated from the second member 253b. The second member 253b is held over the stage 255.

The convex surface of the structure body 251 is positioned so as to overlap with the peeling starting point 262 formed in the process member 253. After that, when the structure body 251 rotates, the force of peeling the first member 253a is applied to the process member 253; thus, the first member 253a is peeled from the vicinity of the peeling starting point 262. As a result, the first member 253a peeled from the process member 253 is wound along the convex surface and separated from the second member 253b. The first member 253a is held by the convex surface of the structure body 251 and the second member 253b is held over the stage 255.

In the case where the peeling apparatus includes a transfer mechanism, the second member 253b over the stage 255 and the first member 253a wound by the structure body 251 may be individually transferred by the transfer mechanism after the peeling.

As illustrated in FIGS. 22C, 23C, and 24C, a first temperature adjustment mechanism 265 connected to the structure body 251 may be provided. The first temperature adjustment mechanism 265 can adjust the temperature of the structure body 251. The first temperature adjustment mechanism 265 may be connected to an inner wall of the structure body 251 or the like. Furthermore, the stage 255 may be provided with a second temperature adjustment mechanism 266. The second temperature adjustment mechanism 266 can adjust the temperature of the stage 255.

Figure 25A:
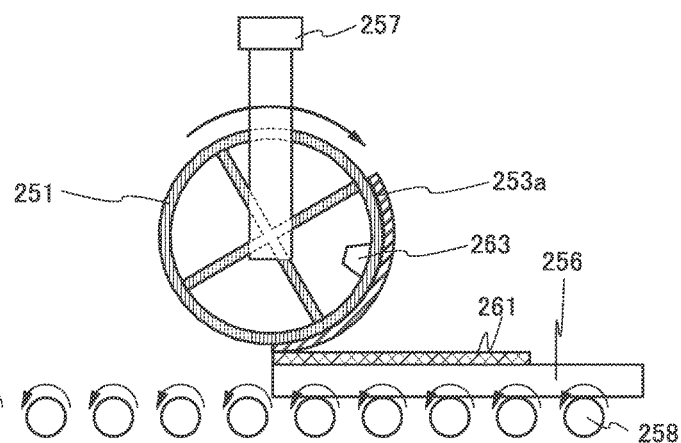
FIGS. 25A to 25E illustrate an example of a peeling apparatus.
Figure 25B:
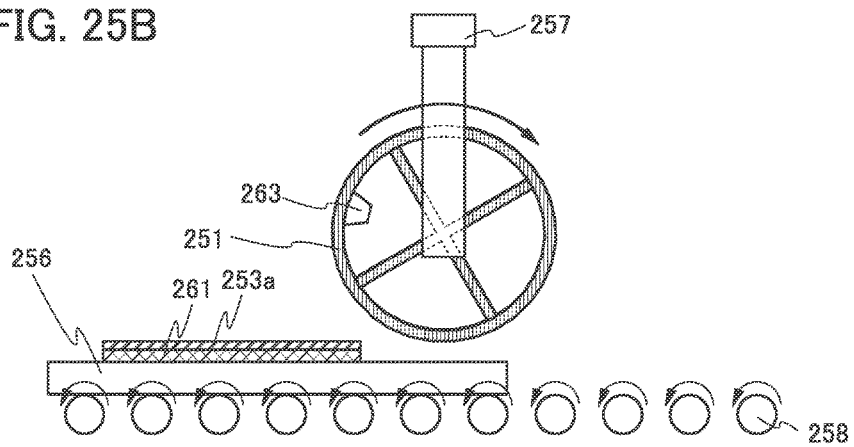
Figure 25C:
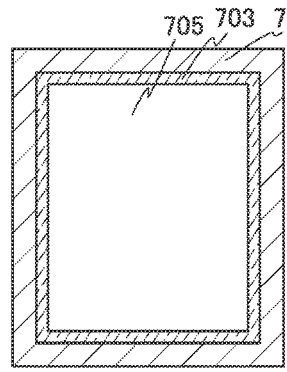
Figure 25D:
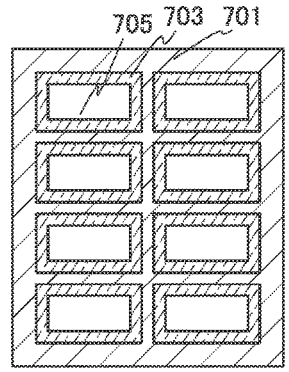
Figure 25E:
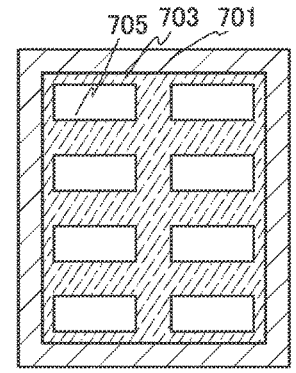

Alternatively, as illustrated in FIGS. 25A and 25B, the structure body 251 and the transfer rollers 258 may further rotate so that the first member 253a is bonded to a sheet-like member 261 positioned over a stage 256. Note that the member 261 may be positioned over the same stage (the stage 255) as the process member 253.

As illustrated in FIGS. 25A and 25B, a temperature sensor 263 connected to the structure body 251 may be included. The temperature sensor 263 can sense the temperature of the structure body 251. The temperature sensor 263 may be connected to an inner wall of the structure body 251 or the like, for example. Furthermore, the structure body 251 may be provided with a temperature sensor that can sense the temperature of the first member 253a.

Structural Example 3

Another structure of a separation apparatus of one embodiment of the present invention is described with reference to FIGS. 26A1, 26A2, 26B1, 26B2, 26C1, and 26C2. FIGS. 26A1, 26A2, 26B1, 26B2, 26C1, and 26C2 illustrate a structure and operation of the separation apparatus of one embodiment of the present invention.

FIG. 26A1, FIG. 26B1, and FIG. 26C1 are schematic views each illustrating a side surface of the separation apparatus of one embodiment of the present invention. FIG. 26A2, FIG. 26B2, and FIG. 26C2 are schematic views each illustrating a top surface of the separation apparatus.

FIG. 26A1 and FIG. 26A2 illustrate the separation apparatus of one embodiment of the present invention in a state where a step of peeling the first member 103a from the process member 103 starts.

FIG. 26B1 and FIG. 26B2 illustrate the separation apparatus of one embodiment of the present invention in a state where the first member 103a is being peeled from the process member 103.

FIG. 26C1 and FIG. 26C2 illustrate the separation apparatus of one embodiment of the present invention in a state where the peeling of the first member 103a from the process member 103 is finished.

The separation apparatus described in Structural Example 3 of one embodiment includes the cylindrical structure body 101 and a rotator 101a that is in contact with an inner wall of the cylindrical structure body 101 and can rotate in synchronization with the rotation of the structure body 101, which is a difference from the separation apparatus described with reference to FIGS. 18A to 18D, FIGS. 19A to 19C, FIGS. 20A to 20C, FIGS. 21A to 21D, FIGS. 22A to 22C, FIGS. 23A to 23C, FIGS. 24A to 24C, and FIGS. 25A to 25E. A different component will be described in detail below, and the above description is referred to for the other similar components.

The structure body 101 has a cylindrical shape. Note that the structure body 101 may be provided with a member 101b on its outer surface (see FIG. 26A1 and FIG. 26A2).

The member 101b can modify physical properties of the surface of the structure body 101. For example, the member 101b allows the surface of the structure body 101 to have viscosity. Alternatively, the member 101b allows the surface of the structure body 101 to have elasticity that can disperse stress concentrated on the convex and concave portions.

For example, rubber, silicone rubber, a resin, a natural material, or the like can be used for the member 101b.

In the case where the member 101b provided on the structure body 101 has a joint portion, the process member is provided between the stage 105 and the structure body 101 so as to prevent the process member 103 from being in contact with the joint portion.

The rotator 101a is in contact with the inner periphery of the cylindrical structure body 101, and the process member 103 is sandwiched between the outer periphery of the structure body 101 and the stage 105.

The rotator 101a is provided rotatably around the center axis. For example, the rotator 101a may be provided with a cylindrical roller. Alternatively, the rotator 101a may be provided with a gear on its outer periphery.

In the case where the rotator 101a provided with a gear on its outer periphery is used, a gear that meshes the gear provided with the rotator 101a is provided on the inner periphery of the structure body 101. In this structure, for example, the rotator 101a is driven to rotate with use of a driver unit, and the rotation can influence the structure body 101.

As a first step, the process member 103 in which the peeling starting point 102 is provided is inserted between the stage 105 and the structure body 101 (see FIG. 26A and FIG. 26A2). In the case where the process member 103 has a corner portion, the peeling starting point 102 is preferably provided at the corner portion, and the process member 103 may be inserted from the corner portion in a state of being inclined at a θ degree angle with respect to the direction perpendicular to the center axis of the rotator 101a. As a result, the separation surface is gradually expanded from the peeling starting point 102 and the first member 103a and the second member 103b can be separated from each other.

As a second step, the further peeling of the first member 103a from the second member 103b makes progress (see FIG. 26B1 and FIG. 26B2).

With use of the liquid supply unit indicated by the arrow 108, a liquid is supplied to a surface where the first member 103a and the second member 103b are separated (separation surface) (see FIG. 26B1). For example, the liquid is injected into the separation surface. Alternatively, the liquid may be sprayed.

For example, as the liquid injected or sprayed, water, a polar solvent, or the like can be used. By injecting the liquid, an influence of static electricity and the like caused by the peeling can be reduced. Alternatively, the peeling may proceed while the peeling layer is dissolved with a liquid.

Note that a temperature sensor 264 may be connected to the stage 105. The temperature sensor 264 can sense the temperature of the stage 105. Furthermore, the stage 105 may be provided with a temperature sensor that can sense the temperature of the process member 103.

As a third step, the first member 103a and the second member 103b are separated (see FIG. 26C1 and FIG. 26C2).

Structural Example 4

Another structure of a separation apparatus of one embodiment of the present invention is described with reference to FIGS. 27A1, 27A2, 27B1, 27B2, 27C1, and 27C2. FIGS. 27A1, 27A2, 27B1, 27B2, 27C1, and 27C2 illustrate a structure and operation of the separation apparatus of one embodiment of the present invention.

FIG. 27A1, FIG. 27B1, and FIG. 27C1 are schematic views each illustrating a side surface of the separation apparatus of one embodiment of the present invention. FIG. 27A2, FIG. 27B2, and FIG. 27C2 are schematic views each illustrating a top surface thereof.

FIG. 27A1 and FIG. 27A2 illustrate the separation apparatus of one embodiment of the present invention in a state where the peeling of the first member 103a from the process member 103 starts.

FIG. 27B1 and FIG. 27B2 illustrate the separation apparatus of one embodiment of the present invention in a state where the first member 103a is being peeled from the process member 103.

FIG. 27C1 and FIG. 27C2 illustrate the separation apparatus of one embodiment of the present invention in a state where the peeling of the first member 103a from the process member 103 is finished.

The separation apparatus described in Structural Example 4 in this embodiment includes the cylindrical structure body 101, instead of the cylindrical structure body 251, and the rotator 101a that is in contact with an inner wall of the cylindrical structure body 101 and can rotate in synchronization with the rotation of the structure body 101, which is a difference from the separation apparatus described with reference to FIGS. 22A to 22C, FIGS. 23A to 23C, and FIGS. 24A to 24C.

In addition, in the separation apparatus described in Structural Example 4, the structure body 101 is fixed, and the stage 155 is moved, which is a difference from the case of the separation apparatus described with reference to FIGS. 26A1, 26A2, 26B1, 26B2, 26C1, 26C2.

The peeling apparatus is different from the peeling apparatuses in Structural Examples 1 to 3 in that a static electricity eliminating mechanism 110 and a drying mechanism 111 are included.

The static electricity eliminating mechanism 110 has a function of eliminating static electricity from the first member 103a.

In process, at a position where static electricity might be generated, the static electricity eliminating mechanism included in the peeling apparatus is preferably used. There is no particular limitation on the static electricity eliminating mechanism, and for example, a corona discharge ionizer, a soft X-ray ionizer, an ultraviolet ionizer, or the like can be used.

For example, it is preferable that the peeling apparatus be provided with an ionizer and a static electricity eliminating treatment be performed by spraying the first member 103a with air, a nitrogen gas, or the like from the ionizer to reduce an influence of static electricity on a functional element or a thin film integrated circuit.

Specifically, it is preferable that the first member 103a and the second member 103b of the process member 203 be separated from each other while the vicinity of the interface between the first member 103a and the second member 103b is irradiated with ions using the ionizer to remove static electricity.

The drying mechanism 111 has a function of drying the first member 103a.

Since a watermark might be formed if the liquid adhered to the first member 103a is vaporized, the liquid is preferably removed immediately after the peeling. Thus, immediately after the peeling from the second member 103b, the first member 103*a* including a functional element is preferably blow dried to remove a droplet left on the first member 103*a*. Therefore, watermark generation can be suppressed.

The first member 103*a* may be blow dried when the first member 103*a* is parallel to the horizontal surface; however, when the first member 103*a* is oblique or perpendicular to the horizontal surface by winding around the structure body 101, it is preferable that the stream flow down so that a droplet falls down, as illustrated in FIG. 27C1.

This embodiment can be combined with any of the other embodiments in this specification as appropriate.

Embodiment 5

In this embodiment, electronic appliances and lighting devices that can be manufactured using the peeling apparatus of one embodiment of the present invention or the peeling method of one embodiment of the present invention are described with reference to FIGS. 28A to 28G and FIGS. 29A to 29I.

A light-emitting device, a display device, a semiconductor device, or the like that can be used for an electronic appliance or a lighting device can be manufactured with a high yield by employing one embodiment of the present invention. Moreover, a flexible electronic appliance or lighting device having high productivity can be manufactured by employing one embodiment of the present invention.

Examples of an electronic appliance include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, and a large game machine such as a pinball machine.

The device manufactured by employing one embodiment of the present invention has flexibility and therefore can be incorporated along a curved inside/outside wall surface of a house or a building or a curved interior/exterior surface of a car.

Figure 28A:
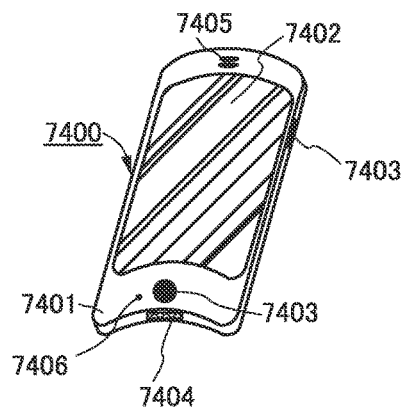
FIGS. 28A to 28G illustrate examples of electronic devices and lighting devices.

FIG. 28A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the cellular phone 7400 is manufactured using the display device manufactured by employing one embodiment of the present invention for the display portion 7402. One embodiment of the present invention enables a highly reliable mobile phone having a curved display portion to be provided with a high yield.

When the display portion 7402 of the mobile phone 7400 illustrated in FIG. 28A is touched with a finger or the like, data can be input into the mobile phone 7400. In addition, operations such as making a call and inputting a letter can be performed by touch on the display portion 7402 with a finger or the like.

With the operation buttons 7403, the power can be turned on or off. In addition, types of images displayed on the display portion 7402 can be switched; switching images from a mail creation screen to a main menu screen.

Figure 28B:
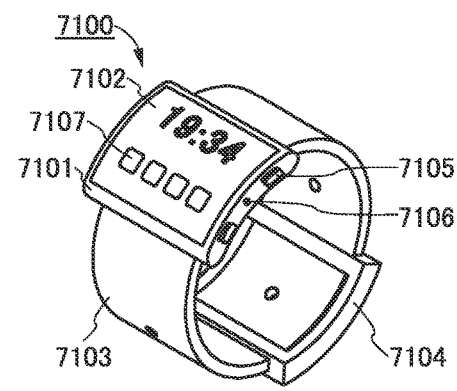

FIG. 28B illustrates an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as ON/OFF of the power, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes a light-emitting device manufactured by using one embodiment of the present invention. One embodiment of the present invention enables a highly reliable portable information terminal having a curved display portion to be provided with a high yield.

Figure 28C:
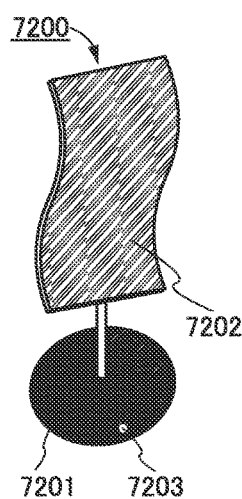
Figure 28D:
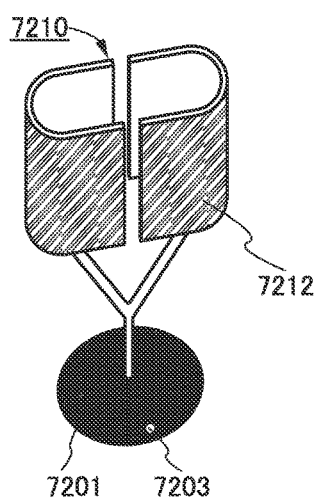
Figure 28E:
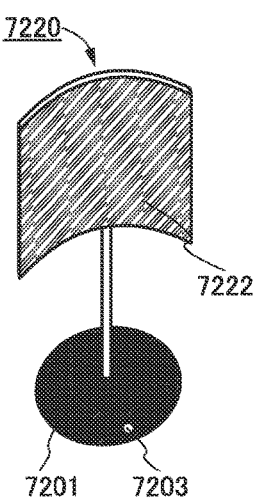

FIGS. 28C to 28E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 28C includes a light-emitting portion 7202 having a wave-shaped light-emitting surface, and thus has good design.

A light-emitting portion 7212 included in the lighting device 7210 illustrated in FIG. 28D has two convex-curved light-emitting portions symmetrically placed. Thus, light radiates from the lighting device 7210 in all directions.

The lighting device 7220 illustrated in FIG. 28E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a frame that can be changed in shape, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device manufactured by employing one embodiment of the present invention. One embodiment of the present invention enables a highly reliable lighting device having a curved light-emitting portion to be provided with a high yield.

Figure 28F:
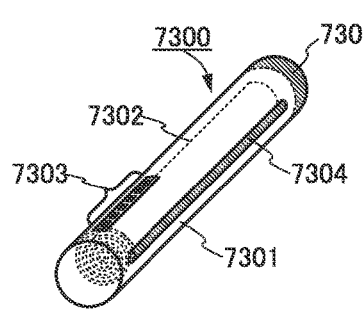

FIG. 28F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, ON/OFF of the power, switching of displayed videos, and the like can be performed.

Figure 28G:
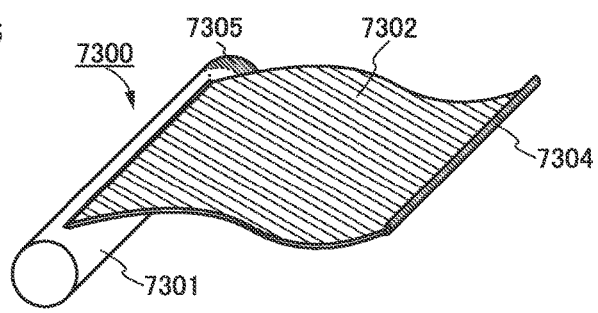

FIG. 28G illustrates a display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 28F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a display device manufactured by employing one embodiment of the present invention. One embodiment of the present invention enables a lightweight and highly reliable display device to be provided with a high yield.

Figure 29A:
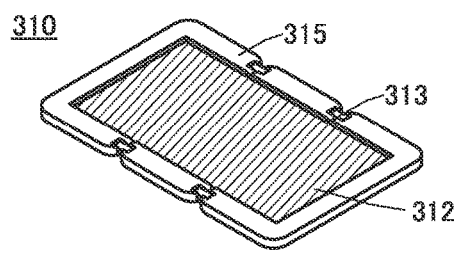
FIGS. 29A to 29I illustrate examples of electronic devices.
Figure 29B:
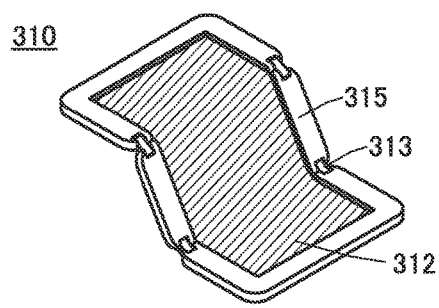
Figure 29C:
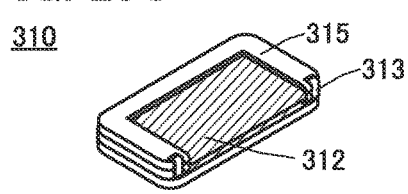

FIGS. 29A to 29C illustrate a foldable portable information terminal 310. FIG. 29A illustrates the portable information terminal 310 that is opened. FIG. 29B illustrates the portable information terminal 310 that is being opened or being folded. FIG. 29C illustrates the portable information terminal 310 that is folded. The portable information terminal 310 is highly portable when folded. When the portable information terminal 310 is opened, a seamless large display region is highly browsable.

A display panel 312 is supported by three housings 315 joined together by hinges 313. By folding the portable information terminal 310 at a connection portion between two housings 315 with the hinges 313, the portable information terminal 310 can be reversibly changed in shape from an opened state to a folded state. A display device manufactured by any of the peeling methods of embodiments of the present invention can be used for the display panel 312. For example, a display device that can be bent with a radius of curvature of greater than or equal to 1 mm and less than or equal to 150 mm can be used.

Figure 29D:
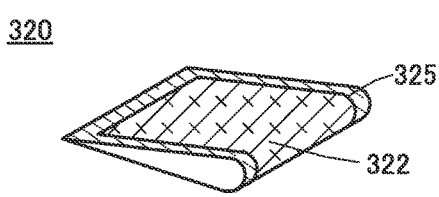
Figure 29E:
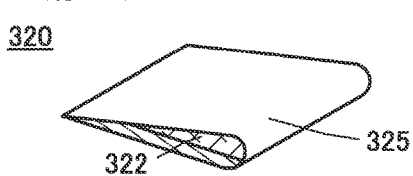

FIGS. 29D and 29E illustrate a foldable portable information terminal 320. FIG. 29D is the portable information terminal 320 that is folded so that the display portion 322 is on the outside. FIG. 29E is the portable information terminal 320 that is folded so that the display portion 322 is on the inside. Because a non-display portion 325 is on the outside when the portable information terminal 320 is not used, the display portion 322 can be prevented from dirt and scratches. The display device according to one embodiment of the present invention can be used for the display portion 322.

Figure 29F:
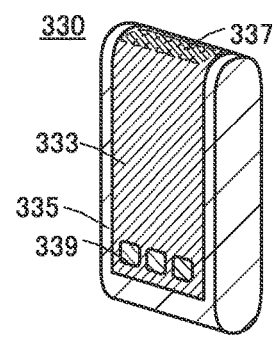
Figure 29G:
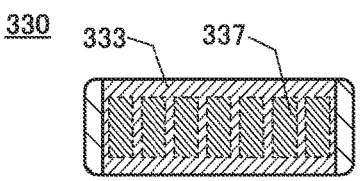
Figure 29H:
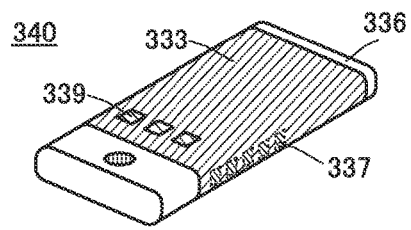

FIG. 29F is a perspective view illustrating an external shape of the portable information terminal 330. FIG. 29G is a top view of the portable information terminal 330. FIG. 29H is a perspective view illustrating an external shape of a portable information terminal 340.

The portable information terminals 330 and 340 each function as, for example, one or more of a telephone set, a notebook, and an information browsing system. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 29F and 29H). In addition, information 337 indicated by dashed rectangles can be displayed on another surface (FIGS. 29F and 29H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 29F and 29G illustrate an example in which the information 337 is displayed at the top, one embodiment of the present invention is not limited thereto. The information may be displayed, for example, on the side as illustrated in FIG. 29H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A display device manufactured by any of the embodiments of the present invention can be used for a display portion 333 mounted in each of a housing 335 of the portable information terminal 330 and a housing 336 of the portable information terminal 340. One embodiment of the present invention makes it possible to provide a highly reliable display device having a curved display portion with a high yield.

Figure 29I:
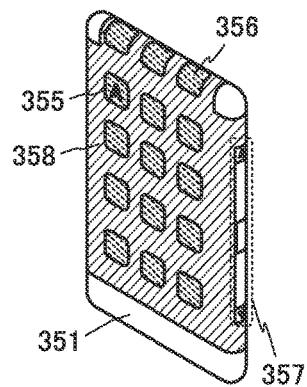

Information may be displayed, for example, on three or more sides in a portable information terminal 345 illustrated in FIG. 29I. Here, information 355, information 356, and information 357 are displayed on different sides.

A display device manufactured by one embodiment of the present invention can be used for a display portion 358 mounted in a housing 351 of the portable information terminal 345. According to one embodiment of the present invention, a highly reliable portable display device having a curved display portion can be provided at a high yield.

This embodiment can be combined with any of the other embodiments in this specification as appropriate.

REFERENCE NUMERALS

P1: arrow, P2: arrow, 101: structure body, 101*a*: rotator, 101*b*: member, 102: peeling starting point, 103: process member, 103a: first member, 103b: second member, 105: stage, 108: arrow. 110: static electricity eliminating mechanism, 111: drying mechanism, 155: stage, 171: support substrate, 172: separation layer. 173: tape. 174: layer including layer to be separated, 175: support roller, 176: guide roller, 201: structure body, 202: peeling starting point, 203: process member. 203a: first member, 203b: second member, 205: stage, 207: guide, 208: arrow, 209: rotation axis, 211: member, 251: structure body, 252: structure body, 253: process member, 253a: first member, 253b: second member. 255: stage, 256: stage, 257: support, 258: transfer roller. 259: rotation axis. 261: member, 262: peeling starting point. 263: temperature sensor, 264: temperature sensor. 310: portable information terminal, 312: display panel, 313: hinge, 315: housing, 320: portable information terminal, 322: display portion, 325: non-display portion, 330: portable information terminal, 333: display portion, 335: housing, 336: housing, 337: information. 339: operation button, 340: portable information terminal, 345: portable information terminal, 351: housing, 355: information, 356: information, 357: information, 358: display portion, 701: formation substrate, 703: separation layer, 705: layer to be separated, 707: bonding layer, 711: frame-like bonding layer, 721: formation substrate, 723: separation layer, 725: layer to be separated, 731: substrate, 733: bonding layer, 741: first peeling starting point, 743: second peeling starting point, 1301: element layer, 1303: substrate, 1304: light extraction portion, 1305: bonding layer, 1306: driver circuit portion, 1308: FPC, 1357: conductive layer. 1401: substrate. 1402: substrate, 1403: bonding layer, 1405: insulating layer, 1407: insulating layer, 1408: conductive layer, 1409: insulating layer, 1409a: insulating layer, 1409b: insulating layer, 1411: insulating layer, 1412: conductive layer, 1413: sealing layer. 1415: connector, 1430: light-emitting element. 1431: lower electrode, 1433: EL layer, 1433a: EL layer, 1433b: EL layer, 1435: upper electrode, 1440: transistor, 1455: insulating layer, 1457: light-blocking layer, 1459: coloring layer, 1461: insulating layer, 1510a: conductive layer, 1510b: conductive layer, 7100: portable information terminal, 7101: housing, 7102: display portion, 7103: band, 7104: buckle, 7105: operation button, 7106: input/output terminal, 7107: icon, 7200: lighting device, 7201: stage, 7202: light-emitting portion, 7203: operation switch, 7210: lighting device, 7212: light-emitting portion. 7220: lighting device, 7222: light-emitting portion. 7300: display device, 7301: housing, 7302: display portion, 7303: operation button, 7304: member, 7305: control portion, 7400: mobile phone, 7401: housing, 7402: display portion, 7403: operation button, 7404: external connection port, 7405: speaker, 9999: touch panel.

This application is based on Japanese Patent Application serial no. 2013-257521 filed with Japan Patent Office on Dec. 12, 2013, the entire contents of which are hereby incorporated by reference.

The invention claimed is:

1. A peeling method comprising the steps of:
a first step of forming a separation layer over a substrate;
a second step of forming a layer to be separated over the separation layer;
a third step of forming a peeling starting point by separating a part of the layer to be separated from the separation layer;
a fourth step of peeling the layer to be separated from the substrate using the peeling starting point; and
a liquid supplying step of supplying liquid to the peeling starting point,
wherein the fourth step includes a step of heating a first portion of the substrate and a step of cooling a second portion of the layer to be separated,
wherein the first portion includes a portion that is not separated from the layer to be separated after the fourth step, and
wherein the second portion includes a portion separated from the substrate after the fourth step.

2. The peeling method according to claim 1, wherein the liquid includes water.

3. The peeling method according to claim 1, further comprising the step of a static electricity eliminating step of eliminating static electricity from a surface of the layer to be separated, the surface being exposed by separating from the substrate,
wherein the static electricity eliminating step is performed during at least one of a third period and a fourth period,
wherein the third period is in the fourth step, and
wherein the fourth period is after the fourth step.

4. The peeling method according to claim 1, further comprising the step of a drying step of drying a surface of the layer to be separated, the surface being exposed by separating from the substrate,
wherein the drying step is performed after the fourth step.

5. The peeling method according to claim 1, wherein the separation layer contains tungsten.

6. The peeling method according to claim 1, further comprising the step of an oxidation step of oxidizing the separation layer,
wherein the oxidation step is performed between the first step and the second step.

7. The peeling method according to claim 6, wherein the oxidation step includes a plasma treatment step performed under an atmosphere containing nitrous oxide ($N_2O$).

8. A peeling method comprising the steps of:
a first step of forming a separation layer over a substrate;
a second step of forming a layer to be separated over the separation layer;
a third step of forming a peeling starting point by separating a part of the layer to be separated from the separation layer; and
a fourth step of peeling the layer to be separated from the substrate using the peeling starting point,
wherein in the fourth step, the layer to be separated is peeled from the substrate while at least a part of the layer to be separated is cooled and a part of the substrate is heated.

9. The peeling method according to claim 8, further comprising the step of a liquid supplying step of supplying liquid between the layer to be separated and the separation layer,
wherein the liquid supplying step is performed during at least one of a first period and a second period,
wherein the first period is between the third step and the fourth step, and
wherein the second period is in the fourth step.

10. The peeling method according to claim 9, wherein a temperature of the liquid is higher than 0° C. and lower than 100° C.

11. The peeling method according to claim 9, wherein the liquid includes water.

12. The peeling method according to claim 1, wherein a temperature of the liquid is higher than or equal to 60° C. and lower than or equal to 90° C.

* * * * *